United States Patent
Fujiwara et al.

(10) Patent No.: US 8,094,391 B2
(45) Date of Patent: Jan. 10, 2012

(54) DRIVING DEVICE, IMAGING DEVICE INCLUDING THE SAME, AND IMAGING APPARATUS

(75) Inventors: Tsuneo Fujiwara, Osaka (JP); Kyoji Kasuga, Osaka (JP); Tomohiro Egawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/449,381

(22) PCT Filed: Feb. 6, 2008

(86) PCT No.: PCT/JP2008/051974
§ 371 (c)(1),
(2), (4) Date: Feb. 4, 2010

(87) PCT Pub. No.: WO2008/096797
PCT Pub. Date: Aug. 14, 2008

(65) Prior Publication Data
US 2010/0149665 A1    Jun. 17, 2010

(30) Foreign Application Priority Data

Feb. 6, 2007  (JP) ................................ 2007-027356
Aug. 10, 2007 (JP) ................................ 2007-210345
Nov. 26, 2007 (JP) ................................ 2007-305123
Feb. 5, 2008  (JP) ................................ 2008-025690

(51) Int. Cl.
*G02B 7/02* (2006.01)
(52) U.S. Cl. ..................................... 359/824
(58) Field of Classification Search .......... 359/811–824, 359/694–701; 369/44.11, 44.14, 79, 89, 369/139; 310/311, 320
See application file for complete search history.

(56) References Cited

U.S. PATENT DOCUMENTS 5,225,941 A  7/1993  Saito et al.
5,589,723 A  12/1996 Yoshida et al.
(Continued)

FOREIGN PATENT DOCUMENTS

JP        63-294281 A    11/1988
(Continued)

OTHER PUBLICATIONS

English version of International Search Report for PCT/JP2008/051974.

*Primary Examiner* — Scott J Sugarman
*Assistant Examiner* — Vipin Patel
(74) *Attorney, Agent, or Firm* — Edwards Wildman Palmer LLP; David G. Conlin; David A. Tucker

(57) ABSTRACT

A driving device includes: a bending displacement member (1A), partially fixed, which is excited by electrical control to be bent and displaced; a bending displacement member (1B), partially fixed, which is excited by electrical control to be bent and displaced; an elastic member (2) joined to the bending displacement members (1A, 1B); a friction member (3), joined to the elastic member (2), which is capable of partially making contact with a body tube (4); and a camera module housing (6) capable of housing the bending displacement members (1A, 1B), the elastic member (2), and the body tube (4). The bending displacement members (1A, 1B) may be disposed along an inner wall of the camera module housing (6). The driving device may also include control means for exciting the bending displacement members (1A, 1B).

27 Claims, 30 Drawing Sheets

U.S. PATENT DOCUMENTS

| | | | |
|---|---|---|---|
| 5,760,528 A | 6/1998 | Tomikawa | |
| 6,072,266 A | 6/2000 | Tomikawa | |
| 6,111,336 A | 8/2000 | Yoshida et al. | |
| 6,266,296 B1 | 7/2001 | Miyazawa | |
| 6,469,417 B2 | 10/2002 | Shibatani | |
| 6,804,068 B2 * | 10/2004 | Sasaki et al. | 359/811 |
| 6,847,155 B2 * | 1/2005 | Schwartz et al. | 310/328 |
| 7,595,580 B2 * | 9/2009 | Heim | 310/324 |
| 2001/0022486 A1 | 9/2001 | Shibatani | |
| 2003/0052573 A1 | 3/2003 | Wischnewskiy | |
| 2003/0168942 A1 | 9/2003 | Iino et al. | |
| 2006/0238075 A1 | 10/2006 | Manabe et al. | |

FOREIGN PATENT DOCUMENTS

| | | |
|---|---|---|
| JP | 07-274556 | 10/1995 |
| JP | 07-298656 | 11/1995 |
| JP | 08-182351 A | 7/1996 |
| JP | 08-280185 A | 10/1996 |
| JP | 10-056788 | 2/1998 |
| JP | 2001-258278 A | 9/2001 |
| JP | 2002-354853 | 6/2002 |
| JP | 2007-252103 | 9/2007 |
| JP | 2007-274790 | 10/2007 |

* cited by examiner

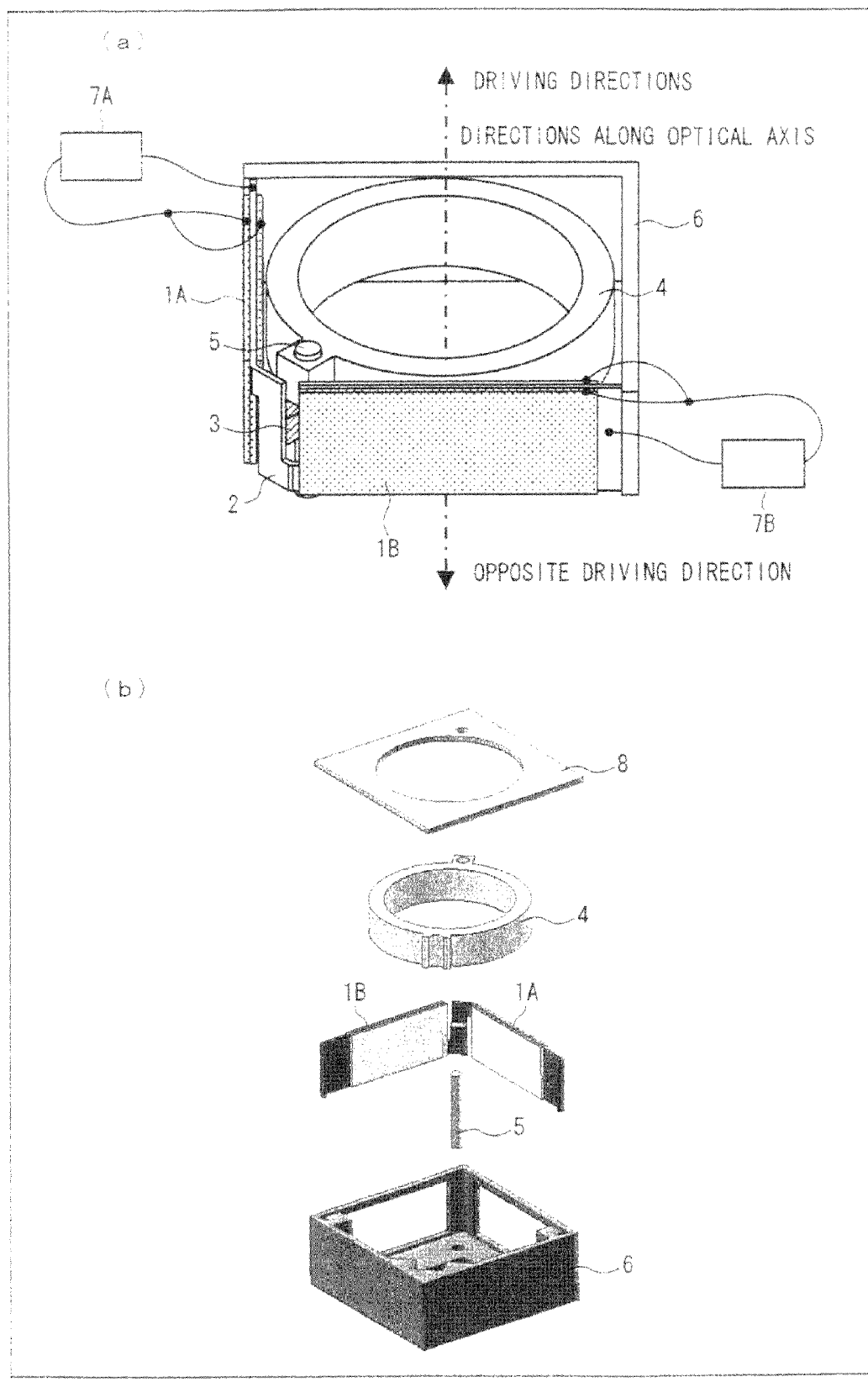

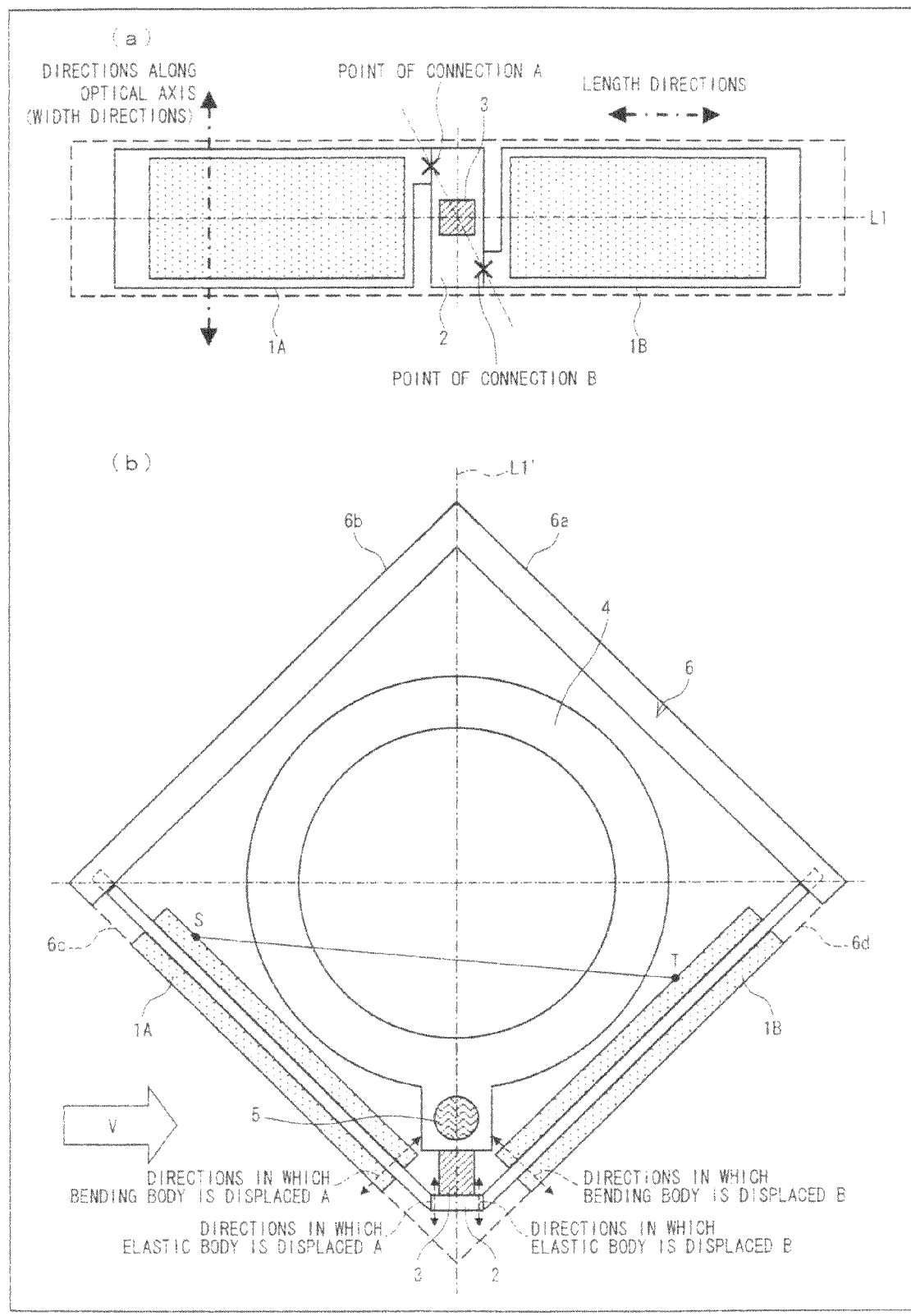

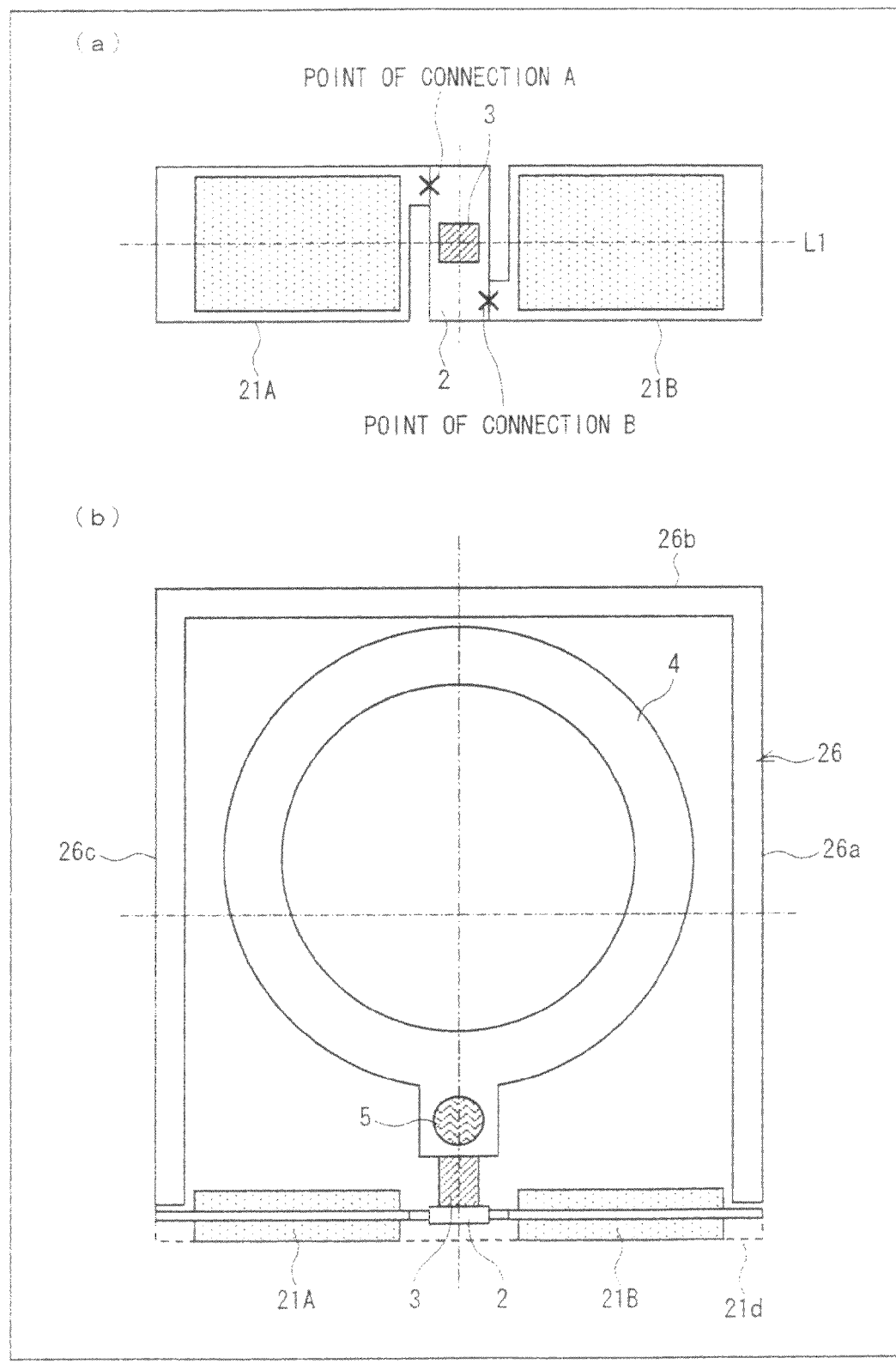

FIG. 7
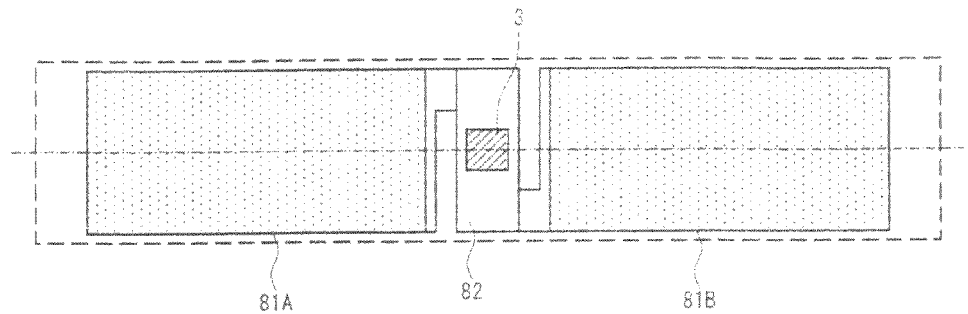
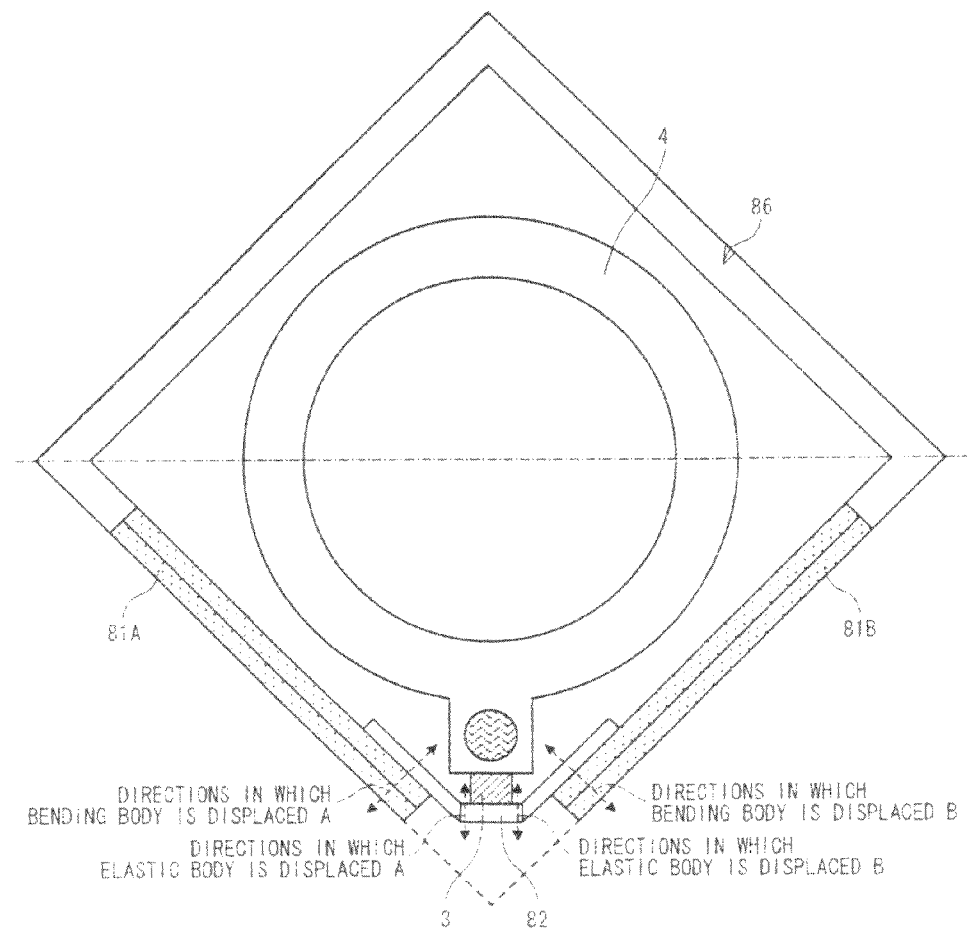

F I G. 9
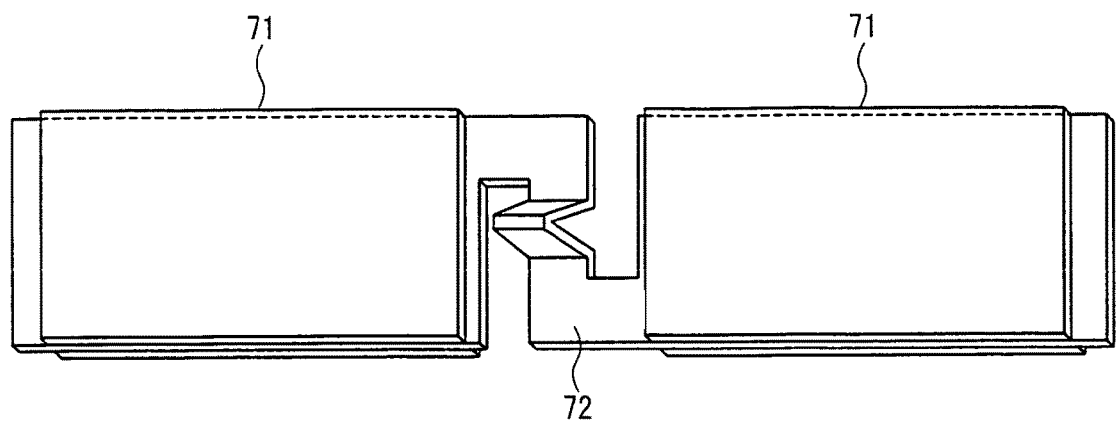

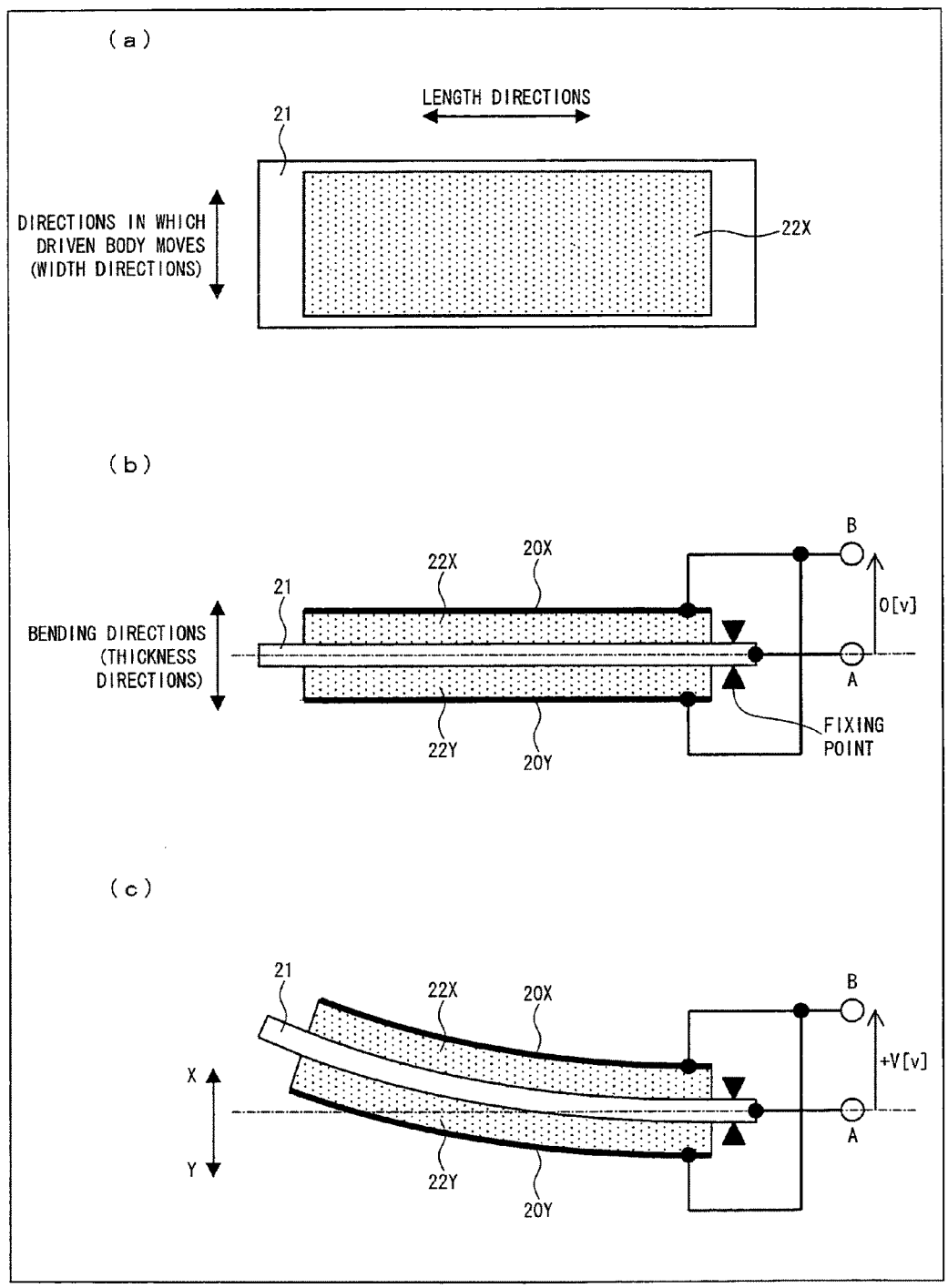

F I G. 1 3
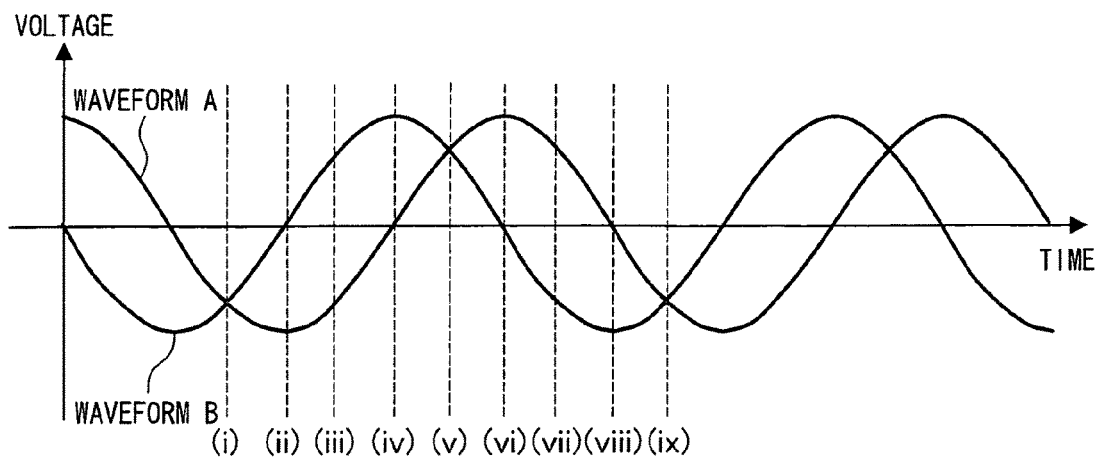

FIG. 17
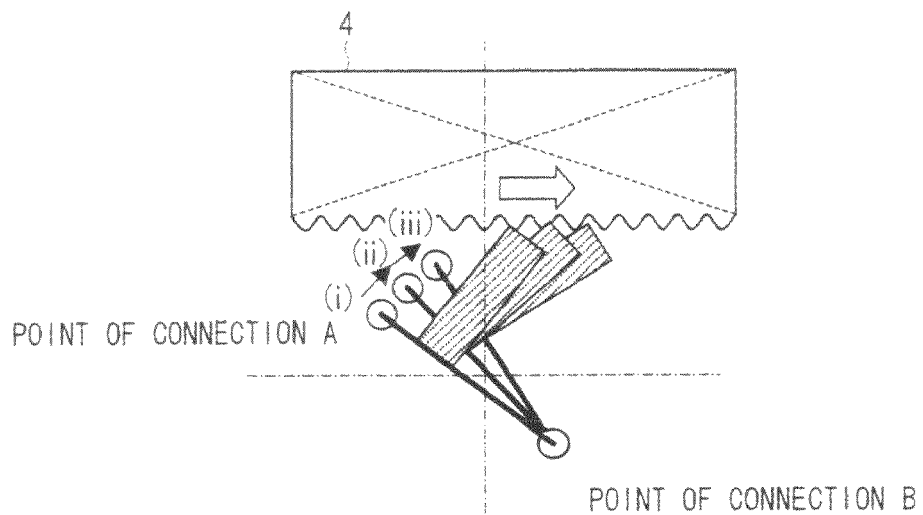
(a) POINT OF CONNECTION A / POINT OF CONNECTION B
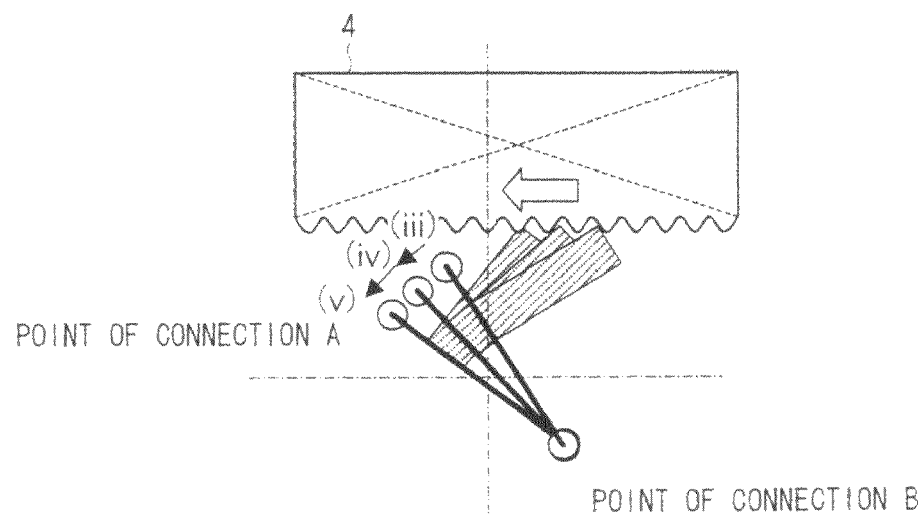
(b) POINT OF CONNECTION A / POINT OF CONNECTION B FIG. 24
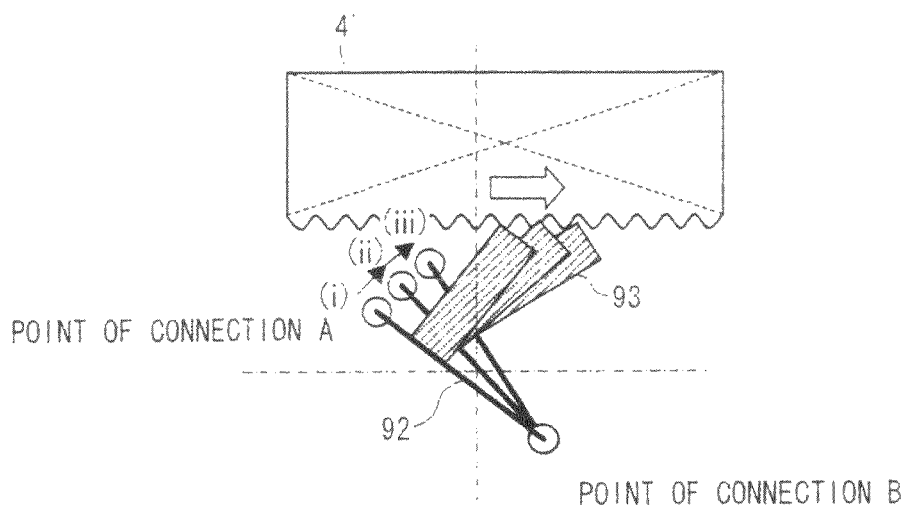
(a)
POINT OF CONNECTION A
POINT OF CONNECTION B
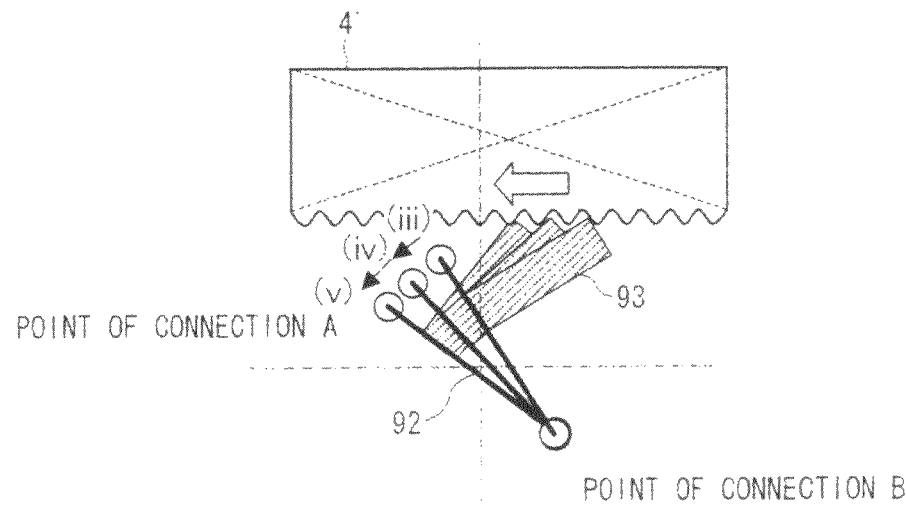
(b)
POINT OF CONNECTION A
POINT OF CONNECTION B

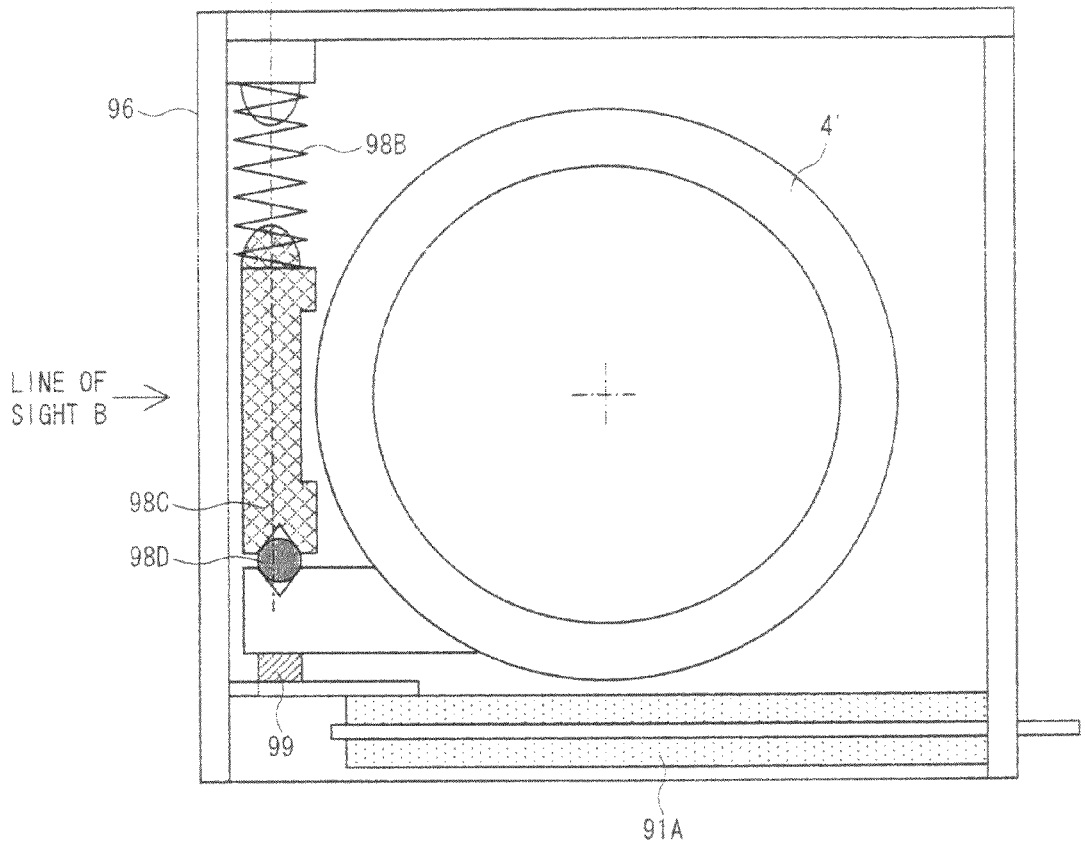
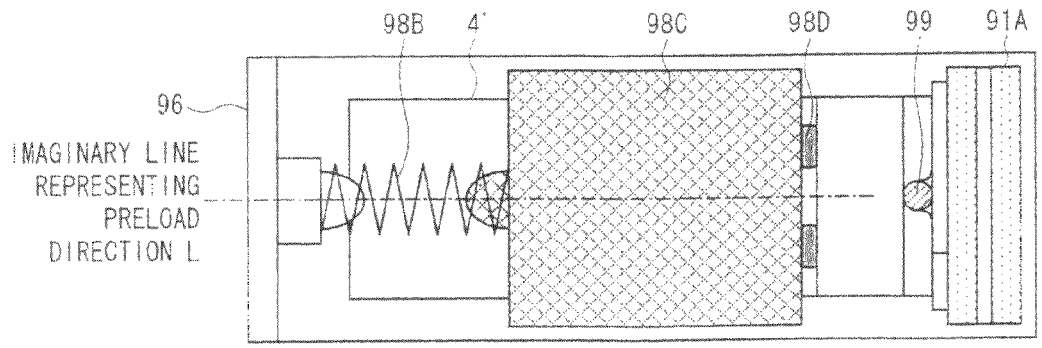

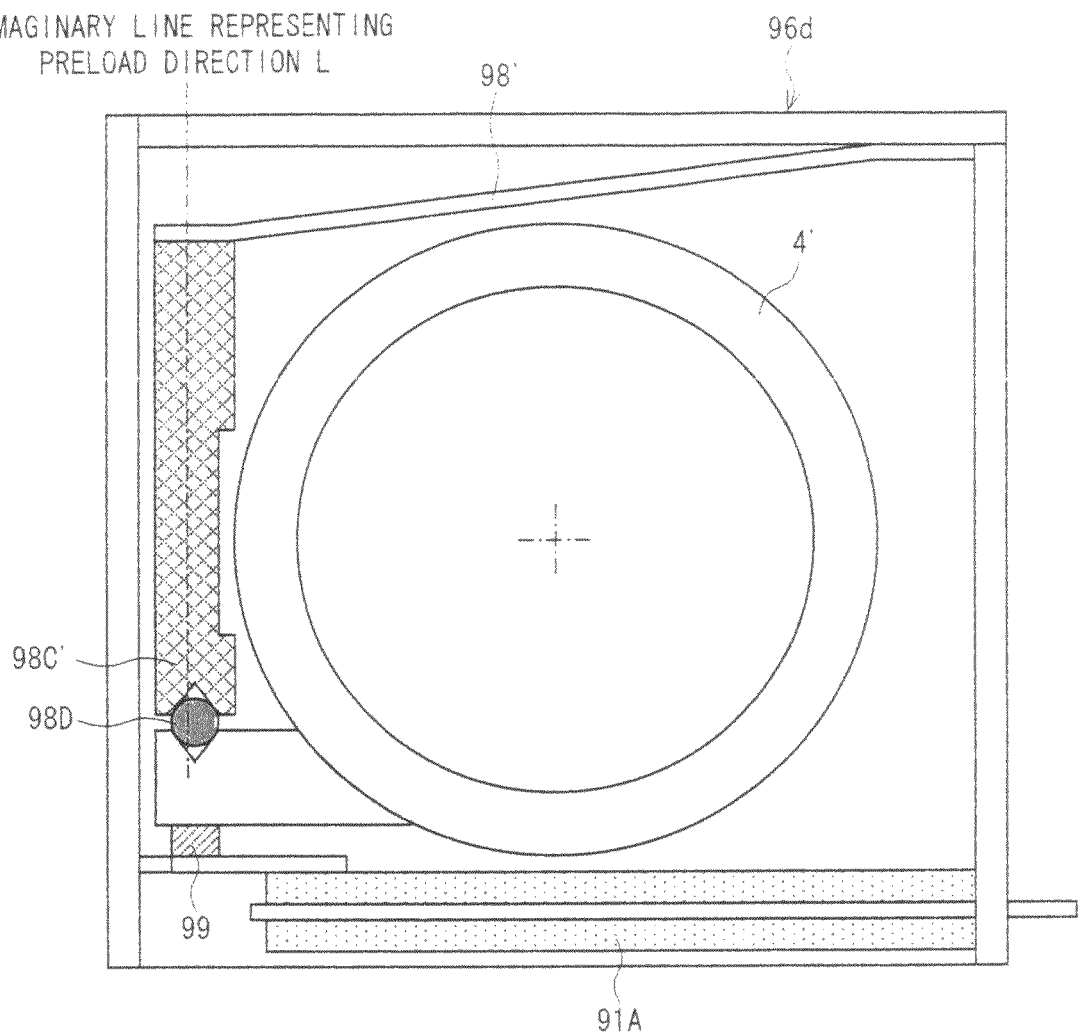

IMAGINARY LINE REPRESENTING PRELOAD DIRECTION L

DRIVING DEVICE, IMAGING DEVICE INCLUDING THE SAME, AND IMAGING APPARATUS

CROSS-REFERENCE TO RELATED APPLICATIONS

This application is the National Stage of PCT/JP2008/051974, filed Feb. 6, 2008, which claims the benefit of Japanese Applications 2007-027356, filed Feb. 6, 2007; 2007-210345, filed Aug. 10, 2007; 2007-305123, filed Nov. 26, 2007 and 2008-025690, filed Feb. 5, 2008. The entire contents of each of these applications is incorporated herein by reference.

TECHNICAL FIELD

The present invention relates to a driving device, an imaging device including the driving device, and an imaging apparatus.

BACKGROUND ART

Conventionally, there has been proposed a driving device for driving a driven body with use of an electromechanical transducer (piezoelectric element). Such a driving device is used for driving a lens in an optical device, e.g., for driving an imaging lens on a camera.

Conventionally, such a technical field includes Conventional Examples A and B below.

Conventional Example A is an invention that relates to a driving device including: a piezoelectric element capable of expanding and contracting in driving directions (i.e., directions along an optical axis) in which a body tube is driven; and a driving member joined to an end of the piezoelectric element. Conventional Example A is disclosed, for example, in Patent Literature 1 or Patent Literature 2. In Conventional Example A, the driving member is in engagement with the body tube. Moreover, the expansion and contraction of the piezoelectric element in the directions along the optical axis causes frictional force between the driving member and the body tube, and the frictional force causes the body tube to be driven in the directions along the optical axis.

FIG. 37 is an explanatory diagram for explaining the configuration of the driving device of Conventional Example A. As shown in FIG. 37, the driving device of Conventional Example A includes a piezoelectric element 301, a driving member 302 in the shape of a rod, a body tube (driven body) 304, a lens 3011, an imaging element 301 such as a CCD, and a circuit substrate 3013, all of which are housed in a housing 306.

The driving member 302 has an end joined to the piezoelectric element 301. Moreover, the body tube (driven body) 304 is in frictional engagement with the driving member 302.

Further, the body tube 304 has the lens 3011 fitted therein, and has the imaging element 3012 disposed therebelow. The circuit substrate 3013 has the imaging element 3012 fixed thereto by soldering or the like.

In the driving device of FIG. 37, the piezoelectric element 301 expands and contracts in the directions of the arrow; therefore, the driving member is driven in the directions along the optical axis. Accordingly, the body tube 304, which is in frictional engagement with the driving member 302, is driven in the directions along the optical axis.

Further, Conventional Example B is an invention that relates to an actuator having a plurality of piezoelectric elements joined to a mirror. Conventional Example B is disclosed, for example, in Patent Literature 3. Conventional Example B electrically controls bending of the plurality of piezoelectric elements, thereby tilting the mirror in a desired direction.

Further, a driving device using a piezoelectric element is disclosed, for example, in Patent Literature 4 or Patent Literature 5, as well as Patent Literatures 1 to 3 above.

The invention disclosed in Patent Literatures 4 and 5 is an invention that relates to a driving device including a piezoelectric element capable of expanding and contracting in driving directions (i.e., directions along an optical axis) in which a body tube is driven; and a driving member joined to an end of the piezoelectric element. Moreover, in Patent Literatures 4 and 5, the expansion and contraction of the piezoelectric element in the directions along the optical axis causes frictional force between the driving member and the body tube, and the frictional force causes the body tube to be driven in the directions along the optical axis. Further, Patent Literature 5 describes a driving device including a preload spring for imparting a preload to the body tube in a direction perpendicular to the direction of expansion of the piezoelectric element.

However, Conventional Examples A and B have the following problems.

That is, in the driving device of Conventional Example A, the piezoelectric element 301 is joined to an end of the driving member 302 along the optical axis, and the directions of expansion and contraction of the piezoelectric element 301 and the driving directions of the body tube 304 coincide with each other. This causes the driving member 302 and the piezoelectric element 301 to be arranged in a line along the driving directions (i.e., to be stacked), thus making it difficult to achieve a reduction in height of the driving device.

Further, in Conventional Example B, the amount of driving of the mirror is limited by the amount of displacement of the piezoelectric element.

Patent Literature 1: Japanese Patent Application Publication, Tokukaihei, No. 4-69070 A (Publication Date: Mar. 4, 1992)

Patent Literature 2: Japanese Patent Application Publication, Tokukaihei, No. 7-298656 A (Publication Date: Nov. 10, 1995)

Patent Literature 3: Japanese Patent Application Publication, Tokukai, No. 2003-209981 A (Publication Date: Jul. 25, 2003)

Patent Literature 4: Japanese Patent Application Publication, Tokukai, No. 2007-74890 A (Publication Date: Mar. 23, 2007)

Patent Literature 5: Japanese Patent No. 3171022 (Registration Date: Mar. 23, 2001)

SUMMARY OF INVENTION

The present invention has been made in view of the foregoing problems, and it is an object of the present invention to provide a low-profile driving device, an imaging device including the driving device, and an imaging apparatus.

In order to solve the foregoing problems, a driving device of the present invention is a driving device including a driving mechanism for driving a driven body, the driving mechanism including: a bending displacement member, partially fixed, which is excited by electrical control to be bent and displaced; and a driving-direction changing member, joined to the bending displacement member, which makes contact with the driven body to cause the driven body to be driven in displacement directions different from bending displacement directions of the bending displacement member.

According to the foregoing configuration, the excitation of the bending displacement member by electrical control to be bent and displaced causes the driving-direction changing member, joined to the bending displacement member, to be bent, too, thus producing a bend or strain in the driving-direction changing member. Moreover, the bend or strain in the driving-direction changing member causes the driving-direction changing member to move in a plane perpendicular to the bending displacement directions in such a way as to be able to make contact with the driven body. In the foregoing configuration, the motion of the driving-direction changing member causes the driven body to be driven in the displacement directions (driving directions) different from the bending displacement directions. That is, the driving-direction changing member functions as changing means for changing the bending displacement directions of the bending displacement member into the driving directions of the driven body.

Since a conventional driving device is configured such that the directions of expansion and contraction of a piezoelectric element as a driving source and the driving directions of a driven body coincide with each other, the dimension of the driving device along the driving directions is determined in consideration of the sum of the dimension of the driven body along the driving directions and the dimension of the piezoelectric element along the driving directions. This makes it difficult to achieve a reduction in height of the conventional driving device.

However, the foregoing configuration does not invite such a conventional problem. That is, according to the foregoing configuration, the bending displacement of the bending displacement member causes the driving-direction changing member to make contact with the driven body to cause the driven body to be driven in the displacement directions different from the bending displacement directions of the bending displacement member (the driving directions of the driven body and the bending displacement directions of the bending displacement member as a driving source differ from each other). This makes it possible to determine the dimension of the driving device along the driving directions in consideration of the dimension of the bending displacement member along the driving directions alone. Therefore, the foregoing configuration makes it possible to design a driving device so that the dimension of the driving device along the driving directions is smaller than that of a conventional driving device, thus making it possible to achieve a reduction in height of the driving device.

In order to solve the foregoing problems, an imaging device of the present invention includes: such a driving device for driving, as the driven body, a body tube having an objective lens attached thereto; and an imaging element for taking an image formed by the objective lens.

This makes it possible to provide an imaging device whose driving device has been reduced in height.

In order to solve the foregoing problems, an imaging apparatus of the present invention includes such an imaging device.

This makes it possible to provide an imaging apparatus whose driving device has been reduced in height.

For a fuller understanding of the nature and advantages of the invention, reference should be made to the ensuing detailed description taken in conjunction with the accompanying drawings.

BRIEF DESCRIPTION OF DRAWINGS

FIG. 1

FIG. 1 shows (a) a perspective view and (b) an exploded perspective view each showing the configuration of a driving device according to one embodiment of the present invention.

FIG. 2

FIG. 2 shows (a) a side view showing how a bending displacement member, an elastic member, and a friction member are positioned in relation to one another in the driving device of (a) and (b) of FIG. 1 and (b) a plan view showing the configuration of the driving device of (a) and (b) of FIG. 1.

FIG. 3

FIG. 3 shows (a) a side view showing how a bending displacement member, an elastic member, and a friction member are positioned in relation to one another in a driving device of according to another embodiment of the present invention and (b) a plan view showing the configuration of the driving device.

FIG. 4 shows (a) a side view showing how a bending displacement member, an elastic member, and a friction member are positioned in relation to one another in a driving device of according to still another embodiment of the present invention and (b) a plan view showing the configuration of the driving device.

FIG. 5 shows (a) a side view showing how a bending displacement member, an elastic member, and a friction member are positioned in relation to one another in a driving device of according to still another embodiment of the present invention.

FIG. 6 shows (a) a side view showing how a bending displacement member, an elastic member, and a friction member are positioned in relation to one another in a driving device of according to still another embodiment of the present invention and (b) a plan view showing the configuration of the driving device.

FIG. 7

FIG. 7 shows (a) a side view showing how a bending displacement member, an elastic member, and a friction member are positioned in relation to one another in a driving device of according to still another embodiment of the present invention and (b) a plan view showing the configuration of the driving device.

FIG. 8 shows examples (a) to (g) of how driving-direction changing members applicable to the present invention are configured.

FIG. 9

FIG. 9 shows an example of how bending members and an elastic member that are applicable to the present invention are configured.

FIG. 10 shows (a) an explanatory diagram for explaining an idea of how a bending displacement member in a driving device of any one of Embodiments 1 to 5 should be fixed and (b) an explanatory diagram for explaining an example of how a bending displacement member applicable to the present invention is fixed.

FIG. 11 is a cross-sectional view showing the configuration of an imaging device whose camera module housing houses the driving device of (a) and (b) of FIG. 1.

FIG. 12

FIG. 12 shows (a) a plan view, (b) a side view, each showing the configuration of a bimorph piezoelectric element, and (c) a diagram showing how the piezoelectric element is bent and displaced.

FIG. 13

FIG. 13 is a graph showing examples of waveforms of driving voltages that are applied to two bending displacement members.

FIG. 14 shows explanatory diagrams (a) to (c) for explaining how an end of a friction member is driven elliptically in accordance with the driving voltage waveforms of FIG. 13.

FIG. 15 is a graph showing examples of waveforms of driving voltages that are applied to two bending displacement members.

FIG. 16 shows explanatory diagrams (a) and (b) for explaining how an end of a friction member is driven circularly in accordance with the driving voltage waveforms of FIG. 15.

FIG. 17

FIG. 17 shows explanatory diagrams for explaining how an end of the friction member of the driving device of (a) and (b) of FIG. 6 is driven circularly.

FIG. 18 shows explanatory diagrams (a) to (c) for explaining examples of trajectories of an end of a friction member disposed as shown in (e) of FIG. 8.

FIG. 19 shows explanatory diagrams (a) and (b) for explaining examples of trajectories of an end of a friction member disposed as shown in (e) of FIG. 8.

FIG. 20 is a top view schematically showing the configuration of a driving device according to another embodiment of the present invention.

FIG. 21 is a side view schematically showing the configuration of the driving device as seen from the line of sight B of FIG. 20.

FIG. 22 is a perspective view schematically showing the configuration of the driving device as seen from the line of sight A of FIG. 20.

FIG. 23 is a graph showing the waveform of a driving voltage that is applied to a bending displacement member.

FIG. 24

FIG. 24 shows explanatory diagrams (a) and (b) for explaining how an end of a friction member is driven circularly in accordance with the driving voltage waveform of FIG. 23.

FIG. 25 is a top view schematically showing the configuration of a driving device of Modification 1.

FIG. 26 is a side view of the driving device of Modification 1 as seen from the light of sight B of FIG. 25.

FIG. 27

FIG. 27 is a top view schematically showing the configuration of a driving device of Modification 2.

FIG. 28

FIG. 28 is a side view of the driving device of Modification 2 as seen from the light of sight B of FIG. 27.

FIG. 29

FIG. 29 is a top view schematically showing the configuration of a driving device of Modification 3.

FIG. 30 is a top view schematically showing the configuration of a driving device of Modification 4.

FIG. 31 is a top view schematically showing the configuration of a driving device according to still another embodiment of the present invention.

FIG. 32 is a perspective view schematically showing the configuration of the driving device as seen from the line of sight X of FIG. 31.

FIG. 33 shows side views (a) to (c) each schematically showing the arrangement of (i) a bending displacement member, (ii) a driving-direction changing member, which is constituted by an elastic member and a friction member, and (iii) a body tube as seen from the line of sight of Y of FIG. 31, (a) showing a state where the bending displacement member has been displaced most greatly in the +x direction, (b) showing a state where the bending displacement member has been displaced most greatly in the −x direction, (c) showing a state where the elastic member has resonated.

FIG. 34 is a perspective view schematically showing the configuration of a driving device according to still another embodiment of the present invention.

FIG. 35 is a perspective view schematically showing the configuration of the present driving device as Modification 5.

FIG. 36 is a perspective view schematically showing the configuration of the present driving device as Modification 5.

FIG. 37 is an explanatory diagram for explaining the configuration of a driving device of Conventional Example A.

DESCRIPTION OF EMBODIMENTS

Figure 4:
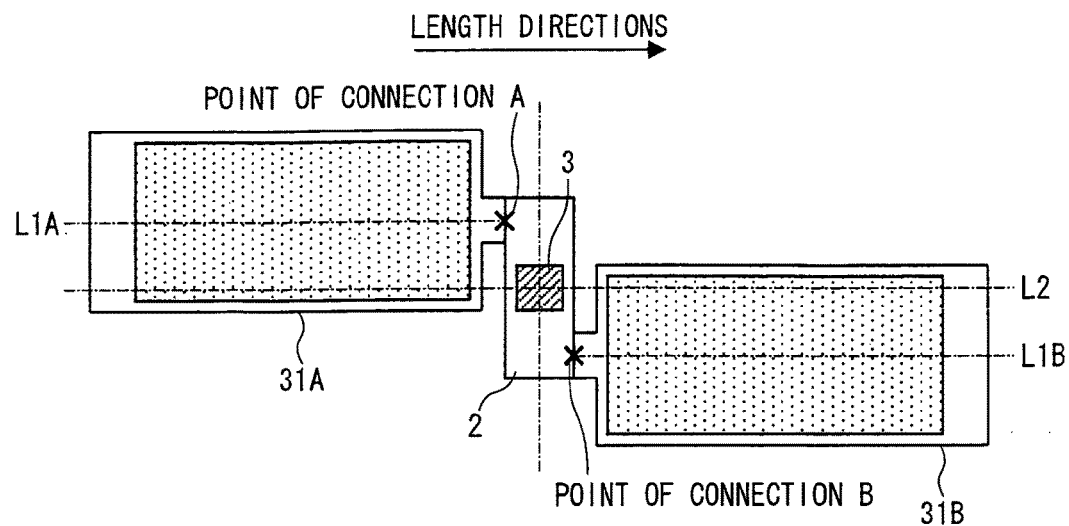
FIG. 4

A driving device of the present invention includes a bending displacement member and control means for electrically controlling bending displacement of the bending displacement member. That is, in the present driving device, the control means performs electrical control to excited the bending displacement member to be bent and displaced. First, the bending displacement member, which is excited by electrical control to be bent and displaced, is described. An example of the bending displacement member is a bimorph piezoelectric element shown, for example, in (a) to (c) of FIG. 12.

FIG. 12 shows (a) a plan view, (b) a side view, each showing the configuration of a bimorph piezoelectric element, and (c) a diagram showing how the piezoelectric element is bent and displaced.

The piezoelectric element of (a) to (c) of FIG. 12 includes two piezoelectric material layers 22X and 22Y and a shim 21 made of metal. The piezoelectric element has a three-layer structure of the two piezoelectric material layers 22X and 22Y pressure-bonded to each other with the shim 21 sandwiched therebetween. Moreover, the three-layer structure is sandwiched between two electrodes 20X and 20Y. The two electrodes 20X and 20Y are connected to the control means (not shown). Moreover, the shim 21 has an end fixed and supported (at a "fixing point" indicated by filled triangle marks in (b) and (c) of FIG. 12). In (a) to (c) of FIG. 12, it is assumed that the thickness directions are the directions of lamination of the three-layer structure constituted by the piezoelectric material layers 22X and 22Y and the shim 12. In the plan view of (a) of FIG. 12, it is assumed that the length directions are the longitudinal directions of the piezoelectric element, and that the width directions are directions orthogonal to the length directions. Furthermore, the thickness directions include a thickness direction X extending upward to the piezoelectric material layer 22X and a thickness direction Y extending downward to the piezoelectric material layer 22Y.

In the piezoelectric element of (a) and (b) of FIG. 12, application of a voltage to the electrodes 20X and 20Y by the control means causes the piezoelectric element to be bent and displaced in the thickness directions.

For example, the piezoelectric material layer 22X is polarized so as to contract in cases where the voltage between the electrode 20X and the shim 21 is positive and so as to expand in cases where when the voltage between the electrode 20X and the shim is negative. Further, the piezoelectric material layer 22Y is polarized so as to expand in cases where the voltage between the electrode 20Y and the shim 21 is positive and so as to contract in cases where the voltage between the electrode 20Y and the shim 21 is negative.

The following describes a case where the control means applies voltages to the piezoelectric material layers 22X and 22Y polarized as described above. As shown in (c) of FIG. 12, the control means applies a positive voltage between the shim 21 and each of the electrodes 20X and 20Y (between A and B in (c) of FIG. 12). Further, the shim 21 is fixed at the fixing point indicated by the filled triangle marks. In this case, as shown in (c) of FIG. 12, the piezoelectric element is bent and displaced in the thickness direction X. On the other hand, although not shown, when the control means applies a negative voltage between A and B, the piezoelectric element is bent and displaced in the thickness direction Y.

In this way, the piezoelectric element of (a) to (c) of FIG. 12 is configured to be bent and displaced due to voltage application by the control means. The bending displacement member of the driving device of the present invention is not limited to the piezoelectric element of (a) to (c) of FIG. 12, as long as the bending displacement member has a configuration that makes it possible to electrically control the bending displacement. An example of such a bending displacement member is a monomorph piezoelectric element constituted by a single piezoelectric material layer and a shim. Such a monomorph piezoelectric element has a concept operation similar to that of the bimorph piezoelectric element, and makes it possible to electrically control the bending displacement.

As described above, the bending displacement member of the driving device of the present invention indicates a member that is bent and displaced by electrical control such as voltage application. The structure of the bending displacement member is not limited in dimensions, such thickness, length, and width, or in shape.

In the following, for simplicity of explanation, the bending displacement member that is excited by electrical control to be bent and displaced is referred to simply as "bending displacement member".

Further, this specification assumes that when the bending displacement member is disposed in the driving device, the directions of movement of a driven body are driven body movement directions or the width directions (of the bending displacement member), that the directions of bending of the bending displacement member are the bending directions or the thickness directions (of the bending displacement member), and that the directions orthogonal to the driven body displacement directions (width directions) and also orthogonal to the bending directions (thickness directions) are the length directions (of the bending displacement member). These terms are not influenced by the dimension of the bending displacement member or the position of the fixed part of the bending displacement member.

Embodiment 1

One embodiment of the present invention is described below with reference to (a) and (b) of FIG. 1 and (a) and (b) of FIG. 2. FIG. 1 shows (a) a perspective view and (b) an exploded perspective view each showing the configuration of a driving device according to the present embodiment (such a driving device being hereinafter referred to as "present driving device"). The driving device of (a) and (b) of FIG. 1 is an optimum embodiment applied as a focus adjustment mechanism of a compact camera module.

First, as shown in (a) and (b) of FIG. 1, the present driving device includes bending displacement members 1A and 1B, an elastic member (driving-direction changing member) 2, a friction member (driving-direction changing member: contact part) 3, a body tube (driven body) 4, a guide bar 5, a camera module housing 6, and driving circuits (control means) 7A and 7B.

In the present driving device, the elastic member 2 joins the bending displacement members 1A and 1B. The elastic member 2 has the friction member 3 joined thereto to be in frictional engagement with the body tube 4".

It should be noted that the "driving-direction changing member" means a member constituted by the elastic member 2 and the friction member 3. In the present driving device, the elastic member 2 and the friction member 3 are shown as separate members. However, in the present invention, as will be described later, the driving-direction changing member is not limited to a configuration in which the elastic member 2 and the friction member 3 are separate members.

The bending displacement members 1A and 1B are bimorph piezoelectric elements each having a three-layer structure of two piezoelectric material layers pressured-bonded to each other with a shim sandwiched as described above. As shown in (a) and (b) of FIG. 1, each of the bending displacement members 1A and 1B has an end (i.e., a prolongation of the shim in the present embodiment) fixedly bonded to or fitted in the camera module housing 6 and the other end joined to the elastic member 2.

The elastic member 2 is made of material comparatively low in elastic modulus such as metal or resin. In the present driving device, the friction member 3 and the body tube 4 are in contact (frictional engagement) with each other so that the body tube 4 moves along the optical axis. Therefore, the friction member 3 is made, for example, of metal, resin, or carbon. The material is chosen according to a desired coefficient of friction with the body tube 4.

The present driving device is provided with the guide bar 5, which guides the body tube 4 to move along the optical axis. The body tube 4 is provided with a hole through which the guide bar 5 is inserted. The guide bar 5 is a rod-like member extending along the optical axis, and is fixed to the bottom part (or top part) of the camera module housing 6. The guide bar 5 serves to support the body tube 4 to be positioned to be in contact (frictional engagement) with the friction member 3. In the present driving device, the frictional engagement between the friction member 3 and the body tube 4 causes the body tube 4 to move along the guide bar 5 in the directions along the optical axis. It should be noted that the body tube 4 is not limited to the configuration in which the body tube 4 is formed integrally with the hole through which the guide bar 5 is inserted. The body tube 4 may be configured to have a separate hole member, bonded thereto, which includes a hole. Alternatively, the body tube 4 may be configured to have a friction adjustment member, joined (or bonded) to that part of the body tube 4 which is in frictional engagement with the friction member 3, which gives a desired coefficient of friction. In other words, in the present embodiment, the body tube encompasses a configuration including such a hole member or friction adjustment member.

The bending displacement member 1A is connected to the driving circuit 7A, and the bending displacement member 1B is connected to the driving circuit 7B. The driving circuit 7A applies a voltage or the like to the bending displacement member 1A so that the bending displacement member 1A is excited to be bent and displaced. The driving circuit 7B applies a voltage or the like to the bending displacement member 1B so that the bending displacement member 1B is excited to be bent and displaced. The driving circuits 7A and 7B are controlled by an upper control circuit (not shown) and output to the bending displacement members 1A and 1B respective voltages each corresponding to a driving waveform described later. It should be noted that the "control means" refers to means including the driving circuits 7A and 7B and the upper control circuit.

It should be noted that the electrical control of the bending displacement of the bending displacement members 1A and 1B by the control means is not limited to control by voltage. For example, in cases where a bimetal or shape memory alloy is used as the bending displacement members 1A and 1B and heat is used to excite the bending displacement members 1A and 1B to be bent and displaced, the electrical control of the bending displacement of the bending displacement members 1A and 1B is performed by increasing or decreasing currents. In this case, temperatures of the bending displacement members 1A and 1B are controlled by controlling heat generated at respective parts of the bending displacement members 1A and 1B by increasing or decreasing the currents flowing through the bending displacement members 1A and 1B. Alternatively, the bending displacement members 1A and 1B are provided in the vicinity of heat generating means, made of, for example, heat generating wire such as nichrome wire or kanthal wire, which generate heat through electric current flows, and the heat generated by the heat generating means is controlled by increasing or decreasing the currents flowing through the heat generating means so that the temperatures of the bending displacement members 1A and 1B are controlled. As another alternative, for example, in cases where magnetorestrictive elements are used as the bending displacement members 1A and 1B and the bending displacement members 1A and 1B are excited by a magnetic field to be bent and displaced, a magnetic field generating means, such as an electromagnet, that generates a magnetic field by an electric current flow is provided so that the magnetic field applied to each of the bending displacement members 1A and 1B is controlled by controlling increase and decrease of the electric current.

Further, although not shown in (a) and (b) of FIG. 1, the body tube 4 has an optical component such as a lens fitted therein and an imaging element such as a CCD provided at the bottom part thereof.

According to the present driving device, the body tube 4 is driven along the guide bar 5 by a driving mechanism including the bending displacement members 1A and 1B, the elastic member 2, and the friction member 3. As a result, the optical component fitted in the body tube 4 is driven along the optical axis to perform focus adjustment. In the present embodiment, the driven body movement directions in which the body tube 4 is moved are synonymous with the directions along the optical axis. Further, in this specification, the directions in which an optical component fitted in the body tube 4 forms an image of an object (directions along a straight line connecting the body tube 4 with the object) are referred to as "directions along the optical axis".

The camera module housing 6 is a member housing the bending displacement members 1A and 1B, the elastic member 2, the friction member 3, the body tube 4, and the guide bar 5. In the present driving device, the camera module housing 6 is in the shape of a cuboid, and has side walls 6a to 6d. As shown in (a) and (b) of FIG. 1, the bending displacement members 1A and 1B are provided as a part of the side walls. In other words, the bending displacement members 1A and 1B also serve as side walls 6c and 6d of the camera module housing 6. The bending displacement members 1A and 1B are disposed so that, assuming that straight lines connecting a given point (for example, a point S indicated in (b) of FIG. 2) on the bending displacement member 1A with a given point (for example, a point T indicated in (b) of FIG. 2) on the bending displacement member 1B are drawn, at least one of the straight lines passes through the body tube 4. Further, the elastic member 2 and the friction member 3 are provided in a corer formed by the two side walls 6c and 6d that also serve as the bending displacement members 1A and 1B.

Thus, in the present driving device, the bending displacement members 1A and 1B form a part of walls of the camera module housing 6, and the elastic member 2 and the friction member 3 are disposed in the corner, which has a plenty of space. This makes it possible to make efficient use of the space in the camera module housing 6 for disposing the driving mechanism, thus making it possible to achieve a reduction in size of the driving device. Further, unlike a conventional driving device, the present driving device is not configured to have a driving member 302 and a piezoelectric member 301 arranged in a line along the optical axis. This makes it possible to achieve a reduction in height of the driving device.

In the present driving device, the bending displacement members 1A and 1B, the elastic member 2, and the friction member 3 are disposed so that the body tube 4 is driven in directions perpendicular to bending displacement directions of the bending displacement members 1A and 1B. The following describes the way in which the bending displacement members 1A and 1B, the elastic member 2 and the friction member positioned in relation to one another and the principles of operation according to which the body tube 4 is driven.

(Positional Relationship)

(a) of FIG. 2 is a side view showing how the bending displacement members 1A and 1B, the elastic member 2, and the friction member 3 are positioned in relation to one another in the present driving device, and (b) of FIG. 2 is a plan view showing the configuration of the present driving device. In (a) of FIG. 2, the point of connection A (marked with X in (a) of FIG. 2) is a point at which the bending displacement member 1A and the elastic member 2 are joined together, and the point of connection B (marked with X in (a) of FIG. 2) is a point at which the bending displacement member 1B and the elastic member 2 are joined together. Further, the imaginary line L1 is a line that passes through the respective centers of the bending displacement members 1A and 1B in parallel with the length directions. This imaginary line L1 also passes through the friction member 3. In addition, this imaginary line L1 is in a plane including the points of connection A and B, and is also defined as a straight line perpendicular to the driving directions of the driven body.

As shown in (a) of FIG. 2, the bending displacement members 1A and 1B are both arranged on the imaginary line L1. In other words, the bending displacement members 1A and 1B are disposed so that a line passing through the center of the bending displacement member 1A in parallel with the length directions and a line passing through the center of the bending displacement member 1B in parallel with the length directions overlaps with each other on the same imaginary line L1.

Further, the points of connection A and B are disposed so that the imaginary line L1 intersects with an imaginary line AB connecting theses two points. Further, as shown in (a) of FIG. 2, the point of connection A is disposed above the imaginary line L1. Meanwhile, the point of connection B is disposed below the imaginary line L1.

Further, the friction member 3 is disposed on the imaginary line AB connecting the points of connection A and B. That is, assuming that a second straight line L1' is a straight line passing through a given point on the imaginary line AB and perpendicular to a plane including the joints A and B, the contact part of the friction member 3 with the body tube 4 passes through the second line L1'.

Further, as shown in (b) of FIG. 2, the bending displacement member 1A is displaced in the directions of an arrow referred to as bending displacement directions A. Accordingly, a displacement vector is excited at the point of connection A of the elastic member 2 in the directions of an arrow referred to as displacement directions A of the elastic member. Meanwhile, the bending displacement member 1B is displaced in the directions of an arrow referred to as bending displacement directions B. Accordingly, a displacement vector is excited at the point of connection B of the elastic member 2 in the direction of an arrow referred to as displacement directions B of the elastic member 2. (That is, the displacement vectors are excited at the points of connection A and B in (a) of FIG. 2 in directions perpendicular to FIG. 2.) Although other displacement vectors are excited at the points of connection A and B in directions other than the above directions, these displacement vectors are remotely related to driving, and as such, are not described below.

The following describes the present driving device in view of the waveforms of driving voltages that are applied by the control means including the driving circuits 7A and 7B and the principles of operation according to which the body tube 4 is driven in the directions along the optical axis in accordance with the driving voltage waveforms.

(Principle of Operation 1)

Figure 14:
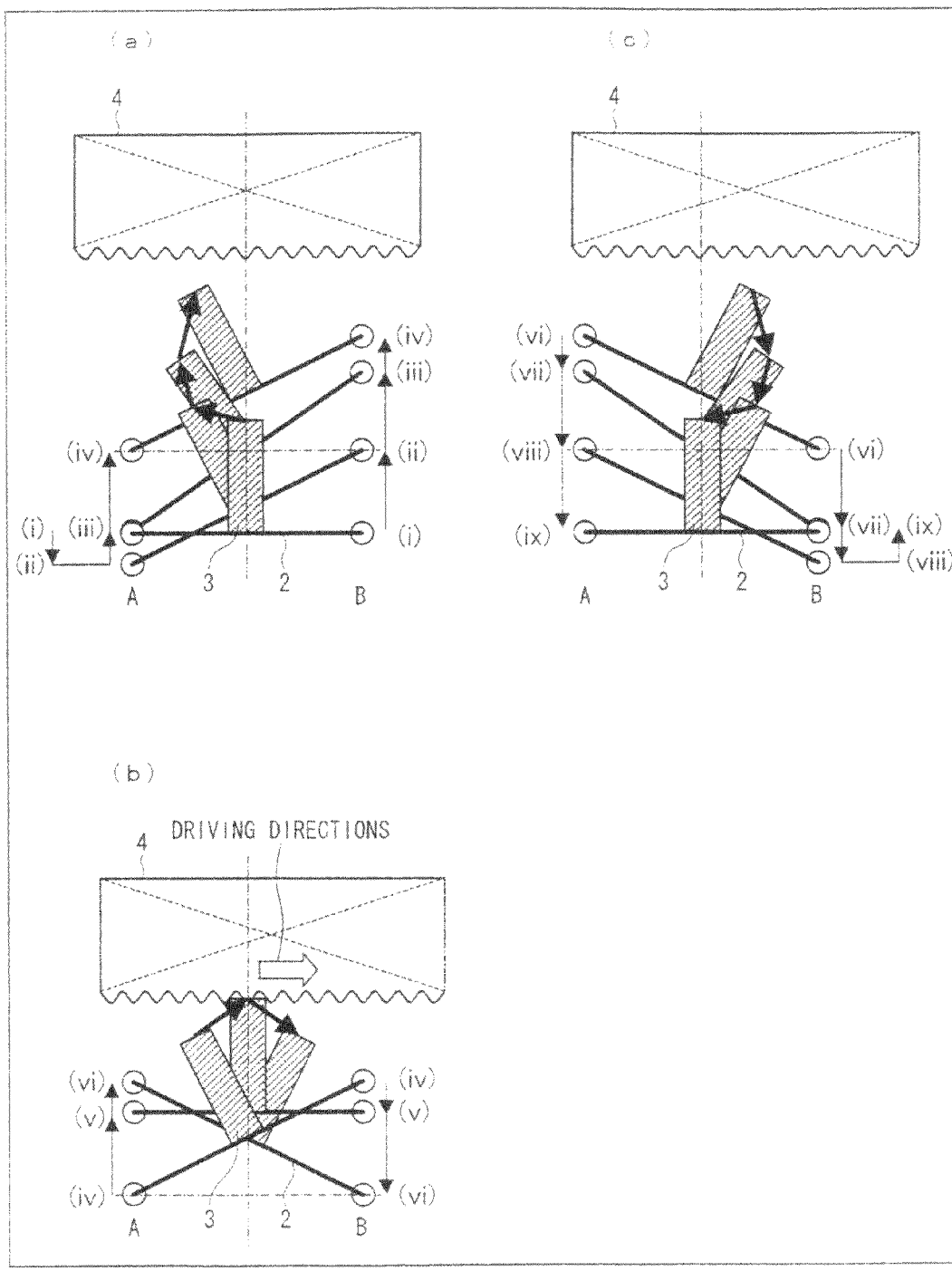
FIG. 14

First, the following describes an example of operation where the body tube 4 is driven in the direction along the optical axis by driving an end (part in frictional engagement with the body tube 4: contact part) of the friction member 3 elliptically. FIG. 13 is a graph showing examples of waveforms of driving voltages that are applied to the two bending displacement members 1A and 1B. FIG. 14 shows explanatory diagrams (a) to (c) for explaining how the end of the friction member 3 is driven elliptically in accordance with the driving voltage waveforms of FIG. 13. FIG. 14 shows diagrams as seen from the direction of the arrow V of (b) of FIG. 2.

In FIG. 13, the waveform A is the waveform of a driving voltage that is applied to the bending displacement member 1A, and the waveform B is the waveform of a driving voltage that is applied to the bending displacement member 1B. It should be noted that the driving voltage of the waveform A is outputted from the driving circuit 7A and the driving voltage of the waveform B is outputted from the driving circuit 7B. As shown in FIG. 13, the waveforms A and B are sine-wave driving voltage waveforms, and are relatively 90 degrees out of phase with each other. (a) to (c) of FIG. 14 show the states of the points of connection A and B in correspondence with the points of time (i) through (ix) of the waveforms A and B of FIG. 13.

As shown in (a) to (c) of FIG. 14, when the driving voltages of the waveforms A and B are applied, the points of connection A and B shift in position to (i) through (ix). That is, at the point of time (ii) of FIG. 13, the points of connection A and B are in the state (i) of (a) of FIG. 14. At the point of time (ii) of FIG. 13, the points of connection A and B are in the state (ii) of (a) of FIG. 14. At the point of time (iii) of FIG. 13, the points of connection A and B are in the state (iii) of (a) of FIG. 14. At the point of time (iv) of FIG. 13, the points of connection A and B are in the state of (iv) of (a) and (b) of FIG. 14. At the point of time (v) of FIG. 13, the points of connection A and B are in the state (v) of (b) of FIG. 14. At the point of time (vi) of FIG. 13, the points of connection A and B are in the state (vi) of (b) and (c) of FIG. 14. At the time (vii) of FIG. 13, the points of connection A and B are in the state (vii) of (c) of FIG. 14. At the point of time (viii) of FIG. 13, the points of connection A and B are in the state (viii) of (c) of FIG. 14. At the point of time (ix) of FIG. 13, the points of connection A and B are in the state (ix) of (c) of FIG. 14. The shift and displacement of the points of connection A and B to the states (i) through (ix) of (a) to (c) of FIG. 14 causes the end of the friction member 3 to be driven elliptically as shown in (a) to (c) of FIG. 14. Let it be assumed here that the displacement direction of the end of the friction member 3 in contact with the body tube 4 is referred to as "driving direction". Then, the body tube 4 is driven by the friction member 3 in a scratching manner in a driving direction determined in accordance with the rotation direction of the end.

In the example shown in FIG. 13 and (a) to (c) of FIG. 14, the end of the friction member 3 is disposed so as to come into contact with the body tube 4 and move apart from the body tube 4 in accordance with the rotational displacement (elliptical motion) of the end of the friction member 3. However, the present embodiment is not limited to the example described above.

The present driving device may be configured such that the end of the friction member 3 is always in contact with the body tube 4. For example, the present driving device may be configured such that a spring is used as the elastic member 2 and the friction member 3 is always pressed against the body tube 4 by the spring. Alternatively, the present driving device may be configured such that the bending displacement members 1A and 1B are each pulled by a predetermined amount toward the body tube 4 (toward the driven body) and fixed. As another alternative, the present driving device may be configured such that the guide bar 5 is fixed so as to press the body tube 4 toward the friction member 3. Such configurations provide a preload, whereby the end of the friction member 3 is disposed so as to be always in contact with the body tube 4.

In such configurations, the end of the friction member 3 is excited alternately to be displaced linearly in the driving direction and the opposite direction (opposite driving direction) (in spite of a strain produced in the bending displacement members 1A and 1B, the elastic member 2, the friction member 3, and the like), instead of being rotated elliptically. Accordingly, the friction member 3 varies in press force on the body tube 4 between displacement in the driving direction and displacement in the opposite driving direction. That is, the end of the friction member 3 applies greater press force to the body tube 4 during displacement in the driving direction, and the end of the friction member 3 applies less press force to the body tube 4 during displacement in the opposite driving direction.

This results in a difference in static frictional force between the friction member 3 and the body tube 4. Therefore, it becomes possible to control the friction coefficient of the friction member 3 or the preload so that: the end of the friction member 3 does not slip on the body tube 4 when the body tube 4 is displaced in the driving direction, whereas the end of the friction member 3 slips on the body tube 4 when the body tube 4 is displaced in the opposite driving direction. As a result, the body tube 4 is driven on the average in the driving direction, even though the body member may be pulled back a little during displacement in the opposite driving direction.

Further, it is also possible to control the friction coefficient of the friction member 3 or the preload so that the end of the friction member 3 slips on the body tube 4 at the time when the body tube 4 is displaced in the driving direction or the opposite driving direction. In this case, the driving force acting on the body tube 4 is determined by dynamic frictional force during both displacement in the driving direction and displacement in the opposite driving direction. Even in this case, the friction member 3 varies in press force on the body tube 4. Therefore, the dynamic frictional force in the driving direction becomes larger than the dynamic frictional force in the opposite driving direction. Therefore, although there may be a period during which the body tube 4 is pulled back a little in the opposite driving direction, the body tube 4 is driven in the driving direction on the average.

Further, the driving voltage waveforms are not specifically limited to sine waves although the above description provides an example where the driving voltage waveforms are sine-wave waveforms. Further, the amount of phase shift is not limited to 90 degrees although the above description provides an example where the amount of phase shift is 90 degrees.

(Principle of Operation 2)

Figure 15:
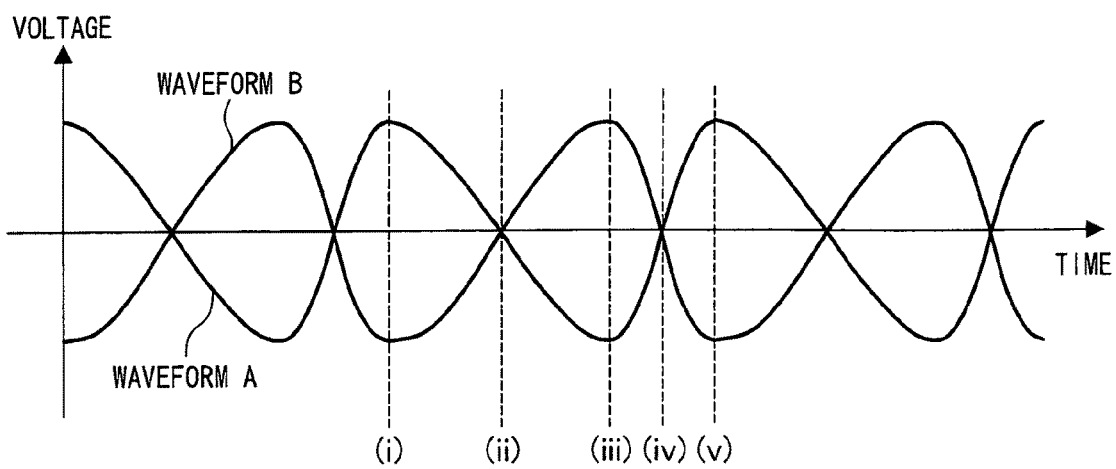
FIG. 15
Figure 16:
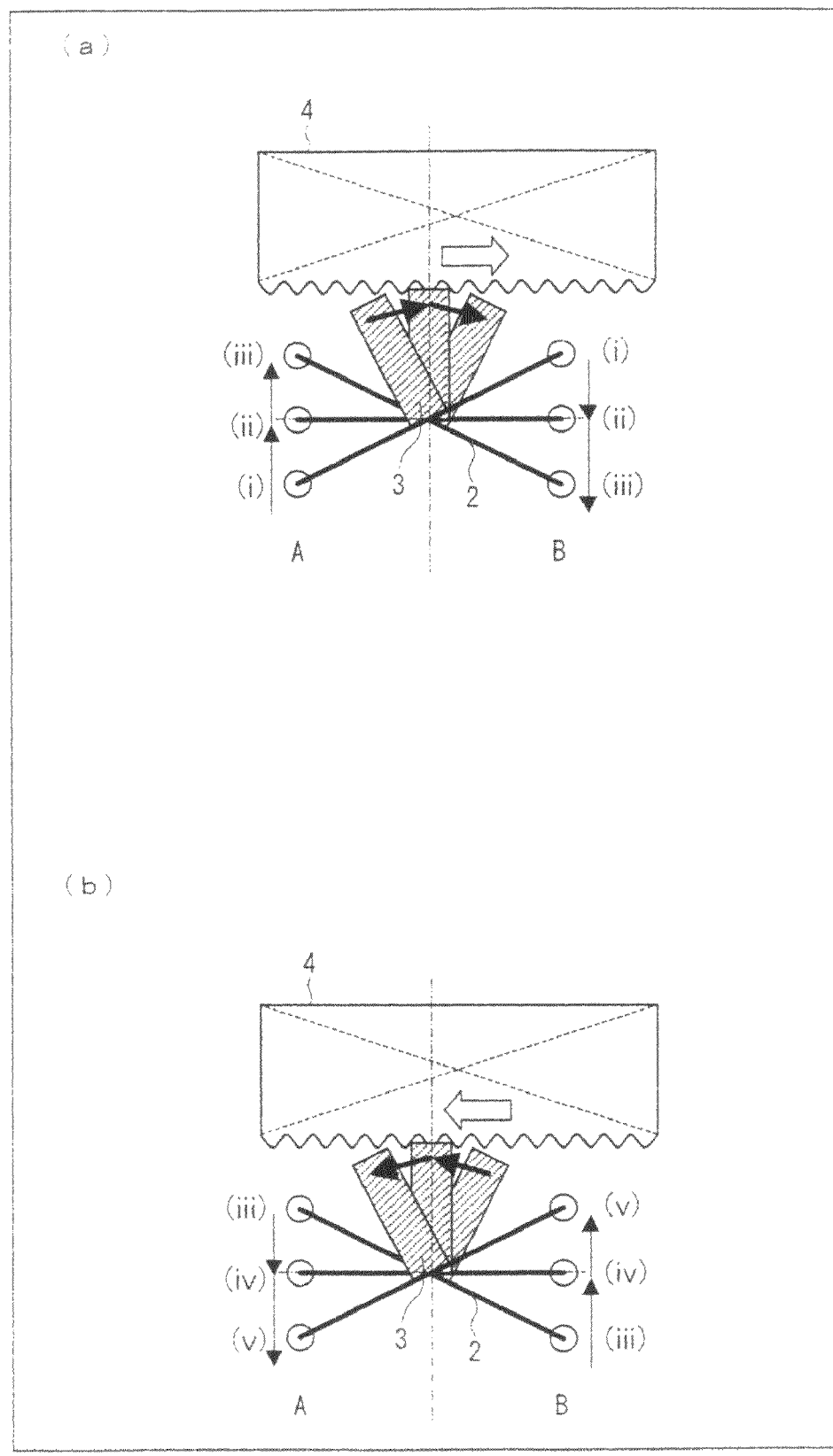
FIG. 16

Next, the following describes an example of operation where the body tube 4 is driven in the directions along the optical axis by driving the end (part in frictional engagement with the body tube 4) circularly. FIG. 15 is a graph showing examples of waveforms of driving voltages that are applied to the two bending displacement members 1A and 1B. FIG. 16 shows explanatory diagrams (a) and (b) for explaining how the end of the friction member 3 is driven circularly in accordance with the driving voltage waveforms of FIG. 15. FIG. 16 shows diagrams as seen from the direction of the arrow V of (b) of FIG. 2.

In FIG. 15, the waveform A is the waveform of a driving voltage that is applied to the bending displacement member 1A, and the waveform B is the waveform of a driving voltage that is applied to the bending displacement member 1B. It should be noted that the driving voltage of the waveform A is outputted from the driving circuit 7A and the driving voltage of the waveform B is outputted from the driving circuit 7B. As shown in FIG. 15, the waveforms A and B are saw-tooth driving voltage waveforms, and are 90 degrees out of phase with each other. (a) and (b) of FIG. 16 show the states of the point of connection A and B in correspondence with the points of time (i) through (v) of the waveforms A and B of FIG. 15.

As shown in (a) and (b) of FIG. 16, when the driving voltages of the waveforms A and B are applied, the points of connection A and B shift in position to the states (i) thorough (v). That is, at the point of time (i) of FIG. 15, the points of connection A and B are in the state (i) of (a) of FIG. 16. At the point of time (ii) of FIG. 15, the points of connection A and B are in the state (ii) of (a) of FIG. 16. At the point of time (iii) of FIG. 15, the points of connection A and B are in the state (iii) of (a) and (b) of FIG. 16. At the point of time (iv) of FIG. 15, the points of connection A and B are in the state (iv) of (b) of FIG. 16. At the point time (v) of FIG. 15, the points of connection A and B are in the state (v) of (b) of FIG. 16. The shift and displacement of the points of connection A and B to the states (i) through (v) of (a) and (b) of FIG. 16 causes the end of the friction member 3 to be driven circularly as shown in (a) and (b) of FIG. 16.

At this time, the end of the friction member 3 is driven circularly in accordance with the saw-tooth driving voltage waveforms of FIG. 15. This causes a difference in angular velocity between the driving direction the opposite driving direction (that is, while the angular velocity of the shift to the states (i) through (iii) (in the driving direction) becomes relatively low, the angular velocity of the shift to the states (iii) thorough (v) (in the opposite driving direction) becomes relatively high).

Further, the appropriate setting of the driving voltage waveforms makes it possible to cause the end of the friction member 3 to differ in angular acceleration between the driving direction and the opposite driving direction. That is, it is possible to set the driving voltage waveforms so that while the angular acceleration of the shift to the states (i) through (iii) (in the driving direction) becomes relatively low, the angular acceleration of the shift to the states (iii) through (v) (in the opposite driving direction) becomes relatively high. Therefore, the adjustment of the coefficient of friction and the like of the friction member 3 makes it possible to prevent force applied to a point of contact between the friction member 3 and the body tube 4 in the driving direction from exceeding static frictional force between the friction member 3 and the body tube 4, and to thereby prevent the end of the friction member 3 from slipping on the body tube 4. Meanwhile, force applied to a point of contact between the friction member 3 and the body tube 4 in the opposite driving direction exceeds static frictional force between the friction member 3 and the body tube 4. This allows the end of the friction member 3 to slips on the body tube 4. This results in a difference in driving force between the driving direction and the opposite driving direction, thus causing the body tube 4 to be driven in the driving direction.

Further, both in the driving direction and the opposite driving direction, the coefficient of friction and the like can be adjusted so that the end of the friction member 3 slips on the body tube 4. In this case, the driving force in the driving direction and the driving force in the opposite driving direction are determined by the dynamic frictional force to become equal. However, since the driving voltage waveforms of FIG. 15 are set so that the duration of displacement in the driving direction is long and the duration of displacement in the opposite driving direction is short, the duration of action of dynamic frictional force in the driving direction becomes longer than the duration of action of dynamic frictional force in the opposite driving direction. This as a result causes the body tube 4 to be driven in the driving direction.

The present driving device may be configured such that the end of the friction member 3 is always in contact with the body tube 4. For example, the present driving device may be configured such that a spring is used as the elastic member 2 and the friction member 3 is always pressed against the body tube 4 by the spring. Alternatively, the present driving device may be configured such that the bending displacement members 1A and 1B are pulled by a predetermined amount toward the body tube 4 (toward the driven body) and fixed. As another alternative, the present driving device may be configured such that the guide bar 5 is fixed so as to press the body tube 4 toward the friction member 3. Such configurations provide a preload, whereby the end of the friction member 3 is disposed so as to be always in contact with the body tube 4.

In such configurations, the end of the friction member 3 is excited alternately to be displaced in the driving direction and in the opposite direction (the opposite driving direction) (in spite of a strain produced in the bending displacement members 1A and 1B, the elastic member 2, the friction member 3, and the like), instead of being rotated circularly. Even in such a case, the body tube 4 can be driven, of course, according to the same principle as explained in Principle of Operation 1.

Further, the elastic member is joined so that an imaginary line connecting the center of the point of connection A with the center of the point of connection B intersects with (ideally orthogonally to) an imaginary line parallel to the length directions. Therefore, the end of the friction member can be driven rotationally or circularly (linearly) by displacement of the bending displacement members 1A and 1B. The two bending displacement members 1A and 1B are disposed in a manner folded at the corner, which is a joint between the two bending displacement members 1A and 1B (ideally at an angle of 90 degrees). Further, a part of the body tube 4 is disposed in an imaginary fan-like spatial domain that is formed by the two bending displacement members, and the bending displacement members 1A and 1B are disposed along wall surfaces of the housing 6. This makes it possible to achieve reductions both in size and height of the driving device. In this case, the bending displacement members 1A and 1B are not necessarily disposed perfectly along the wall surfaces of the housing 6, but the bending displacement members 1A and 1B may be disposed as appropriate according to an empty space in the module housing 6.

Embodiment 2

Another embodiment of the present invention is described below with reference to (a) and (b) of FIG. 3. (a) of FIG. 3 is a side view showing how a bending displacement member, an elastic member, and a friction member are positioned in relation to one another in the present driving device. (b) of FIG. 3 is a plan view showing the configuration of the present driving device. In (a) of FIG. 3, the point of connection A (marked with X in (a) of FIG. 3) is a point at which a bending displacement member 21A and an elastic member 2 are joined together, and the point connection B (marked with X in (a) of FIG. 3) is a point at which a bending displacement member 21B and the elastic member 2 are joined together. Further, the imaginary line L1 is a line that passes through the respective centers of the bending displacement members 21A and 21B in parallel with the length directions. This imaginary line L1 also passes through a friction member 3.

The principle according to which the present driving device is driven is the same the principle described above in Embodiment 1, and as such, is not described below.

As shown in (a) of FIG. 3, the points of connection A and B are disposed in the same manner as in Embodiment 1. In other words, the points of connection A and B are disposed so that the imaginary line L1 intersects with an imaginary line AB connecting these two points. Further, as shown in (a) of FIG. 3, the point of connection A is disposed above the imaginary line L1. Meanwhile, the point of connection B is disposed below the imaginary line L1.

The present driving device is different from that according to Embodiment 1 in that the elastic member 2 and the friction member 3 are not disposed in a corner of a camera module housing 26. The bending displacement members 21A and 21B are disposed by using only one surface of side-wall surfaces of the camera module housing 26. In other words, both the bending displacement members 21A and 21B are configured to also serve as only one side wall 26*d* among side walls 26*a* to 26*d* of the camera module housing 26. The elastic member 2, the friction member 3, and the guide bar 5 are disposed in a central part of the side wall 26*d*.

This configuration makes it possible to effectively utilize a space in the camera module housing 26 for disposing a driving mechanism, thus enabling a reduction in size of the driving device.

In the present driving device, each of the bending displacement members 21A and 21B is half as long as the side wall 26*d*. Therefore, in comparison with the driving device of Embodiment 1, the present driving device applies smaller driving force to a body tube 4. However, the body tube 4 can be sufficiently driven by reducing the mass of a lens (optical member) and the body tube 4. Further, in comparison with the driving device of Embodiment 1, the present driving device is advantageous in that it can be made lower in height than the conventional driving device.

Embodiment 3

Still another embodiment of the present invention is described with reference to FIG. 4. FIG. 4 is a side view showing how a bending displacement member, an elastic member, and a friction member are positioned in relation to one another in the present driving device. In FIG. 4, the point of connection A (marked with X in FIG. 4) is a point at which a bending displacement member 31A and an elastic member 2 are joined together, and the point of connection B (marked with X in FIG. 4) is a point at which a bending displacement member 31B and the elastic member 2 are joined together. Further, the imaginary line 2 is a line that passes through a friction member 3 in parallel with the length directions.

As shown in FIG. 4, the points of connection A and B are disposed so that the imaginary line L2 intersects with an imaginary line AB connecting these two points. Further, as shown in FIG. 4, the point of connection A is disposed above the imaginary line L2. Meanwhile, the point of connection B is disposed below the imaginary line L2.

The bending displacement members 31A and 31B are disposed off from the imaginary line L2 (offset disposition). In other words, assuming that (i) a line that passes through the center of the bending displacement member 31A in parallel with the length directions is an imaginary line L1A and (ii) a line that passes through the center of the bending displacement member 31B in parallel with the length directions is an imaginary line L1B, the imaginary line L1A, the imaginary line L1B, and the imaginary line L2 are disposed so as not to overlap with one another.

This configuration also makes it possible to effectively utilize a space in a camera module housing for disposing a driving mechanism, thus enabling a reduction in size of the driving device.

The present driving device may be configured such that the bending displacement members 31A and 31B are disposed by using only one surface of side-wall surfaces of the camera module housing. Further, the present driving device may be configured such that the bending displacement members 31A and 31B are disposed on two side walls of the camera module housing such that the elastic member 2 and the friction member 3 are disposed in a corner of the camera module housing.

Embodiment 4

Figure 5:
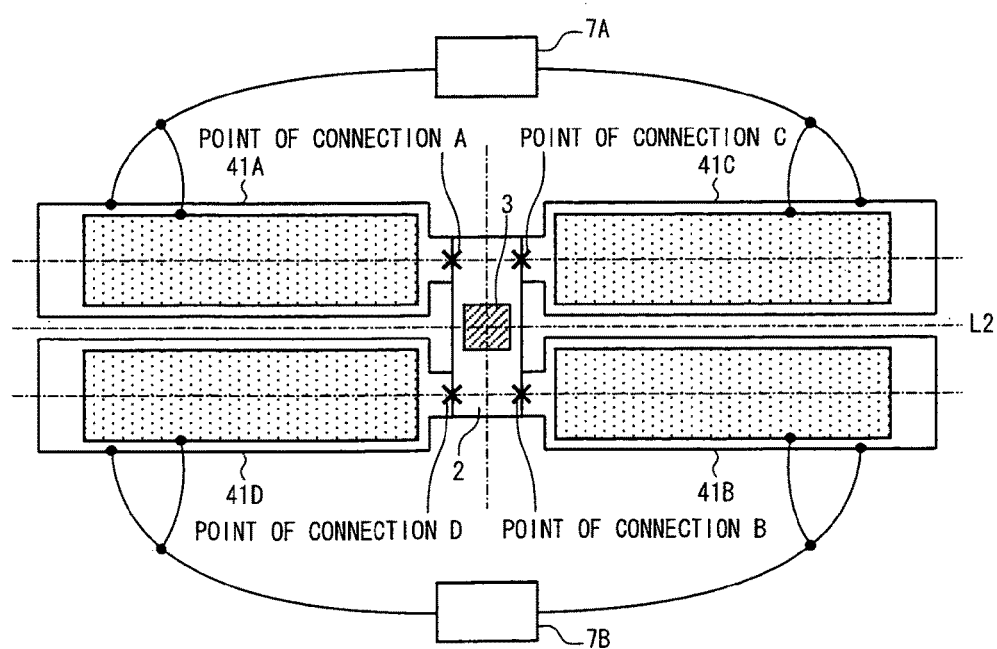
FIG. 5

Still another embodiment of the present invention is described below with reference to FIG. 5. FIG. 5 is a side view showing how a bending displacement member, an elastic member, and a friction member are positioned in relation to one another in the present driving device. In FIG. 5, the imaginary line L2 is a line passing through a friction member 3 in parallel with the length directions.

As shown in FIG. 5, the present driving device has a four-plate configuration including four bending displacement members 41A to 41D. The bending displacement members 41A to 41D are positioned in a symmetric manner with respect to the friction member 3 (point symmetry or line symmetry). The bending displacement members 41A and 41C are disposed above the imaginary line L2, and the bending displacement members 41B and 41D are disposed below the imaginary line L2.

In the figure, the point of connection A (marked with X in the figure) is a point at which the bending displacement member 41A and the elastic member 2 are joined together; the point of connection B (marked with X in the figure) is a point at which the bending displacement member 41B and the elastic member 2 are joined together; the point of connection C (marked with X in the figure) is a point at which the bending displacement member 41C and the elastic member 2 are joined together; and the point of connection D (marked with X in the figure) is a point at which the bending displacement member 41D and the elastic member 2 are joined together. As shown in FIG. 5, the points of connection A and B are disposed in such a manner that the imaginary line L2 intersects with an imaginary line AB connecting these two points. Similarly, the points of connection C and D are disposed in such a manner that the imaginary line L2 intersects with an imaginary line CD connecting these two points.

In other words, the points of connection A to D are disposed in such a manner that, assuming that a line perpendicular to the imaginary line L2 is drawn, two points of connection disposed with the imaginary line L2 sandwiched therebetween are positioned on the perpendicular line. In FIG. 5, the points of connection A and D are disposed with the imaginary line L2 sandwiched therebetween, and these two points of connection A and D are positioned on a line perpendicular to the imaginary line L2. Meanwhile, the points of connection B and C are disposed with the imaginary line L2 sandwiched therebetween, and these two points of connection B and C are positioned on a line perpendicular to the imaginary line L2.

The arrangement of the points of connection A and D and the arrangement of the points of connection B and C are not limited to the arrangement in which two points of connection are positioned on a perpendicular line with respect to the imaginary line L2, provided that the two points of connection are positioned on a straight line that intersects with the imaginary line L2. That is, a figure formed by connecting the points A through D of connection may be trapezoidal or rhomboidal.

In the present driving device, the bending displacement members 41A and 41C are connected to a driving circuit 7A so that they are driven by the driving circuit 7A in the same phase. Meanwhile, the bending displacement members 41B and 41D are connected to a driving circuit 7B so that they are driven by the driving circuit 7B in the same phase.

This configuration also makes it possible to effectively utilize a space in a camera module housing for disposing a driving mechanism, thus enabling a reduction in size of the driving device.

The present driving device may be configured such that the bending displacement members 41A to 41D are disposing by using only one surface of side-wall surfaces of a camera module housing. Alternatively, the bending displacement members 41A to 41D may be disposed on two side walls of the camera module housing such that the elastic member 2 and the friction member 3 are disposed in a corner.

In comparison with Embodiment 1, the present driving device increases in the number of bending displacement members and becomes complex in structure. However, the present driving device has an advantageous effect of making it possible to restrain displacement in an unnecessary direction in changing the bending displacement of the bending displacement members into the displacement of the body tube in the driving directions. The present driving device of FIG. 5 has a four-plate configuration including four bending displacement members. However, the present driving device is not limited to the four-plate configuration, provided that, assuming that a line perpendicular to the imaginary line L2 is drawn, two points of connection disposed with the imaginary line L2 sandwiched therebetween are positioned on the perpendicular line. For example, the present driving device may have a two-plate configuration in which the bending displacement members 41B and 41C of FIG. 5 are omitted and the bending displacement members 41A and 41D are joined to one side of the elastic member 2.

In the two-plate configuration, an imaginary line connecting the points of connection of the bending displacement members 41A and 41D is orthogonal to the imaginary line L2, but is not limited to this configuration, provided that it intersects with the imaginary line L2.

Embodiment 5

Figure 6:
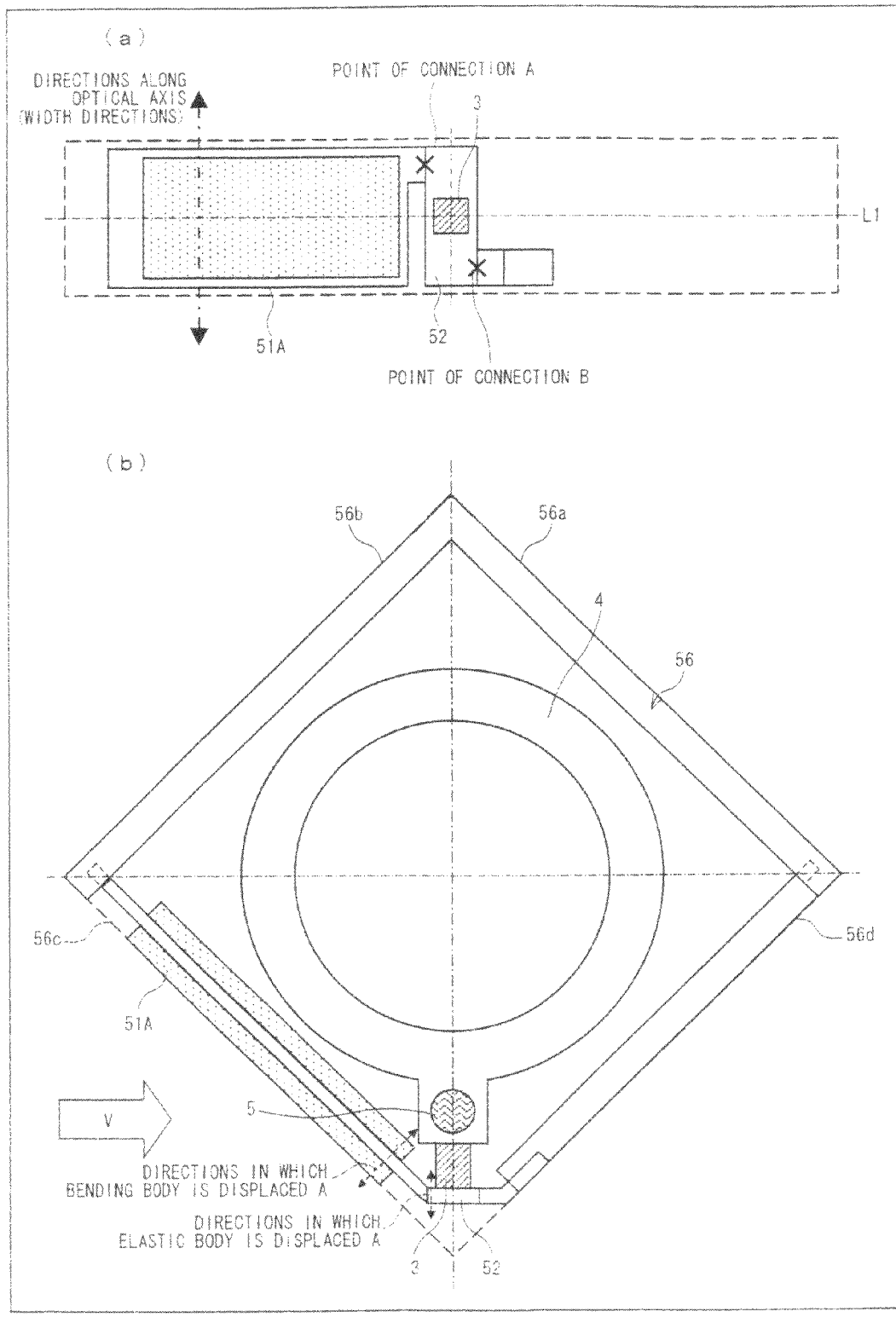
FIG. 6

Still another embodiment of the present invention is described below with reference to (a) and (b) of FIG. 6. (a) of FIG. 6 is a side view showing how a bending displacement member, an elastic member, and a friction member are positioned in relation to one another in the present driving device. Further, (b) of FIG. 6 is a plan view showing the configuration of the present driving device. In (a) of FIG. 6, the imaginary line L1 is a line passing through the center of a bending displacement member 51A in parallel with the length directions. The imaginary line L1 also passes through a friction member 3.

As shown in (a) of FIG. 6, the driving device of the present embodiment has a one-plate configuration including a single bending displacement member 51A. The bending displacement member 51A is provided as a part of one and only side wall 56c of a camera module housing 56. An elastic member 52 and the friction member 3 are disposed in a corner formed by the side wall 56c (the bending displacement member 51A) and a side wall 56d. That is, the bending displacement member 51A is joined to one side of the elastic member 52 and the friction member 3, and the side wall 56d is joined to the other side thereof.

In the figure, the point of connection A (marked with X in the figure) is a point at which the bending displacement member 51A and the elastic member 52 are joined together, and the point of connection B (marked with X in the figure) is a point at which the side wall 56c and the elastic member 52 are joined together. As shown in (a) of FIG. 6, the points of connection A and B are disposed so that the imaginary line L1 intersects with an imaginary line AB connecting these two points.

This configuration makes it possible to effectively utilize a space in the camera module housing 56 for disposing a driving mechanism, thus enabling a reduction in size of the driving device.

The following describes a principle of operation according to which a body tube 4 is driven in the directions along the optical axis. (a) and (b) of FIG. 17 are explanatory diagrams for explaining how an end of the friction member 3 of the present driving device is driven circularly.

As shown in (a) and (b) of FIG. 17, while a voltage is applied to the bending displacement member 51A, only the point of connection A is displaced. That is, the point of connection A is displaced from a state (i) to a state (v) shown in (a) and (b) in FIG. 17. Herein, the end (a portion that is friction-engaged with the body tube 4) of the friction member 3 is displaced in a circular manner around the vicinity of the point of connection B.

In the present driving device, a driving waveform of a voltage to be applied to the bending displacement member 51A may be a driving waveform that can cause the point of connection A to move back and forth in bending displacement directions A. That is, in the present driving device, a voltage having a driving waveform in which a positive voltage and a negative voltage are alternately applied may be applied to the bending displacement member 51A. For example, in the driving device as shown in (a) and (b) of FIG. 6, a voltage having a waveform A shown in FIG. 15 is applied to the bending displacement member 51A.

As such, in the present driving device, the end of the friction member 3 can make the circular motion as above (the driving principle 2). In the present driving device, since a driving source of a body tube 4 is only the bending displacement member 51A, a driving force applied to the body tube 4 of the present driving device becomes small as compared to that of the driving device of Embodiment 1. However, by reducing weights of a lens (optical member) and the body tube 4, it is possible to sufficiently drive the body tube 4. Further, the present driving device has an advantage that the number of members is reduced, thereby reducing costs and downsizing a driving device, in comparison with the driving device of Embodiment 1.

Embodiment 6

Still another embodiment of the present invention is described below with reference to (a) and (b) of FIG. 7. (a) of FIG. 7 is a side view showing how a bending displacement member, an elastic member, and a friction member are positioned in relation to one another in the present driving device. Further, (b) of FIG. 7 is a plan view showing the configuration of the present driving device.

In each of the driving devices of Embodiments 1 to 5, a bending displacement member is a bimorph piezoelectric element having a three-layer structure of two piezoelectric material layers pressure-bonded to each other with a shim sandwiched therebetween. In contrast, in the present driving device, a bending displacement member is a piezoelectric element having a two-layer structure of two piezoelectric material layers pressure-bonded to each other. That is, the bending displacement member of the present driving device is a so-called shim-less bimorph piezoelectric element constituted by two piezoelectric material layers without a shim.

As shown in (a) and (b) of FIG. 7, the present driving device has bending displacement members 81A and 81B joined to an elastic member (driving-direction changing member) 82. The elastic member 82 is provided on those surfaces of the bending displacement members 81A and 81B which face a body tube 4. Further joined to the elastic member 82 is a friction member 3 in frictional engagement with the body tube 4.

The bending displacement members 81A and 81B are shim-less bimorph piezoelectric elements constituted by two piezoelectric material layers without a shim. Further, each of the bending displacement members 81A and 81B is provided as a part of a side wall of a camera module housing 86 in such a manner that each of the bending displacement members 81A and 81B is fixedly bonded to or fitted in the camera module housing 86.

Each of the driving devices of Embodiments 1 to 5 is configured such that a bending displacement member is a bimorph piezoelectric element and has a shim fixed to a camera module housing. The shim functions as an electrode, and as such, is made of conducting material. On the other hand, the piezoelectric material layers are made of non-conducting material. The present driving device is configured such that the piezoelectric material layers of each of the bending displacement members 81A and 81B are fixed to the camera module housing 86 and a shim made of conducting material is excluded. As a result, the bending displacement members 81A and 81B are fixed to the camera module housing 86 in such a state that they are more isolated from the body tube 4 than those of the driving devices of Embodiments 1 to 5.

The following gives specific examples to describe an effect of the present driving device in which the bending displacement members 81A and 81B are shim-less bimorph piezoelectric elements. In the examples, the dimensions of each piezoelectric material layer in each bending displacement member is such that the free length along the length directions is 3 mm, the width 2 mm, and the thickness 0.125 mm. A body tube is driven at an application voltage (driving voltage) of 14 V that is applied to the bending displacement member.

First, in the case of driving of the body tube with use as bending displacement members of bimorph piezoelectric elements each constituted by piezoelectric material layers each with the above dimensions and a shim having a thickness of 0.2 mm (such an example being hereinafter referred to as "Example 1"), the amount of displacement of the end of the elastic member 3 was 0.368 μm. On the other hand, in the case of driving of the body tube with use as bending displacement members of shim-less bimorph piezoelectric elements each constituted simply by piezoelectric material layers each with the above dimensions (such an example being hereinafter referred to as "Example 2"), the amount of displacement amount of the end of the elastic member 3 was 0.4 μm.

As such, it is shown that the driving device of Example 2, i.e., the driving device including shim-less bimorph piezoelectric elements as bending displacement members exhibits an 8.7% increase in the amount of displacement of the end of the elastic member 3 in comparison with the driving device of Example 1.

The following further describes the effect of the present driving device with reference to a driving device (referred to as "Example 3") configured such that a part corresponding to the shim of each bending displacement member of the driving device of Example 1 is replaced with a piezoelectric material layer. The driving device of Example 3 has the same total thickness of each bending displacement member as the driving device of Example 1.

In the case of application of the same stress to each piezoelectric material layer of the driving device of Example 3 as that applied to each piezoelectric material layer of the driving device of Example 1, that the amount of displacement amount of the end of the elastic member 3 was 0.451 μm. This shows that in comparison with the driving device (Example 1), which includes bimorph piezoelectric elements as bending displacement members, the driving device (Example 3), which includes shim-less bimorph piezoelectric elements as bending displacement members, exhibited an 22.6% increase in the amount of displacement of the end of the friction member 3 even under such conditions that the driving device of Example 3 has the same total thickness of each bending displacement member as the driving device of Example 1.

As such, it is shown that the present driving device, whose bending displacement members are each constituted simply by piezoelectric material layers, can be larger in the amount of displacement of the end of the elastic member 3 than a driving device whose bending displacement members are each constituted by a shim and piezoelectric material layers.

Further, in comparison with the configuration in which each bending displacement member includes a shim and piezoelectric material layers, the present driving device increases in proportion of the piezoelectric material layers in the bending displacement member. For this reason, in the present driving device, the thickness of the piezoelectric material layers as the bending displacement member becomes thicker. In cases where the directions of polarization are set as the directions of lamination of two piezoelectric material layers, the ease with which the polarization is broken in response to application of a voltage depends on the thickness of the two piezoelectric material layers along the directions of lamination. Therefore, as the thickness of the two piezoelectric material layers along the directions of lamination is thinner, the polarization is more easily broken. In the present driving device, the thickness of the two piezoelectric material layers along the directions of lamination can be made thicker. This makes it possible to prevent depolarization (breaking of the polarization) of the piezoelectric material layers.

Further, the present driving device does not require a step of attaching a shim to a piezoelectric material layer in producing the device. This makes it possible to reduce the number of manufacturing steps and thereby achieve a reduction in cost.

In the configuration of (a) and (b) of FIG. 7, each of the bending displacement members 81A and 81B is constituted by two piezoelectric material layers. However, the piezoelectric material layers as the bending displacement member in the present driving device is not limited to the above configuration. The bending displacement members 81A and 81B are bent and displaced in such a manner that the two piezoelectric material layers expands and contracts in an alternate manner (that is, while one of the two piezoelectric material layers expands, the other one of the two piezoelectric material layers contracts). Accordingly, each of the two piezoelectric material layers may be constituted by a plurality of layers.

(Driving-Direction Changing Member and Bending Displacement Members in the Present Driving Device)

In each of the driving devices of Embodiments 1 to 6, the driving-direction changing member is configured such that the elastic member and the friction member are separate members. However, the driving-direction changing member of the present invention is not limited to the configuration. (a) through (c) of FIG. 8 are perspective views showing examples of how driving-direction changing members applicable to the present invention are configured.

Figure 8:
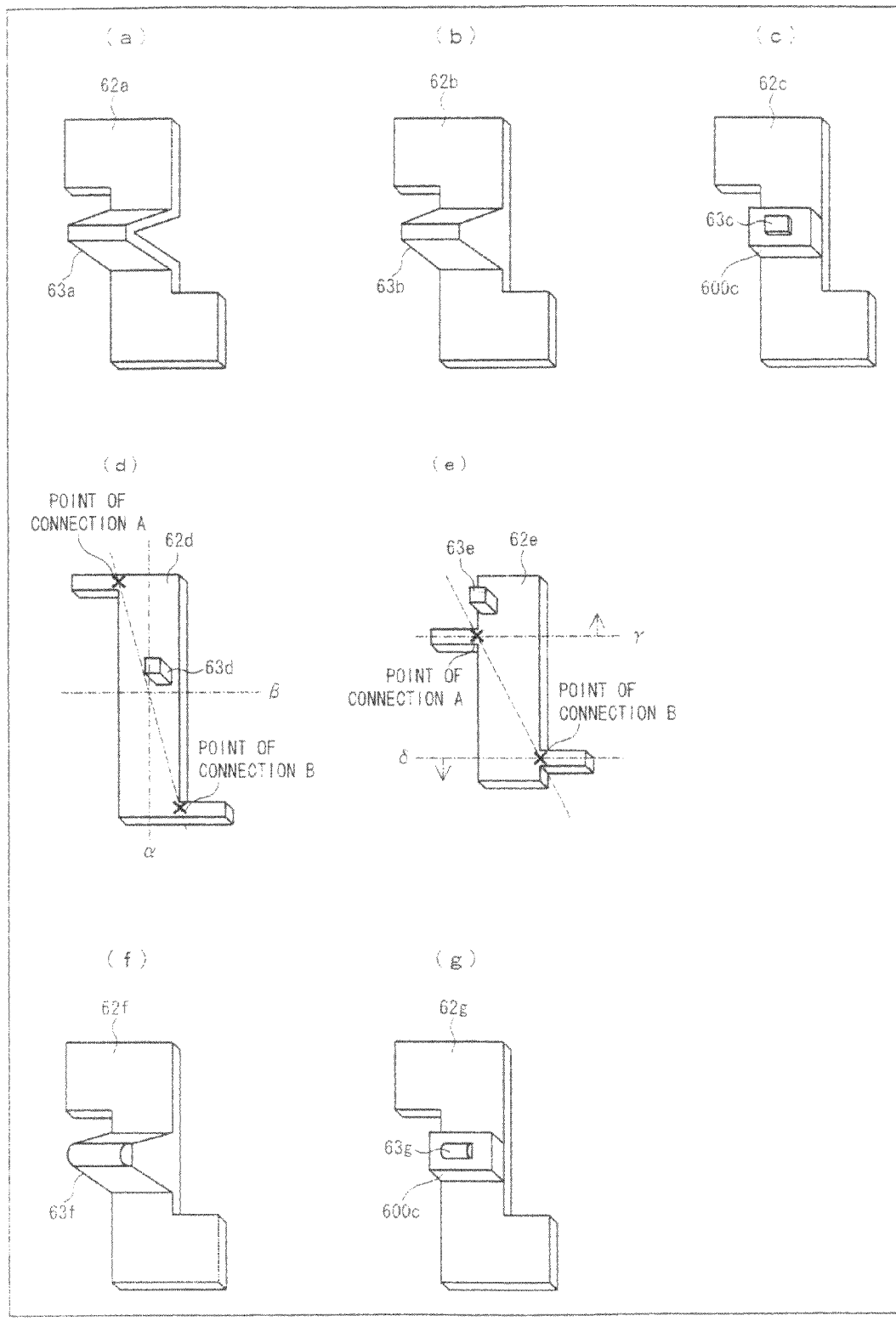
FIG. 8

As shown in (a) and (b) of FIG. 8, the driving-direction changing member may be configured such that the elastic member and the friction member are integrally formed. As shown in (a) of FIG. 8, a driving-direction changing member is configured such that an elastic section (elastic member) 62*a* and a friction section (friction member) 63*a* are integrally formed. In the driving-direction changing member of (a) of FIG. 8, the elastic section 62*a* and the friction section 63*a* are formed by bending a metal plate or similar plate material constituting the driving-direction changing member.

Further, as shown in (b) of FIG. 8, a driving-direction changing member may be configured such that an elastic section 62*b* and a friction section 63*b* are integrally formed in a three-dimensional shape. In this case, the driving-direction changing member can be formed by integral molding with use of a mold or by cutting.

Further, the driving-direction changing member of (b) of FIG. 8 is not particularly limited in material as long as the material can be processed by integral molding or cutting. Examples of the material encompass resin, ceramics, metal, and carbon. Moreover, the material of the driving-direction changing member of (b) of FIG. 8 is preferably selected from materials in which a change in coefficient of friction due to a change in temperature, a change in humidity, a change over time, abrasion, or the like is small. Examples of such material of the driving-direction changing member of (b) of FIG. 8 encompass: material obtained by irradiating polymeric material with an electron beam; and carbon material obtained by compounding graphite with glassy carbon, which is light and excellent in heat conductivity and abrasion resistance.

Further, the driving device of the present invention may be configured such that such material of the driving-direction changing member is attached to that part of the body tube 4 which makes contact with the friction section 63*b*.

Moreover, the driving-direction changing member may be configured as shown in (c) of FIG. 8. That is, as shown in (c) of FIG. 8, a driving-direction changing member has an elastic member 62*c* and a friction member 63*c* joined together. The elastic member 62*c* includes a protrusion 600*c* that protrudes toward the body tube. The friction member 63*c* is attached to that end of the protrusion 600*c* which faces the body tube. The elastic member 62*c* including the protrusion 600*c* can be formed by integral molding with use of a mold or by cutting. The driving-direction changing member of (c) of FIG. 8 can be formed by attaching the friction member 63*c* to the protrusion 600*c* thus formed.

Moreover, the friction member 63*c* is made, for example, of carbon material. The configuration of (c) of FIG. 8 is comparatively low in degree of freedom of material selection. However, it is advantageous in that it is possible to easily select material in which a change in coefficient of friction due to a change in temperature or humidity is small.

Further, in each of the driving devices of Embodiments 1 to 5, a driving-direction changing member is configured such that a friction member as a contact part that makes contact with a driven body is disposed on an imaginary line connecting first and second joints. However, the configuration of the driving-direction changing member in the driving device of the present invention is not limited to the above configuration.

For example, as shown in (e) and (e) of FIG. 8, friction members 63*d* and 63*e* may be disposed so as to deviate from an imaginary line AB connecting points of connection A and B. As shown in (e) of FIG. 8, the friction member 63*d* may not be disposed on a line α that divides an elastic member 62*d* in half in driving directions (directions along an optical axis), and further may not be disposed on a line β that divides the elastic member 62*d* in half in directions perpendicular to the driving directions.

Furthermore, as shown in (e) of FIG. 8, the friction member 63*e* may be disposed outside of the points of connection A and B. In the (e) of FIG. 8, assume that, in an elastic member 62 as a plane including the points of connection A and B, a line γ denotes a straight line passing through the point of connection A perpendicularly to the driving directions and a line 6 denotes a straight line passing through the point of connection B perpendicularly to the driving directions. As shown in (e) of FIG. 8, the friction member 63*e* is disposed outside of a region sandwiched between the lines γ and δ.

Even in the configurations of (d) of FIG. 8 and (e) of FIG. 8, it is possible that an end of each of the friction members 63*d* and 63*e* makes an elliptical motion or a circular motion.

Furthermore, as shown in (f) and (g) of FIG. 8, the shape of the friction member as the contact part may be semi-cylindrical. As shown in (f) of FIG. 8, a driving-direction changing member is configured such that an elastic section 62*f* and a friction section 6*f* are integrally formed, and that part of the friction section 63*f* which makes contact with a body tube has a semi-cylindrical shape. Moreover, as shown in (g) of FIG. 8, a driving-direction changing member has an elastic member 62*g* and a friction member 63*g* joined together. The elastic member 62*g* includes a protrusion 600*c* that protrudes toward the body tube. The friction member 63*g* is attached to that end of the protrusion 600*c* which faces the body tube. That part of the friction member 63*g* which makes contact with the body tube has a semi-cylindrical shape. The configurations of (f) and (g) of FIG. 8 bring about such an advantageous effect that there is unlikely to be a change in friction property even in cases where the contact part of the driving-direction changing member makes contact with the body tube in an oblique manner.

The shape of the contact part of the driving-direction changing member is not limited to the semi-cylindrical shape. Even in cases where the shape of the contact part is, for example, hemispherical or cone-shaped and the contact part of the driving-direction changing member makes contact with the body tube in an oblique manner, such an effect is brought about that there is unlikely to be a change in friction property. As such, the contact part does not deviate from the scope of the present invention no matter what shape it takes.

Figure 18:
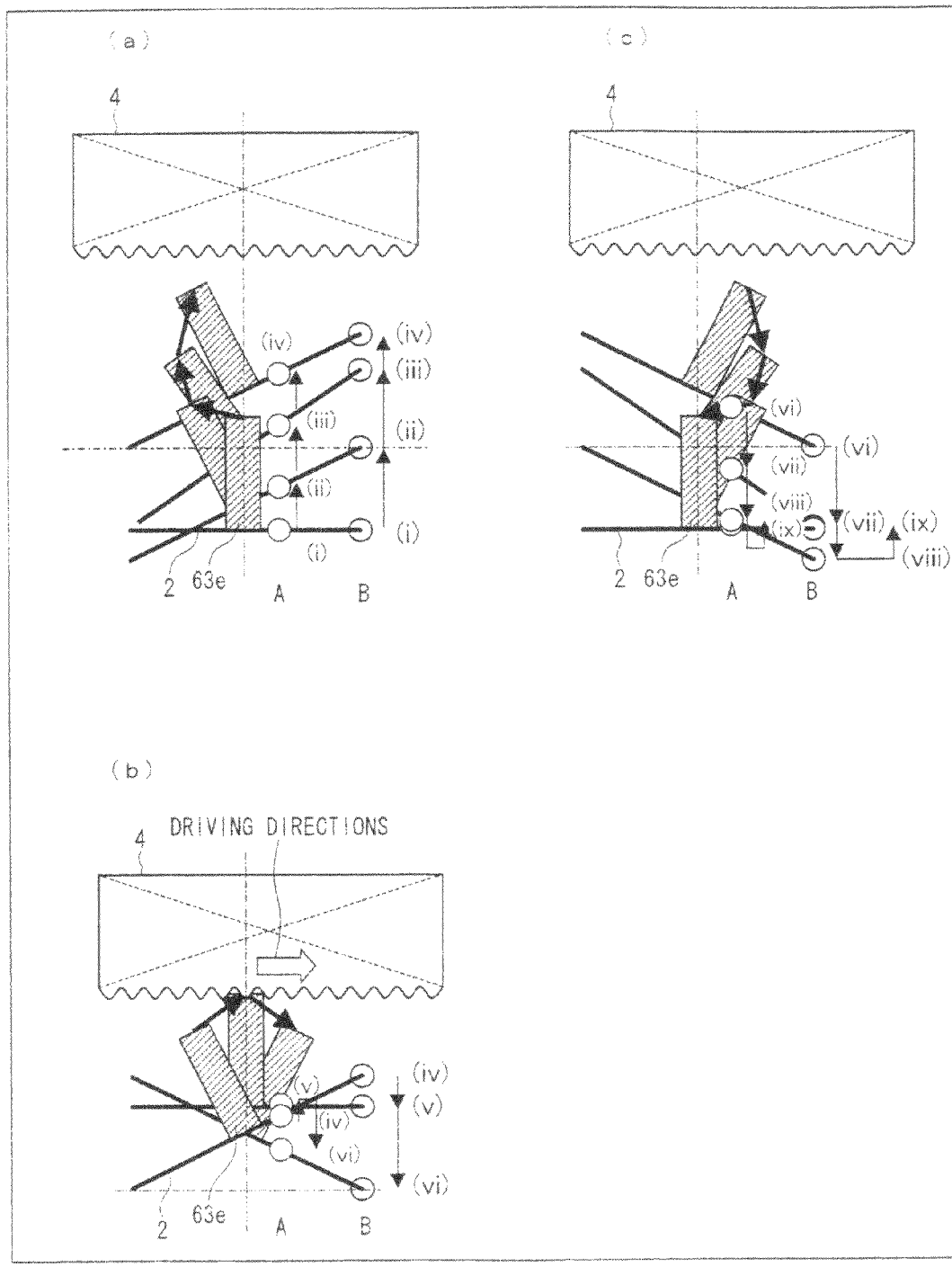
FIG. 18

(a) through (c) of FIG. 18 are explanatory diagrams for explaining examples of trajectories of an end of the friction member 63*e* disposed as shown in (e) of FIG. 8. As shown in (a) through (c) of FIG. 18, each of the points of connection A and B is displaced from the state (i) to the state (ix), whereby the end of the friction member 63*e* makes an elliptical motion.

Figure 19:
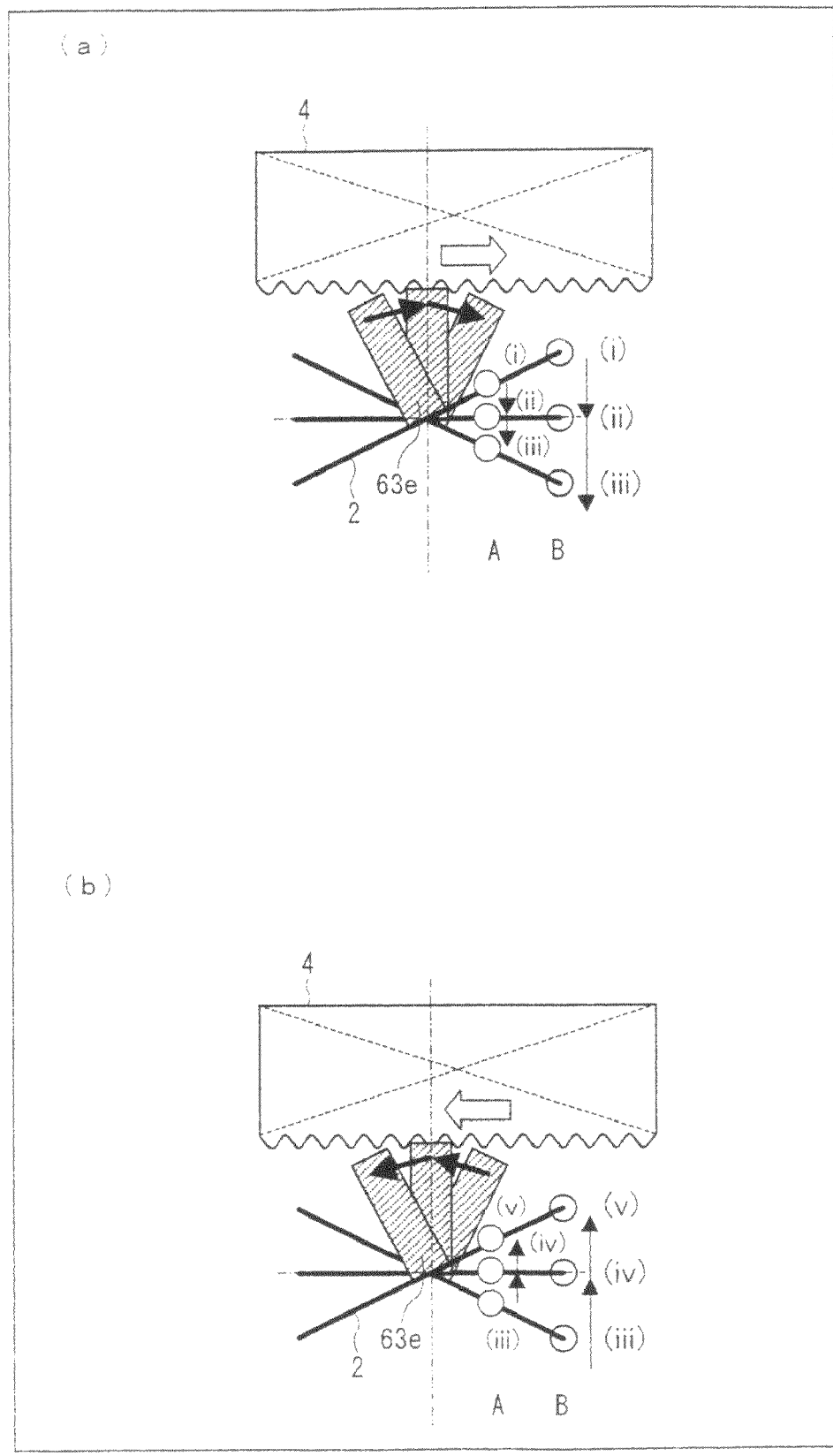
FIG. 19

(a) and (b) of FIG. 19 are explanatory diagrams for explaining examples of trajectories of an end of the friction member 63*e* disposed as shown in (e) of FIG. 8. As shown in (a) and (b) of FIG. 19, each of the points of connection A and B is displaced from the state (i) to the state (ix), whereby the end of the friction member 63*e* makes an elliptical motion.

That is, no matter how the points of connection A and B and the friction member as the contact part are positioned in relation to one another, it is possible to control the trajectory of the end of the friction member in an elliptical or circular shape by causing the points of connection A and B to be displaced in association with each other (that is, in accordance with the waveforms of driving voltages that are applied to the bending displacement members 1A and 1B).

Preferably, assuming that a second straight line is a straight line passing through a given point on an imaginary line connecting first and second joints and perpendicular to a plane including the first and second joints, the friction member as the contact part is disposed to pass through the second straight line. Since the friction member as the contact part is disposed on the imaginary line connecting the first and second joints, it becomes possible that the displacement of the imaginary line according to the displacement of the first and second joints is more efficiently changed into the displacement of the contact part with the driven body. This allows the contact part with the driven body to be displaced by causing the first and second bending displacement members to be bent and displaced in a comparatively small manner. Further, a most preferred embodiment of the disposition of the friction member is such that the friction member as the contact part is disposed on the center of the imaginary line connecting the first and second joints.

Each of the driving devices of Embodiments 1 to 6 is configured such that the elastic member and the bending members are separate members. However, the driving-direction changing member of the present invention is not limited to the configuration. FIG. 9 shows an example of how bending members and an elastic member that are applicable to the present invention are configured.

The two bending displacement members of FIG. 9 are bimorph piezoelectric elements each having a three-layer structure of two piezoelectric material layers 71 pressure-bonded to each other with a shim 72 sandwiched therebetween. The two bending displacement members share the shim 72 with each other. The shim 72 thus shared in common joins the two bending displacement members to each other. A joining portion, in the shim 72, that joins the two bending displacement members to each other includes an elastic section as an elastic member and a friction section as a friction member, which are integrally formed in the joining portion. That is, the elastic member and the friction member are integrally formed as a part of the shim 72 in the bending displacement members.

The two bending displacement members of FIG. 9 can be formed by forming a pair of bending displacement members by pressure-bonding two piezoelectric material layers 71 to each other so that one and only shim 72 is sandwiched therebetween. Then, a joining portion, in the shim 72, that joins the two bending displacement members is processed by bending, whereby an elastic section and a friction section are integrally formed.

Figure 10:
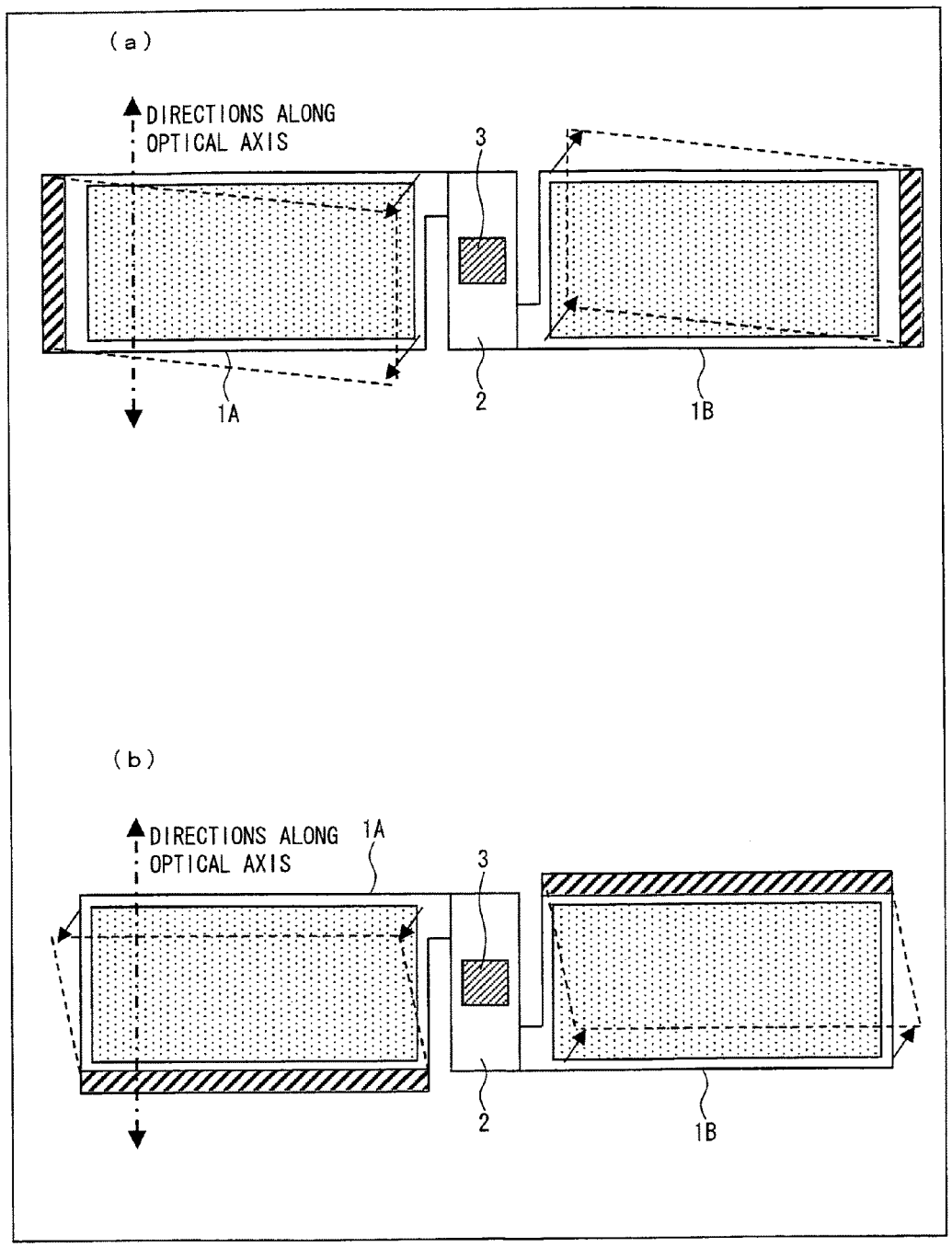
FIG. 10

Further, as for fixation of a bending displacement member, each of the driving devices of Embodiments 1 to 5 is configured such that the bending displacement member has a length-direction end fixed. However, the fixation of a bending displacement member in the present invention is not limited to the configuration in which one end along the length directions is fixed. (a) of FIG. 10 is an explanatory diagram for explaining an idea of how a bending displacement member in a driving device of any one of Embodiments 1 to 5 should be fixed, and (b) of FIG. 10 is an explanatory diagram for explaining an example of how a bending displacement member applicable to the present invention is fixed. As the idea of how a bending displacement member should be fixed, (a) and (b) of FIG. 10 shows fixed portions as shaded area.

As shown in (a) of FIG. 10, the driving device of any one of Embodiments 1 to 5 is configured such that each of the bending displacement members 1A and 1B has a length-direction end (i.e., an end opposite an end joined to an elastic member 2 and a friction member 3) fixed. The bending displacement members 1A and 1B of (a) of FIG. 10 are bent with the shaded areas as supporting points, respectively, in bending displacement directions A and B each indicated by arrows. As a result, the bending displacement members 1A and 1B are displaced to positions each surrounded by a dotted line.

As an example of fixation of a bending displacement member, as shown in (b) of FIG. 10, for example, each of the bending displacement members 1A and 1B may be configured to have a width-direction end (facing in a direction along the optical axis) fixed. The bending displacement members 1A and 1B of (a) of FIG. 10 are bent with the shaded areas as supporting points, respectively, in bending displacement directions A and B each indicated by arrows. As a result, the bending displacement members 1A and 1B are displaced to positions each surrounded by a dotted line.

In the configuration of (b) of FIG. 10, the shaded areas as the portions at which the bending displacement members 1A and 1B are fixed are perpendicular to the shaded areas shown in (a) of FIG. 10. Such bending displacement of the bending displacement members 1A and 1B by fixation can be achieved by reversing the horizontal and vertical dimensions of each of the bending displacement members 1A and 1B of (a) of FIG. 10 and rotating the fixed portions (shaded areas) 90 degrees.

(Imaging Device of the Present Invention)

A driving device of the present invention is expected to be applied to an imaging device equipped with a focus adjustment mechanism or zoom mechanism such as a camera module (required to drive a group of lenses). In particular, the driving device of the present invention is useful in application to a compact camera module for use in a mobile phone or the like.

Generally, a compact camera module is configured such that members included in all mechanisms (a driving mechanism of a body tube and an imaging mechanism) of an imaging device are housed in a prismatic or columnar camera module housing. As described above, the driving device of the present invention makes it possible to efficiently use a space in the camera module housing for disposing the driving mechanism, thus enabling a reduction in size of the driving device. Therefore, by setting the dimensions of the driving device not to exceed the dimensions determined by members other than the driving device in an imaging device, it is possible to exhibit maximum effects of achieving reductions both in height and size of the imaging device.

Figure 11:
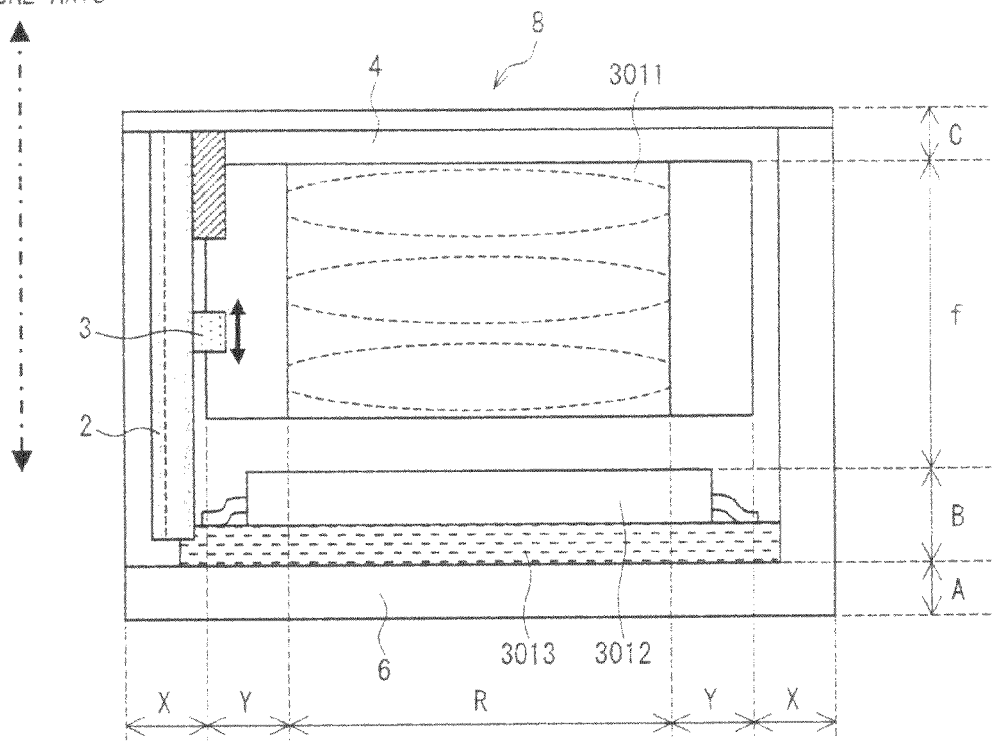
FIG. 11

The dimensions of an imaging device and a driving device according to the present invention are described with reference to FIG. 11. FIG. 11 is a cross-sectional view showing the configuration of an imaging device whose camera module housing houses the driving device of (a) and (b) of FIG. 1. FIG. 11 is a cross-sectional view taken along a diagonal line sandwiched between side walls 6c and 6d (bending displacement members 1A and 1B) of the cuboidal camera module housing 6 of (a) of FIG. 1. For this reason, the bending displacement members 1A and 1B are not shown in FIG. 11. Further, for avoidance of complication, FIG. 11 omits the guide bar 5.

As shown in FIG. 11, an imaging device of the present invention (hereinafter referred to as "present imaging device") includes the present driving device, an objective lens 3011, an imaging element 3012, and a circuit substrate 3013. The objective lens 3011, the imaging element 3012, and the circuit substrate 3013 are members essential to the imaging device.

The imaging device of FIG. 11 includes a so-called focus adjustment mechanism. Specifically, the objective lens 3011 is fixed to a body tube (driven body) 4, and is driven in directions along an optical axis as the body tube 4 is driven by the driving device. When the objective lens 3011 is driven in the directions along the optical axis, a focus adjustment is performed, whereby an image of a desired subject is formed on a photoelectric transducer of the imaging element 3012.

Here, the dimensions of members other than the driving device along the optical axis in the present imaging device are discussed. In FIG. 11, the dimension A is the thickness of the bottom part of the camera module housing along the optical axis, and the dimension B is the total thickness of the imaging element 3012 and the circuit substrate 3013 along the optical axis. Further, f denotes the focal length of the objective lens 3011, and the dimension C is the total of the thickness of an upper part (lid) of the camera module housing 6 along the optical axis and an allowable clearance for an error in assembly. The focal length f is defined as a distance from an end of the objective lens 3011 to a surface of a transparent cover of the imaging element 3012 with the objective lens 3011 moved to a position where an image of a subject at infinity is formed on the photoelectric transducer of the imaging element 3012.

The dimensions of the camera module along the optical axis are determined by the total of the dimension A, the dimension B, the focal length f, and the dimension C.

When the dimension A, the dimension B, the focal length f, and the dimension C are assigned practical values that allows easy manufacturing and takes strength and the like into consideration, the dimension A is approximately 0.5 [mm], the dimension B is approximately 1.0 to 2.0 [mm], and the dimension C equals A (i.e., approximately 0.5 [mm]). The focal length f is selectively designed as usage of the imaging device. A camera module capable of a wide-angle shot and as thin as possible requires a focal length f of approximately 2.0 [mm] (in the case of use of a compact imaging element 3012 whose dimension is not more than 4 [mm] diagonally to the imaging plane).

Therefore, assuming that the dimension B is 2.0 [mm], for example, the dimensions (Dimension A+Dimension B+Dimension C+Focal Length f) of the camera module housing 6 along the optical axis is 5 [mm].

At this time, the value obtained by standardizing the dimension (A+B+C+f) of the camera module housing along the optical axis by f is approximately $(A+B+C+f)/f=2.5$.

Therefore, in cases where the dimensions are set as above, the dimension of each of the bending displacement members 1A and 1B as driving sources along the optical axis only need to be not more than 2.5 times the focal length f. In this case, the dimension of the imaging device along the optical axis is determined by the dimensions of the members other than the driving device. This is most effective in achieving a reduction in height of the imaging device.

When the focal length is approximately 2.5 [mm] and the dimension B is approximately 1.0 [mm], the dimension of each of the bending displacement members 1A and 1B as driving sources along the optical axis is about 1.8 times the focal length f.

Next, the dimensions of the members other than the driving member in a direction (traverse direction) perpendicular to the optical axis are discussed. In FIG. 11, the dimension X is the total of the thickness of a side wall of the camera module housing and an allowable clearance for an error in assembly, the dimension Y is the thickness of a side wall of the body tube 4, and the diameter R is the diameter of the objective lens 3011.

The dimension of the camera module housing in the traverse direction is determined by the total of a value twice the total of the dimensions X and Y and the diameter R $(2\times(X+Y)+R)$.

When the dimensions X and Y and the diameter R are assigned practical values that allows easy manufacturing and takes strength and the like into consideration, the dimension X is approximately 0.8 [mm] and the dimension Y is approximately 1.0 [mm]. The diameter R is selectively designed as usage of the imaging device. Appropriate brightness requires a diameter R of 1.8 [mm] (in which case the effective diameter is approximately 0.8 [mm]).

Therefore, the dimension $(2\times(X+Y)+R)$ of the camera module housing 6 in the traverse direction is 5.4 [mm].

At this time, the value obtained by standardizing the dimension $(2\times(X+Y)+R)$ of the camera module housing 6 in the traverse direction by R is $(2\times(X+Y)+R)/f=3$.

Therefore, in cases where the dimensions are set as above, the dimension of each of the bending displacement members 1A and 1B as driving sources in the traverse direction only needs to be not more than three times the diameter R. In this case, the dimension of the imaging device in the traverse direction is determined by the dimensions of the members other than the driving device. This is most effective in achieving a reduction in height of the imaging device.

When the dimension Y is approximately 0.3 to 0.8 [mm] and the diameter R is therefore approximately 3.2 [mm], the dimension of each of the bending displacement members 1A and 1B as driving sources in the traverse direction is approximately 1.6 times the diameter R.

Although not particularly mentioned in the above description, the amplitude of voltages that outputted by the driving circuits 7A and 7B is set at approximately 1 [V] to 100[V] by parameters such as the weight of the driven body, a load to be applied to the driven body, the required speed of the driven body, and the material of the contact part. Similarly, the drive frequency is designed within a wide range of 50 [Hz] to 500 [kHz]. Further, similarly, the displacement of the contact part is designed within a wide range of 10 [nm] to 1 [mm], but does not deviate from the scope of the present invention no matter what value it takes on.

Further, an imaging apparatus of the present invention is any apparatus that includes the aforementioned imaging device. Examples of the imaging apparatus of the present invention are imaging apparatuses such as mobile phones, digital cameras, video cameras.

The foregoing has described an elastic member and a friction member as separate members; however, the scope of the present invention encompasses a case where these members are integrally formed.

Further, the forgoing has described an elastic member and a bending displacement member as separate members; however, the scope of the present invention encompasses a case where the elastic member and the bending displacement member are integrally formed, for example, in such a manner that the elastic member is provided as a prolongation of a shim provided as an intermediate layer of the bending displacement member.

The shape of an optical device housing is not limited to a cuboidal shape. Even in the case of a cylindrical shape or an elliptically cylindrical shape, it is possible to apply the present invention.

The driving device of the present invention can be expressed as follows.

That is, the driving device of the present invention can be expressed as including: a first bending displacement member which is excited by electrical control to be bent and displaced; a second bending displacement member which is excited by electrical control to be bent and displaced; an elastic member joined to a part of the first bending displacement member at a first joint and joined to a part of the second bending displacement member at a second joint; and a friction member, partially joined to the elastic member, which partially makes contact with a driven body.

Moreover, in the foregoing configuration, the driving device of the present invention can expresses as being configured such that an imaginary line connecting the first and second joints and an imaginary line parallel to length directions of the first bending displacement member or an imaginary line parallel to length directions of the second bending displacement member intersect with each other.

Furthermore, in the foregoing configuration, the driving device of the present invention can be expressed as being configured such that, assuming that the first bending displacement member is virtually divided into first and second regions by that imaginary line parallel to the length directions of the first bending displacement member which passes through a center of the first bending displacement member, and that the second bending displacement member is virtually divided into third and fourth regions by that imaginary line parallel to the length directions of the second bending displacement member which passes through a center of the second bending displacement member, a center of the first joint is positioned in either the first or second region and a center of the second joint is positioned in either the third or fourth region.

Further, in the foregoing configuration, the driving device of the present invention can be expressed as being configured such that: an imaginary line parallel to the length directions of the first bending displacement member and an imaginary line parallel to the length directions of the second bending displacement member intersect with each other; and an imaginary line parallel to width directions of the first displacement member an imaginary line parallel to width directions of the second bending displacement member intersects with each other.

Further, in the foregoing configuration, the driving device of the present invention can be expressed as being configured such that: the imaginary line parallel to the length direction of the first bending displacement member and the imaginary line parallel to the length directions of the second bending displacement member are orthogonal to each other; and the imaginary line parallel to the width directions of the first bending displacement member and the imaginary line parallel to the width directions of the second bending displacement member are orthogonal to each other.

Further, in the foregoing configuration, the driving device of the present invention can be expressed as being configured such that a part of the driven body is disposed in a imaginary fan-like space that is formed by the first and second bending displacement members.

Embodiment 7

The driving device of Embodiment 5 is configured such that the bending displacement member 51A is fixed by being pressed toward the body tube 4 (toward the driven body) by a predetermined amount. Alternatively, the driving device of Embodiment 5 is configured such that the guide bar is fixed in such a way as to press the body tube 4 toward the friction member 3. However, such a configuration is extremely small in amount of displacement for pressing, and as such, leaves behind difficulty in setting a preload.

Therefore, it is desirable that such a driving mechanism as described above be a preload mechanism easy and stable in setting a preload.

(Configuration of a Driving Device of the Present Embodiment)

Figure 20:
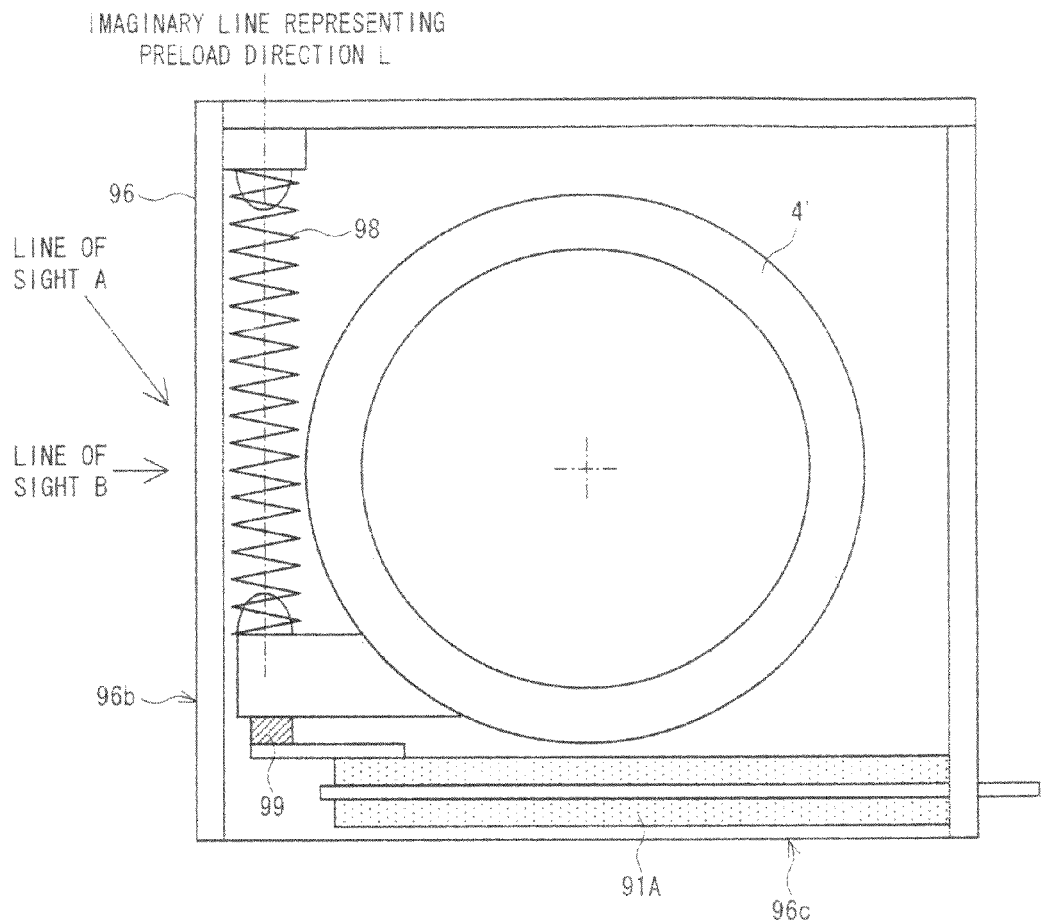
FIG. 20
Figure 21:
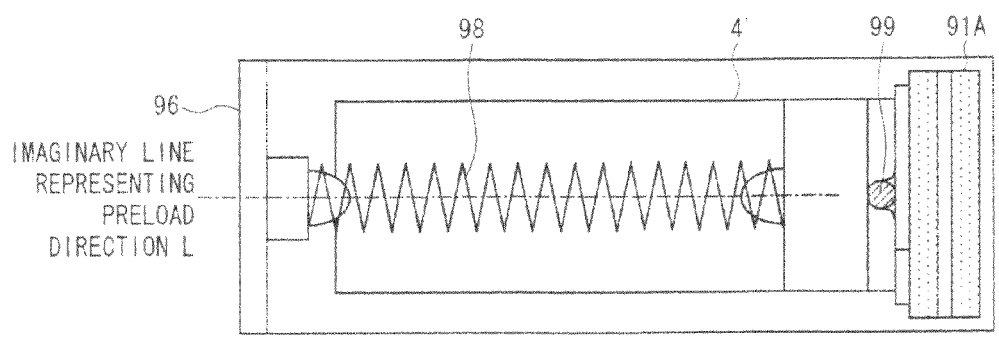
FIG. 21

The following describes a driving device of the present embodiment (such a driving device being referred to as "present driving device"). FIG. 20 is a top view schematically showing the configuration of the present driving device. The driving device of FIG. 20 is an optimum embodiment applied as a focus adjustment mechanism in a compact camera module. FIG. 21 is a side view schematically showing the configuration of the driving device as seen from the line of sight B of FIG. 20. It should be noted that FIG. 21 omits the camera module housing.

As shown in FIGS. 20 and 21, the present driving device includes: a body tune 4' serving as a driven body; a bending displacement member (referred to also as "vibration member") 91A; a camera module housing 96; a preload spring (preload elastic member) 98; and a driving-direction changing member (driving member) 99. In the present driving device, the body tube 4' is driven by a driving mechanism including the driving-direction changing member 99 and the bending displacement member 91A.

The preload spring 98 is a member for biasing the body tube 4' toward the driving-direction changing member 99. In the present driving device of FIGS. 20 and 21, the preload spring 98 is a helical spring. The preload spring 98 has an end fixed to the camera module housing 96 and the other end fixed to the body tube 4'. This causes the body tube 4' to be pressed against the driving-direction changing member 99 while being driven. In FIG. 20, the preload direction is the direction in which the preload spring 98 biases the body tube 4' toward the driving-direction changing member 99, and the preload-direction imaginary line L is a straight line extending along the preload direction.

The body tube 4' is a lens barrel 4 having a function of holding a lens. The body tube 4' has a circular section in the center thereof, and a lens is fitted in the circular section. Moreover, the body tube 4' is driven by the driving mechanism, which includes the driving-direction changing member 99 and the bending displacement member 91A, along the optical axis to perform an autofocusing operation. In the present embodiment, the directions in which the body tube 4' is moved are synonymous with the directions along the optical axis. Further, in this specification, the directions in which an optical component fitted in the body tube 4' forms an image of an object (directions along a straight line connecting the body tube 4' with the object) are referred to as "directions along the optical axis".

The driving-direction changing member 99 makes contact with the body tube 4' to cause the driven body (body tube 4') to be driven in directions (directions along the Z axis) different from bending displacement directions of the bending displacement member 91A.

The bending displacement member 91A is a bimorph piezoelectric element having a three-layer structure of two piezoelectric material layers pressure-bonded to each other with a shim sandwiched therebetween. As shown in FIG. 20, the bending displacement member 91A has an end (a prolongation of the shim in the present embodiment) fixedly bonded to or fitted in the camera module housing 96 and the other end joined to the driving-direction changing member 99. The bending displacement member 91A and the driving-direction changing member 99 may be integrally structured. In this case, the bending displacement member 91A has a portion extended therefrom, and the extended portion serves as the driving-direction changing member 99.

In the present driving device, the preload spring 98 has an end fixed to a side wall of the camera module housing 96 and the other end fixed to the body tube 4'. For this reason, when the body tube 4' is driven in the directions along the optical axis to be displaced (moved), the other end of the preload spring is also displaced. The preload spring 98 is designed to follow the body tube 4' by bending in the directions along the optical axis while the body tube 4' is being driven.

(Principle of Operation 3)

Figure 22:
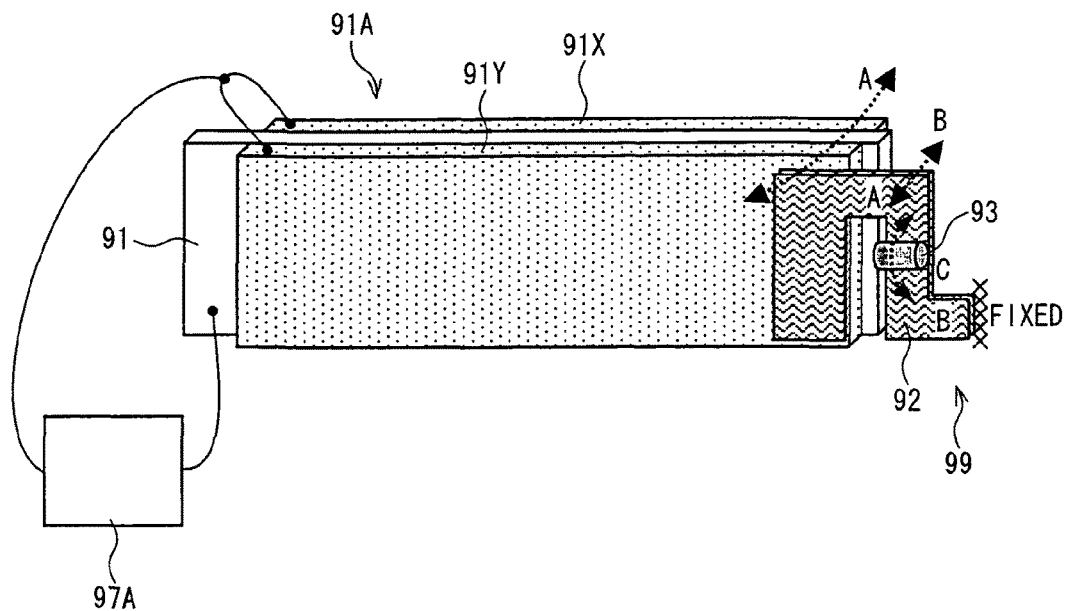
FIG. 22

FIG. 22 is a perspective view schematically showing the configuration of the driving device as seen from the line of sight A of FIG. 20. It should be noted that FIG. 22 exclusively shows a bending displacement member 91A and a driving-direction changing member 99 bonded thereto.

As shown in FIG. 22, the bending displacement member 91A includes two piezoelectric material layers 92X and 92Y and a shim 91 made of metal, and has a three-layer structure of the two piezoelectric material layers 92X and 92Y pressure-bonded to each other with the shim 91 sandwiched therebetween. That is, the bending displacement member 91 is a bimorph piezoelectric element. Further, the control circuit 97A is a circuit for exciting the bending displacement member 91A to be bent and displaced, and is electrically wire-connected to the two piezoelectric material layers 92X and 92Y. When the driving circuit 10 applies an alternating signal (voltage) to the bending displacement member 91A, the bending displacement member 91A comes to be bent and displaced in the directions of the arrow A.

Further, the driving-direction changing member 99 is composed of a S-shaped elastic member 92 and a friction member 93. The friction member 93 is provided on the elastic member 92 to be in frictional engagement with the body tube 4'. The elastic member 92 is has an S shape having an end joined to the bending displacement member 91A and the other end fixed to the camera module housing 96. For this reason, when the bending displacement member 91A is bent and displaced in the directions of the arrow A, the elastic member 92 is displaced in the directions of the arrow B. Moreover, the end of the friction member 93 provided on the elastic member is displaced in the directions of the arrow C (in the directions along the optical axis) and brought into frictional engagement with the body tube 4'.

Figure 23:
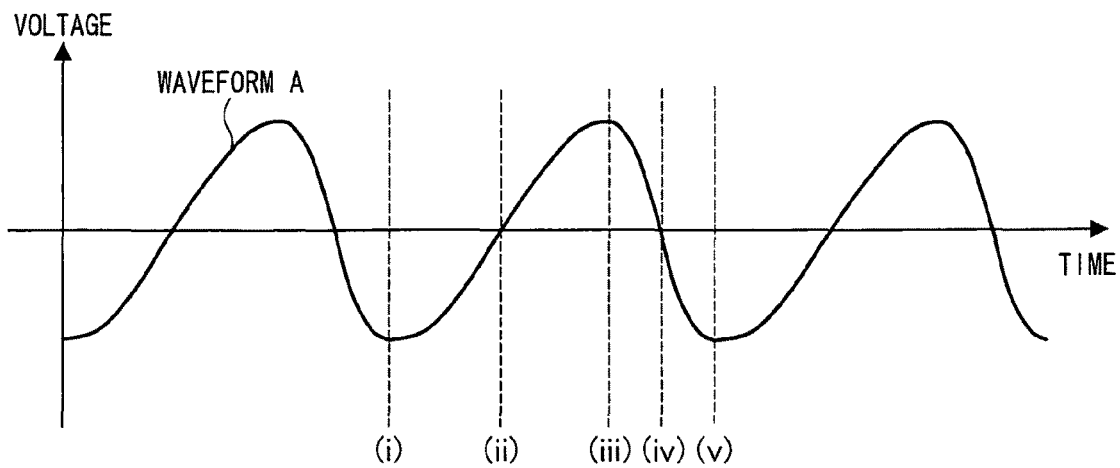
FIG. 23

The following describes an example of operation where the body tube 4' is driven in the directions along the optical axis by driving the end of the driving-direction changing member (the aforementioned friction member 93) circularly. FIG. 23 is a graph showing the waveform of a driving voltage that is applied to the bending displacement member 91A. FIG. 24 shows explanatory diagrams (a) and (b) for explaining how the end of the friction member 93 is driven circularly in accordance with the driving voltage waveform of FIG. 23.

In FIG. 23, the waveform A is the waveform of a driving voltage that is applied to the bending displacement member 91A. It should be noted that the driving voltage of the waveform A is outputted from the driving circuit 10. As shown in FIG. 23, the waveform A is a saw-tooth waveform. (a) and (b) of FIG. 24 show the states of the points of connection A and B in correspondence with the points of time (i) through (v) of the waveform A of FIG. 23.

As shown in (a) and (b) of FIG. 24, when the driving voltage of the waveform A is applied, the points of connection A and B shift in position to the states (i) through (v). That is, at the point of time (i) of FIG. 23, the points of connection A and B are in the state (i) of (a) of FIG. 24. At the point of time (ii) of FIG. 23, the points of connection A and B are in the state (ii) of (a) of FIG. 24. At the point of time (iii) of FIG. 23, the points of connection A and B are in the state (iii) of (a) and (b) of FIG. 24. At the point of time (iv) of FIG. 23, the points of connection A and B are in the state (iv) of (b) of FIG. 24. At the point of time (v) of FIG. 23, the points of connection A and B are in the state (v) of (b) of FIG. 24. The shift and displacement of the points of connection A and B to the states (i) through (v) of (a) and (b) of FIG. 24 causes the end of the friction member 93 to be driven circularly as shown in (a) and (b) of FIG. 24.

At this time, the end of the friction member 93 is driven circularly in accordance with the saw-tooth driving voltage waveform of FIG. 23. This causes a difference in angular velocity between the driving direction and the opposite driving direction (that is, while the angular velocity of the shift to the states (i) through (iii) becomes relatively low, the angular velocity of the shift to the states (iii) through (v) becomes relatively high).

Further, the appropriate setting of the driving voltage waveform makes it possible to cause the end of the friction member 93 to differ in angular acceleration between the driving direction and the opposite driving direction. That is, it is possible to set the driving voltage waveform so that while the angular acceleration of the shift to the states (i) through (iii) (in the driving direction) becomes relatively low, the angular acceleration of the shift to the states (iii) through (v) (in the opposite driving direction) becomes relatively high. Therefore, the adjustment of the coefficient of friction and the like of the friction member 93 makes it possible to prevent force applied to a point of contact between the friction member 93 and the body tube 4' in the driving direction from exceeding static frictional force between the friction member 93 and the body tube 4', and to thereby prevent the end of the friction member 93 from slipping on the body tube 4'. Meanwhile, force applied to a point of contact between the friction member 93 and the body tube 4' in the opposite driving direction exceeds static frictional force between the friction member 93 and the body tube 4'. This allows the end of the friction member 93 to slipping on the body tube 4'. This results in a difference in driving force between the driving direction and the opposite driving direction, thus causing the body tube 4' to be driven in the driving direction.

Further, both in the driving direction and the opposite driving direction, the coefficient of friction and the like can be adjusted so that the end of the friction member 93 slipping on the body tube 4'. In this case, the driving force in the driving direction and the driving force in the opposite driving direction are determined by dynamic frictional force to become equal. However, since the driving voltage waveform of FIG. 23 is set so that the duration of displacement in the driving direction is long and the duration of displacement in the opposite driving direction is short, the duration of action of dynamic frictional force in the driving direction becomes longer than the duration of action of dynamic frictional force in the opposite driving direction. This as a result causes the body tube 4' to be driven in the driving direction.

The present driving device is configured such that the preload spring 98 causes the body tube 4' to be always in contact with the end of the friction member 93. For this reason, the end of the friction member 93 is excited alternately to be displaced linearly (due to a strain produced in the bending displacement member 91A, the elastic member 92, and the friction member 93, and the like), instead of being rotated circularly. Even in such a case, the body tube 4' can be driven, of course.

(Resonance)

As described above, the mechanism for driving the body tube 4' in the present driving device is such a mechanism that the vibration of the bending displacement member 91A causes the driving-direction changing member 99 to vibrate in the driving directions to be in frictional engagement with the body tube 4'. Moreover, in this driving mechanism, the preload spring 98 serves as an elastic member for biasing the body tube 4' toward the driving-direction changing member 99. That is, the driving mechanism of the present driving device can be considered as a spring system including the preload spring 98, the body tube 4', the driving-direction changing member 99, and the bending displacement member 91A. The application of the vibration of the bending displacement member 91A to the driving mechanism of the present driving mechanism as the spring system produces such resonance as follows.

First, there is considered to be first resonance that is resonance between the vibration of the bending displacement member 91A by the driving circuit 10 and the vibration (driving) of the driving-direction changing member 99. The first resonance acts in the driving directions of the body tube 4'. That is, the first resonance is resonance in the driving directions due to the mass of the body tube 4', the elasticity of the bending displacement member 91A, and the elasticity of the driving-direction changing member 99.

The natural frequency (resonant frequency) $f_0$ of the first resonance can be represented by Eq. (1) as follows:

Math. 1

$$f_0 = \frac{1}{2\pi}\sqrt{\frac{K_0}{M}} \text{ [Hz]} \tag{1}$$

where $K_0$ [N/m] is the spring constant in the driving directions due to the elasticity of the bending displacement member 91A and the elasticity of the driving-direction changing member 99 and M [kg] is the mass of the body tube 4'.

Assume that the fundamental frequency $f_D$ is the frequency of the waveform of a driving voltage that is applied to the bending displacement member 91A (i.e., the waveform A of FIG. 23). Then, setting the fundamental frequency $f_D$ near the natural frequency $f_0$ represented by Eq. (1) makes it possible to drive the body tube 4' at a lower level of amplitude of the waveform A. That is, setting the fundamental frequency $f_D$ to approximate to the natural frequency $f_0$ causes the first resonance between the vibration of the bending displacement member 91A and the vibration (driving) of the driving-direction changing member 99, thus making it possible to increase the vibration amplitude of the driving-direction changing member 99 at a lower level of amplitude of the waveform A. Therefore, in the present driving device, it is effective to drive the bending displacement member 91A at the fundamental frequency $f_D$ near the natural frequency $f_0$. However, in the present driving device, for example, in cases where the body tube 4' is set at a low driving velocity or in cases where a high driving voltage is available, the body tube 4' can be driven at the fundamental frequency $f_D$ different from the natural frequency $f_0$ (e.g., lower than the natural frequency $f_0$).

The present driving device is configured such that the preload spring 98 biases the body tube 4' toward the driving-direction changing member 99. In such a configuration, there is considered to be second resonant that is resonance between the vibration of the bending displacement member 91A by the driving circuit 10 and the vibration of the preload spring 98 along the preload direction. The second resonance acts along the preload direction of the preload spring 98. That is, the second resonance is resonance along the preload direction due to the elasticity of the preload spring 98.

The natural frequency (resonant frequency) $f_P$ of the second resonance can be represented by Eq. (2) as follows:

Math. 2

$$f_P = \frac{1}{2\pi}\sqrt{\frac{K_P}{M}} \text{ [Hz]} \tag{2}$$

where $K_P$ [N/m] is the spring constant of the preload spring 98 along the preload direction and M [kg] is the mass of the body tube 4'.

It should be noted, strictly, that the second resonance is influenced by a spring constant attributed to the bending displacement member 91A and the elasticity of the driving-direction changing member 99 along the preload direction. However, the body tube 4' and the driving-direction changing member 99 are not firmly fixed to each other. Therefore, the spring constant due to the elasticity along the preload direction becomes equivalent to a spring constant that is obtained when the vibration along the preload direction causes the body tube 4' and the driving-direction changing member 99 to be set apart from each other. For this reason, the natural frequency (resonant frequency) $f_P$ represented by Eq. (2) is important to the second resonance.

As described above, the driving mechanism of the present driving device produces the first resonance and the second resonance. The following describes the driving mechanism of the present driving device where the natural frequency $f_0$ of the first resonance and the natural frequency $f_P$ of the second resonance approximate to each other.

As mentioned above, the driving of the bending displacement member 91A at the fundamental frequency $f_D$ near the natural frequency $f_0$ makes it possible to reduce the amplitude of the waveform of the driving voltage that is applied to the bending displacement member 91A (i.e., the waveform A of FIG. 23), i.e., to drive the body tube 4' at a low voltage. At this time, the first resonance causes the end of the friction member 93 of the driving-direction changing member 99 to vibrate at the natural frequency $f_0$ and vibrate at the natural frequency $f_0$ also along the preload direction. Moreover, the vibrational component of the end of the friction member 93 along the preload direction excites the second resonance in the preload spring 98. This results in the vibration of the body tube 4' along the preload direction, thus destabilizing the state of contact between the friction member 93 and the body tube 4'. Furthermore, the frictional force acting between the friction member 93 and the body tube 4' is destabilized, so that the driving velocity and thrust of the body tube 4' is destabilized.

Further, such instability of the state of contact between the friction member 93 and the body tube 4' is a problem that occurs in cases where the fundamental frequency $f_D$ of the waveform of the driving voltage takes on a value far from (which is not a value close to) the natural frequency $f_0$ and where the natural frequency $f_0$ and the natural frequency $f_P$ are far from each other. That is, excitation of the second resonance destabilizes the state of contact between the friction member 93 and the body tube 4'. The second resonance is excited in cases where the fundamental frequency $f_D$ of the waveform of the driving voltage that is applied to the bending displacement member 91A approximates to the natural frequency $f_P$. In the driving device of FIGS. 20 and 21, application to the bending displacement member 91A of the driving voltage of the waveform of the fundamental frequency $f_D$ causes the end of the friction member 93 to vibrate at the fundamental frequency $f_D$. Moreover, the vibrational component of the end of the friction member 93 along the preload direction (i.e., the vibrational component of the fundamental frequency $f_D$) excites the second resonance in the preload spring 98.

The present driving device is set so that the fundamental frequency $f_D$ of the waveform of the driving voltage (alternating signal) that is applied to the bending displacement member 91A is different from the natural frequency $f_P$ of the preload spring 98. According to this configuration, application to the bending displacement member 91A of the driving voltage (alternating signal) of the waveform of the fundamental frequency $f_D$ causes the friction member 93 of the driving-direction changing member 99 to vibrate at the fundamental frequency $f_D$. Moreover, since the vibrational component of the friction member 93 along the preload direction vibrates at the fundamental frequency $f_D$ different from the natural frequency $f_P$ of the preload spring 98, the second resonance will not be excited. This makes it possible to stabilize the state of contact between the friction member 93 and the body tube 4' without the body tube 4' vibrating along the preload direction.

This allows the present driving device to achieve a preload mechanism with the preload spring 98 stabilized.

Furthermore, the stabilization of the state of contact between the friction member 93 and the body tube 4' makes it possible to easily set the preload force of the preload spring 98 out of consideration of the vibrational component of the friction member 93 along the preload direction.

In particular, in cases where the fundamental frequency $f_D$ of the waveform of the driving voltage that is applied to the bending displacement member 91A is higher than the natural frequency $f_P$ attributed to the preload spring 98, it becomes easy to control the preload force of the preload spring 98.

The preload force F of the preload spring 98 is represented as follows:

$$F=K_P x,$$

where F is the preload force, k is the spring constant, and x is the displacement.

The preload spring is designed so that a predetermined preload force is obtained when the preload spring 98 is pressed down by 1 mm from its free length. At this time, assuming that the sum of manufacturing tolerance in the preload spring 98 and other members is 0.1 m, there occur approximately 10% variations in preload force. Meanwhile, in cases where the preload spring 98 is designed so that a predetermined preload force is obtained when the preload spring 98 is pressed down by 0.2 mm from its free length, there occur as high as 50% variations in preload force. That is, when the preload spring 98 is designed to be a hard spring (i.e., a spring comparatively high in spring constant $K_P$) and the natural frequency $f_P$ is raised, it becomes difficult to control preload force. Therefore, control of preload force becomes easier when the free length of the preload spring 98 is greater and the natural frequency $f_P$ is as low as possible.

The disposition of the preload spring 98 in the present driving device is described. It is preferable that the preload spring 98 be disposed so that an imaginary line L representing its preload direction does not pass through the center (marked with a cross in FIG. 20) of the body tuber 4'. The imaginary line L representing the preload direction does not pass through the effective area of the optical lens fitted in the body tube 4'. In cases where the preload spring 98 is disposed so that the imaginary line L representing the preload direction passes through the center of the body tuber 4', the preload spring 98 becomes shorter in spring length. As will be shown in Eq. (3) later, the spring constant $K_P$ of the preload spring 98 becomes smaller as the effective number of turns N becomes larger. In a configuration in which the preload spring 98 becomes shortest in spring length, there is a limit on the increase of the effective number of turns N. This makes it difficult to reduce the spring constant $K_P$. Moreover, it becomes difficult to lower the natural frequency $f_P$ of the preload spring 98 in the second resonance.

In other words, the preload spring 98 may be a helical spring that passes through a tunnel formed in a wall portion of the body tube 4' and does not pass through the optical lens. However, in cases where the preload spring may be set to be short in spring length, the imaginary line L representing the preload direction may pass through the optical length.

The driving device of FIG. 20 is configured such that the preload spring 98 is disposed along a side wall 96b of the camera module housing 96 so that the imaginary line representing its preload direction does not pass through the center of the body tube 4'. The disposition of the preload spring 98 along the camera module housing 96 enables an increase in spring length of the preload spring 98. This makes it possible to reduce the spring constant $K_P$ of the preload spring 98.

It should be noted that, in general, the spring constant $K_P$ of the preload spring 98 as a helical spring is given by Eq. (3) as follows:

Math. 3

$$K_P = 9.8 \times 10^3 \times \frac{d^4 G}{8 D^3 N} \text{ [N/m]} \tag{3}$$

where G is the transverse elastic modulus of spring material [kg/mm²], d is the wire diameter of spring material [mm], D is the spring diameter (coil diameter) [mm], and N is the effective number of turns.

As evidenced by Eq. (3), the spring constant $K_P$ becomes smaller as the spring diameter D or the effective number of turns N becomes larger. Therefore, in order to reduce the spring constant $K_P$, it is only necessary to increase the spring diameter D or increase the effective number of turns N. An increase in the spring diameter D of the preload spring 98 makes it necessary to secure a large space in the camera module housing 96 for installation of the preload spring 98. For this reason, the present driving device is limited in setting of the spring diameter D of the preload spring 98. Meanwhile, the effective number of turns N of the preload spring 98 can be increased by increasing the spring length. In the driving device of FIG. 20, the preload spring 98 is disposed along the side wall 96b of the camera module housing 96. This makes it possible to ensure a great spring length of the preload spring 98 and reduce the spring constant Kp. Furthermore, as evidenced by Eq. (2) above, the natural frequency $f_P$ of the preload spring 98 in the second resonance can be lowered.

Other effects of the present driving device are described. In the present driving device, as mentioned above, the preload spring 98 has a preload-direction end fixed to a side wall of the camera module housing 96 and the other end fixed to the body tube 4'. For this reason, when the body tube 4' is driven in the directions along the optical axis to be displaced (moved), the other end of the preload spring 98 is also displaced. The preload spring 98 follows the body tube 4' by bending in the directions along the optical axis while the body tube 4' is being driven.

As shown in FIG. 20, the preload spring 98 as a helical spring is structured to be sufficiently small in spring diameter with respect to the spring length. Therefore, the preload spring 98 is small (soft) in elasticity along the optical axis, i.e., is structured to be small in spring constant. Accordingly, the preload spring 98 can sufficiently reduce the load on the body tube 4' when following the body tube 4' by bending in the directions along the optical axis.

Further, since the preload spring 98 is small in spring constant of elasticity in the directions along the optical axis, it becomes possible to set a larger amount of displacement (i.e., the amount by which the preload spring 98 is pressed down) for obtaining a predetermined preload force. This makes it possible to reduce variations in preload force due to variations in dimensions of components in assembling the driving device.

Furthermore, the preload spring 98 as a helical spring can be manufactured with reduced variations in elasticity. This makes it possible to reduce differences in preload force among individual driving devices in assembling the driving devices.

(Modification 1)

Figure 25:
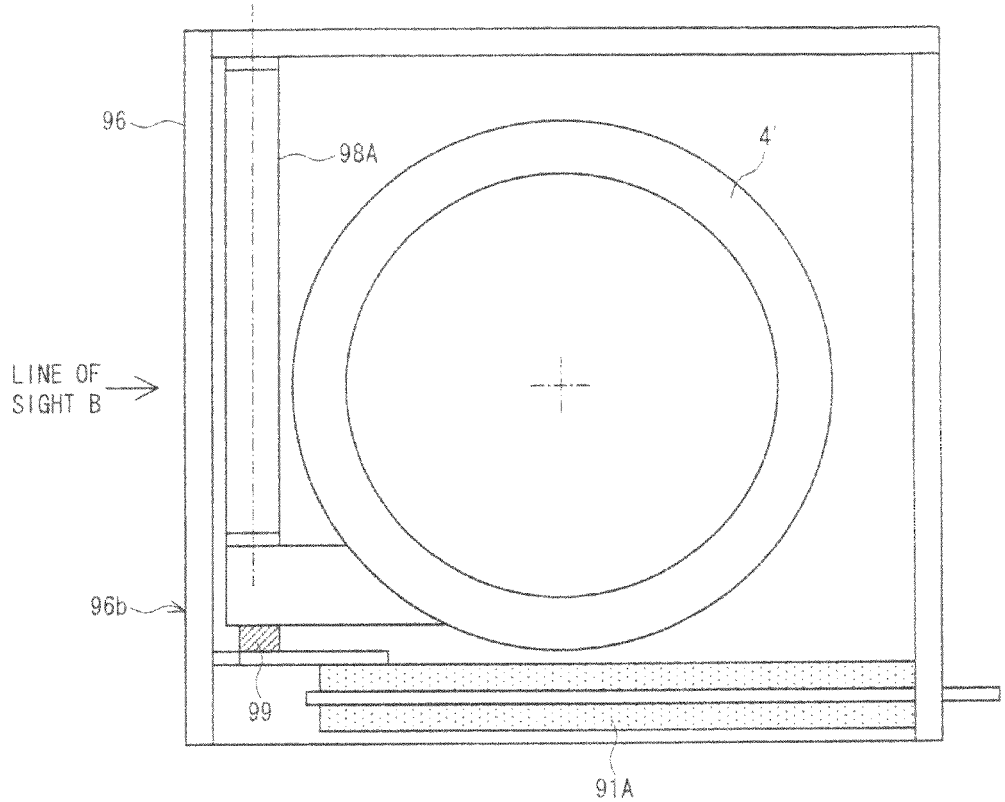
FIG. 25
Figure 26:
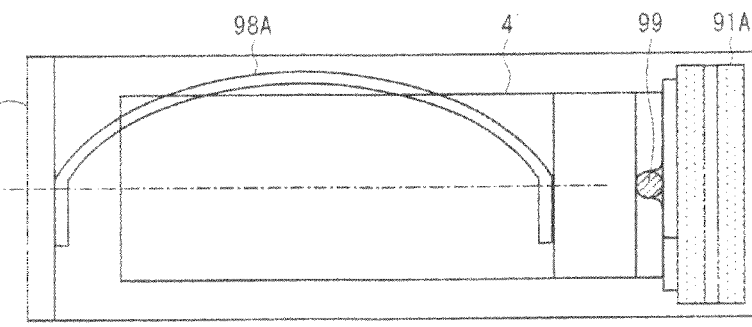
FIG. 26

The following describes a modification of the present driving device configured as shown in FIGS. 20 and 21. FIGS. 25 and 26 schematically shows the configuration of the present driving device as Modification 1. FIG. 25 is a top view, and FIG. 26 is a side view taken as seen from the line of sight B of FIG. 25. It should be noted that FIG. 26 omits the camera module housing.

The driving device of FIGS. 20 and 21 is configured such that the preload spring 98 is a helical spring. Meanwhile, as shown in FIGS. 25 and 26, the present driving device of Modification 1 is configured such that a preload spring 98A is a plate spring. As shown in FIG. 26, the preload spring 98A as a plate spring is curved in a direction along the optical axis, and biases the body tube 4' toward the driving-direction changing member 99 (friction member 93).

The preload spring 98A has a preload-direction end fixed to a side wall of the camera module housing 96 and the other end fixed to the body tube 4'. For this reason, when the body tube 4' is driven in the directions along the optical axis to be displaced (moved), the other end of the preload spring 98 is also displaced. The preload spring 98 follows the body tube 4' by deforming in the directions along the optical axis while the body tube 4' is being driven.

The spring constant K of the preload spring 98A as a plate spring is generally given by Eq. (4) below. It should be noted that since it is difficult to calculate the spring constant of a curved plate spring, the spring constant K of Eq. (4) is the approximate value of a cantilever plate spring.

Math. 4

$$K = 9.8 \times 10^3 \times \frac{E b t^3}{4 l^3} \text{ [N/m]} \tag{4}$$

where E is the longitudinal elastic modulus [kg/mm²], b is the width [mm], t is the plate thickness [mm], and l is the length [mm].

As evidenced by Eq. (4), the spring constant K of the preload spring 98A becomes smaller as the length l becomes larger. Therefore, in order to reduce the spring constant K, it is only necessary to increase the length 1. In the driving device of FIGS. 25 and 26, the preload spring 98A is disposed along the side wall 96b of the camera module housing 96. This makes it possible to ensure a great spring length l of the preload spring 98A and reduce the spring constant K. Furthermore, as evidenced by Eq. (2) above, the natural frequency $f_P$ of the preload spring 98A in the second resonance can be lowered.

(Modification 2)

The following describes a modification of the present driving device configured as shown in FIGS. 20 and 21. FIGS. 27 and 28 schematically shows the configuration of the present driving device as Modification 2. FIG. 27 is a top view, and FIG. 28 is a side view taken as seen from the line of sight B of FIG. 27. It should be noted that FIG. 28 omits the camera module housing.

As shown in FIGS. 27 and 28, the driving device of Modification 2 has a slide member 98C disposed between a preload spring 98B and a body tube 4'. The slide member 98C includes a ball 98D in contact with the body tube 4'. The slide member 98C has a preload-direction end fixed to the preload spring 98B and the other end in contact with the body tube 4' via the ball 98D. The ball 98D is provided for reducing the sliding resistance of the body tube 4' with respect to the slide member 98C.

In the driving device of Modification 2, the preload spring 98B biases the body tube 4' toward the driving-direction changing member 3 (friction member 93) via the slide member 98C. The slide member 98C is larger in volume than the driving-direction changing member 99, and is made of material comparatively high in specific gravity such as metal. This causes the slide member 98C to be greater in mass than the driving-direction changing member 99.

In the driving device of Modification 2, the natural frequency (resonant frequency) $f_P$ of the second resonance can be represented by Eq. (5) follows:

Math. 5

$$f_P = \frac{1}{2\pi}\sqrt{\frac{K_P}{M + M_s}} \text{ [Hz]} \quad (5)$$

where $K_P$ [N/m] is the spring constant of the preload spring 98B along the preload direction, M [kg] is the mass of the body tube 4', and $M_s$ [kg] is the mass of the slide member 98C.

As shown in Eq. (5), the resonant frequency $f_P$ is lowered as the mass $M_s$ of the slide member 98C and the mass M of the body tube 4' are increased. Therefore, in the driving device of Modification 2, the resonant frequency $f_P$ of the preload spring 98B due to the second resonance can be reduced by increasing the mass $M_s$ of the slide member 98C.

Furthermore, according to the driving device of Modification 2, the slide member 98C and the body tube 4' are not firmly fixed to each other, and the sliding resistance between the members is reduced by the ball 98D. Because of this reduction in sliding resistance between the slide member 98C and the body tube 4', the slide member 98C, to which the preload spring 98B has been joined, is such that the first resonance due to the vibration of the bending displacement member 91A and the vibration (driving) of the driving-direction changing member 99 becomes free of the influence of the mass of the slide member 98C. Therefore, in the driving device of Modification 2, if the sliding resistance between the slide member 98C and the body tube 4' is sufficiently small, the addition of the slide member 98C has no influence on the increase in mass of the driving-direction changing member 99. Therefore, the natural frequency (resonant frequency) $f_0$ of the first resonance can be represented by Eq. (1) above.

As described above, the driving device of Modification 2 can lower the resonance frequency $f_P$ of the preload spring 98B due to the second resonance, while freeing the first resonance of the influence of the mass of the slide member 98C by reducing the sliding resistance between the slide member 98C and the body tube 4'.

Further, the driving device of FIGS. 27 and 28 is configured such that the sliding resistance between the slide member 98C and the body tube 4' is reduced by the ball 98D. However, the driving device of Modification 2 is not limited to this configuration. For example, the driving device of Modification 2 may be configured to have lubricating oil put between the slide member 98C and the body tube 4', or to have a lubricant layer formed on that surface (sliding surface) of the slide member 98C which faces the body tube 4' and constituted by a solid lubricating material (such as carbon) comparatively low in frictional resistance.

(Modification 3)

The following describes a modification of the present driving device configured as shown in FIGS. 20 and 21. FIG. 29 is a top view schematically showing the configuration of the present driving device as Modification 3.

As shown in FIG. 29, the driving device of Modification 3 has a slide member 98C' and a ball 98D disposed between a preload spring 98' and a body tube 4'. The slide member 98C' and the ball 98D are configured in the same manner as their counterparts of the driving device of Modification 2, and as such, are not described below.

In the driving device of Modification 3, the preload spring 98' is disposed as a plate spring along that side surface 96d of the camera module housing 96 which faces the bending displacement member 91A. The preload spring 98' is structured to be bent with respect to the side wall 96d. The preload spring 98' has an end fixed to the side wall 96d and the other end fixed to the slide member 98C' opposite the fixed end. This configuration causes the preload spring 98' to produce elasticity in a bent portion thereof and bias the body tube 4' toward the driving-direction changing member 99 via the slide member 98C'.

The disposition of the preload spring 98' along the side wall 96d facing the bending displacement member 91A makes it possible to increase the spring length of the preload spring 98' as a plate spring and reduce the spring constant. Further, the slide member 98C' is larger in volume than the driving-direction changing member 99, and is made of material comparatively high in specific gravity such as metal. This causes the slide member 98C' to be greater in mass than the driving-direction changing member 99. This makes it possible to lower the resonant frequency $f_P$ of the preload spring 98' due to the second resonance.

(Modification 4)

Figure 30:
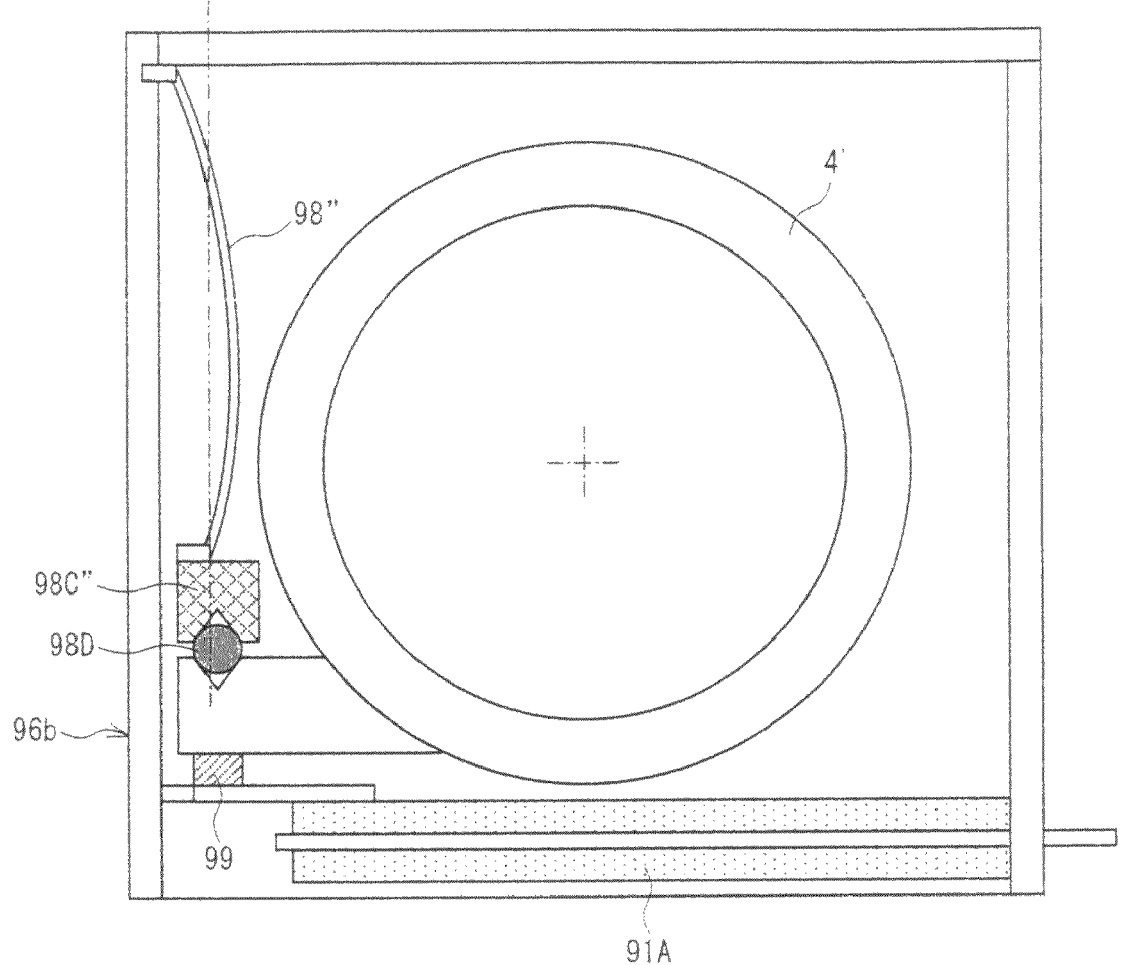
FIG. 30

The following describes a modification of the present driving device configured as shown in FIGS. 20 and 21. FIG. 30 is a top view schematically showing the configuration of the present driving device as Modification 4.

As shown in FIG. 30, the driving device of Modification 4 has a slide member 98C" and a ball 98D disposed between a preload spring 98" and a body tube 4'. The slide member 98C" and the ball 98D are configured in the same manner as their counterparts of the driving device of Modification 2, and as such, are not described below.

In the driving device of Modification 3, the preload spring 98" is disposed as a plate spring along that side wall 96b of the camera module housing 96 which is perpendicular to the bending displacement member 91A. The preload spring 98" is structured to be bent with respect to the side wall 96b. The preload spring 98" has an end fixed to the side wall 96b and the other end fixed to the slide member 98C" opposite the fixed end. This configuration causes the preload spring 98" to produce elasticity in a bent portion thereof and bias the body tube 4' toward the driving-direction changing member 99 via the slide member 98C".

The disposition of the preload spring 98" along the side wall 96b makes it possible to increase the spring length of the preload spring 98" as a plate spring and reduce the spring constant. Further, the slide member 98C" is larger in volume than the driving-direction changing member 99, and is made of material comparatively high in specific gravity such as metal. This causes the slide member 98C" to be greater in mass than the driving-direction changing member 99. This makes it possible to lower the resonant frequency $f_P$ of the preload spring 98" due to the second resonance.

In the driving device of Modification 4, the slide member 98C" and the body tube 4' are not firmly fixed to each other, and the sliding resistance between the members is reduced by the ball 98D. Such a sufficient reduction in sliding resistance between the slide member 98C" and the body tube 4' prevents the preload spring 98" as a plate spring from bending in the directions along the optical axis while the body tube 4' is being driven. Therefore, as shown in FIG. 30, the degree of freedom at which the preload spring 98" is disposed as a plate spring is strengthened; for example, the preload spring 98" is disposed so that its width is parallel to the optical axis. Further, the space between the camera module housing and the body tube 4' can be reduced by disposing the preload spring 98" so that its width is parallel to the optical axis.

The present embodiment has described configurations premised on the driving device of Embodiment 5. The problem of the difficult in setting the preload force applies to a driving device (Patent Literature 5) including a piezoelectric element capable of expanding and contracting in driving directions (i.e., directions along an optical axis) in which a body tube is driven; and a driving member joined to an end of the piezoelectric element, as well as the driving device of Embodiment 5.

In the driving device of Patent Literature 5, the driving directions of the driving member and the direction of expansion of the piezoelectric element coincide with each other, and the driving member is displaced only in the direction of expansion of the piezoelectric element; therefore, there is considered to be no vibrational component perpendicular to the direction of expansion of the piezoelectric element. However, in reality, the driving member vibrates perpendicularly to the direction of expansion of the piezoelectric element. For this reason, when the natural frequency (resonant frequency) of a preload spring coincides with the frequency of vibration perpendicular to the direction of expansion of the piezoelectric element, there is a risk of resonance of the preload spring. This destabilizes the frictional force between the driving member and the body tube, thus destabilizing the driving velocity of the body tube.

Application of a configuration of the present embodiment makes it possible to solve the problems with the driving device of Embodiment 5. That is, the present embodiment can be applied to any driving device including a driving mechanism for driving a driven body including a vibration member and a driving member joined to the vibration member, which vibrates to cause the driving member to make contact with the driven body to cause frictional driving of the driven body, the driving device further including: a preload elastic member for biasing the driven body toward the driving member; and control means for applying an alternating electrical signal to the driving member to control the vibration of the vibration member, wherein the alternating signal has a fundamental frequency different from the resonant frequency of resonance in a preload direction due to the elasticity of the preload elastic member and the mass of the driven body.

According to the foregoing configuration, application of the alternating signal of the fundamental frequency to the vibration member causes the driving member to vibrate at the fundamental frequency. Moreover, the vibrational component of the driving member along the preload direction vibrates at the fundamental frequency different from the resonant frequency of the preload elastic member, the resonance along the preload direction due to the elasticity of the preload elastic member and the mass of the driven body will not be excited. This makes it possible to stabilize the state of contact between the driving member and the driven body without the driven body vibrating along the preload direction. This allows the present driving device to achieve a preload mechanism with the preload spring 98 stabilized. As a result, the foregoing configuration makes it possible to achieve a preload mechanism stable in frictional force acting between the driving member and the driven body and stable in driving velocity of the driven body.

As described above, the present driving device is configured to further include: a preload elastic member for biasing the driven body toward the driving member; and control means for applying an alternating electrical signal to the driving member to control the vibration of the vibration member, wherein the alternating signal has a fundamental frequency different from the resonant frequency of resonance along a preload direction due to the elasticity of the preload elastic member and the mass of the driven body.

This makes it possible to achieve a preload mechanism stable in frictional force acting between the driving member and the driven body and stable in driving velocity of the driven body.

Embodiment 8

Each of the driving devices of Embodiments 1 to 7 is configured such that a driving-direction changing member has one end joined to one bending displacement member and the other end joined to or supported by a preload elastic member or the other bending displacement member, i.e., such that a driving-direction changing member has both ends supported or fixed across that part of the driving-direction changing member which makes contact with the driven body. However, in such a configuration, when the bending displacement member joined to the one end of the driving-direction changing member is bent and displaced, the other end of the driving-direction changing member is limited in width of displacement because it is joined to or supported by the preload elastic member or the other bending displacement member. This results in restraint of the movement of the other end of the driving-direction changing member, thus decreasing the vibration amplitude of the contact part with the driven body. Therefore, each of the driving devices of Embodiments 1 to 7 leaves behind deterioration in driving efficiency of the driven body with respect to the width of bending displacement of a bending displacement member.

Further, each of the driving devices of Embodiments 1 to requires a bonding step of fixing the other bending displacement member to the other end of the driving-direction changing member, thus increasing the number of steps of assembling the driving device and increasing costs.

Such a problem is solved by a driving device of the present embodiment (such a driving device being referred to as "present driving device").

(Configuration of the Present Driving Device)

Figure 31:
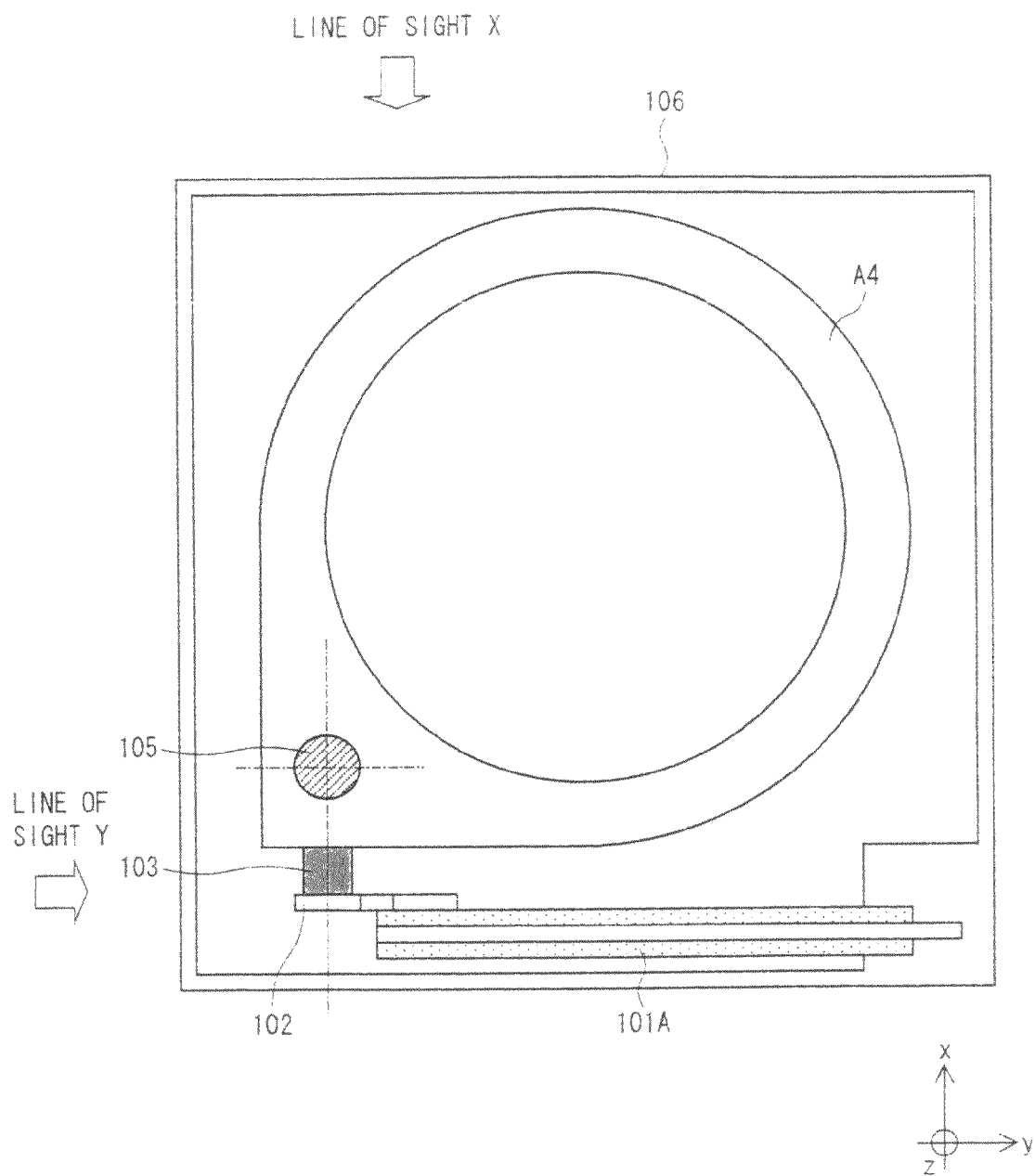
FIG. 31

The present driving device is described below with reference to FIGS. 31 and 32. FIG. 31 is a top view schematically showing the configuration of the present driving device. The driving device of FIG. 31 is an optimum embodiment applied as an autofocus adjustment mechanism in a compact camera module.

As shown in FIG. 31, the present driving device includes a bending displacement member 101A, an elastic member (driving-direction changing member) 102, a friction member (driving-direction changing member: contact part) 103, a body tube (driven body) 4", a guide bar 105, and a camera module housing 106.

In the present driving device, the bending displacement member 101A has an end fixed to the camera module housing 106. Joined to the other end of the bending displacement member 101A opposite the camera module housing 106 are a driving-direction changing member constituted by the elastic member 102 and the friction member 103. The friction member 103 has an end in contact and frictional engagement with the body tube 4".

Further, the present driving device is provided with the guide bar 105, which guides the body tube 4" to move along the optical axis. The guide bar 105 is a rod-like body extending along the optical axis, and is fixed perpendicularly to the bottom surface of the camera module housing 106.

In the present driving device, the guide bar 105, the bending displacement member 101A, and the elasticity of the elastic member 102 are used so that the friction member 103 and the body tube 4" are pressed with predetermined force.

Further, as in the driving devices of Embodiments 1 to 7, application of a control voltage to the bending displacement member 101A by a driving circuit (control means; not shown) causes the body tube 4" to be driven in the z directions. That is, the application of the control voltage by the driving circuit causes bending displacement vibration of the bending displacement member 101A in the x directions. Moreover, when bending displacement vibration of the bending displacement member 101A is excited, the action of the driving-direction changing member constituted by the elastic member 102 and the friction member 103 causes z-axis displacement vibration of that part of the friction member 93 which is in frictional engagement with the body tube 4". The displacement vibration causes the body tube 4" to be driven in the z directions. The control means for applying the control voltage to the bending displacement member 101A and the waveform of a driving voltage by the control means are the same as their counterparts of the driving devices of Embodiments 1 to 7, and as such, are not described below.

Figure 32:
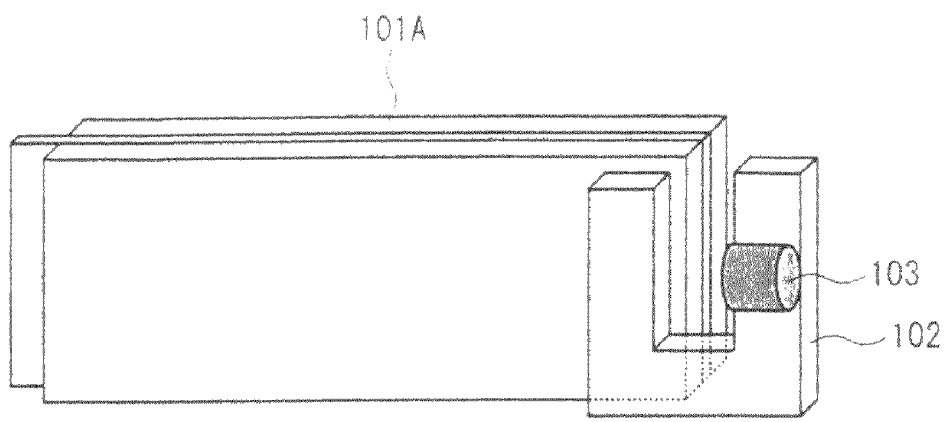
FIG. 32

FIG. 32 is a perspective view schematically showing the configuration of the driving device as seen from the line of sight X of FIG. 31. It should be noted that FIG. 32 exclusively shows a bending displacement member 101A and a driving-direction changing member bonded thereto.

As shown in FIG. 32, the present driving device include one and only bending displacement member 101A. Joined this bending displacement member 101A are a U-shaped elastic member 102 and a friction member 103. More specifically, the bending displacement member 101A is joined to the elastic member 102. The elastic member 102 has an end joined to the bending displacement member 101A and the other end joined to no other members to serve as a free end. In other words, the present driving device is configured to include the driving-direction changing member constituted by the single bending displacement member 101A, the elastic member 102, and the friction member 103, the driving-direction changing member making no contact with another member except at a point of connection with the bending displacement member 101A and a point of frictional engagement (friction member 103) with a body tube 4".

Since the elastic member 2 has a free end opposite its joint with the bending displacement member 101A, when the bending displacement member is bent and displaced, the other end of the driving-direction changing member (elastic member 102) is not limited in width of displacement by being joined to or supported by another member. This results in prevention of a reduction in vibration amplitude of the contact part (friction member 103) with the body tube 4", thus brining about an effect of improving the driving efficiency of the body tube 4". Furthermore, it becomes unnecessary to execute a bonding step of fixing another bending displacement member to the end opposite the joint of the elastic member 102 with the bending displacement member 101A. This makes it possible to reduce the number of steps to be executed to assemble the driving device.

The following describes the waveform of a driving voltage by control means and the principle of operation according to which the body tube 4" is driven in the directions along the optical axis in accordance with the driving voltage waveform.

(Principle of Operation)

Figure 33:
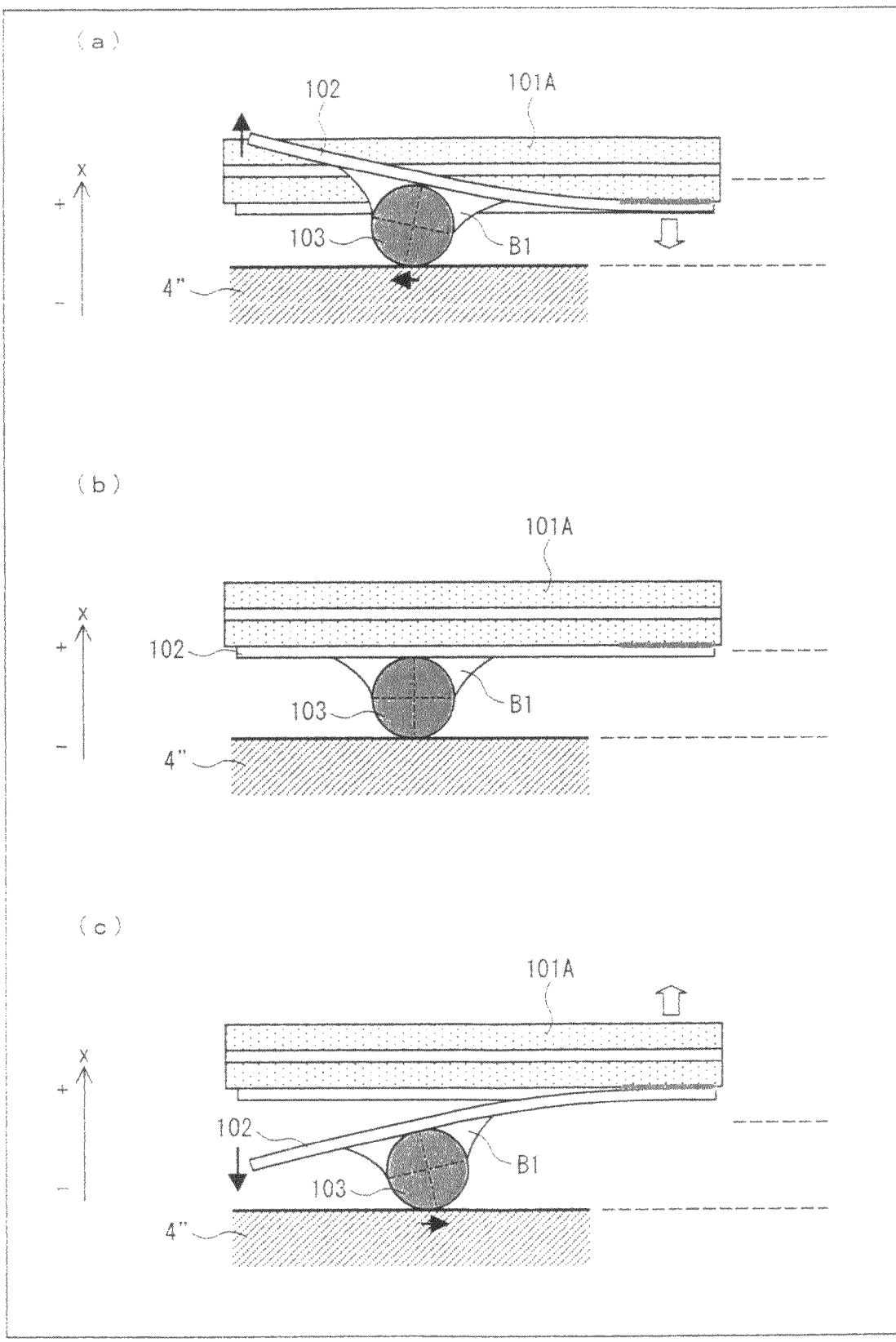
FIG. 33

FIG. 33 shows side views each schematically showing the arrangement of (i) the bending displacement member 101A, (ii) the driving-direction changing member, which is constituted by the elastic member 102 and the friction member 103, and (iii) the body tube 4" as seen from the line of sight of Y of FIG. 31. As shown in FIG. 33, the friction member 103 is firmly fixed to the elastic member 102 by an adhesive β1. FIG. 33 assumes that the bending displacement directions of the bending displacement member 101A are the x directions. In the present driving device, the free end moves away from and closer to the body tube 4" repeatedly in the x directions in accordance with bending displacement vibration of the bending displacement member 101A. It should be noted here that the displacement of the free end of the elastic member 102 or the bending displacement member 101A in a direction away from the body tube 4" is defined as "being displaced in the +x direction", and that the displacement in a direction closer to the body tube 4" is defined as "being displaced in the −x direction". (a) of FIG. 33 shows a state where the bending displacement member 101A has been displaced most greatly in the +x direction. (b) of FIG. 33 shows a state where the bending displacement member 101A has been displaced most greatly in the −x direction. (c) of FIG. 33 shows a state where the elastic member has resonated.

In the present driving device, the control voltage that is applied to the bending displacement member 101A can be set so that the displacement vibration frequency of the bending displacement member 101A approximates to the resonant frequency of the elastic member 102. This causes the elastic member 102 to resonate, thereby enabling a further increase in vibration amplitude of the free end of the elastic member 102. The following further details a case where the resonance of the elastic member 102 is not utilized and a case where the resonance of the elastic member 102 is utilized.

(Case where the Resonance of the Elastic Member 102 is not Utilized)

In this case, the control voltage is set so that the displacement vibration frequency of the bending displacement member 101A is lower than the resonant frequency of the elastic member 102. Moreover, the members are disposed so that the bending displacement member 101A is displaced most greatly in the +x direction as shown in (a) of FIG. 33 and the bending displacement member 101A is displaced most greatly in the −x direction as shown in (b) of FIG. 33.

Displacement vibration of the bending displacement member 101A in the x directions causes the free end of the elastic member 102 to vibrate in the state of (a) of FIG. 33, the state of (b) of FIG. 33, and the state of (a) of FIG. 33 repeatedly in this order. Then, the contact part of the friction member 103 with the body tube 4" is vibrated and displaced in the driving directions (z directions).

During the vibration displacement of the contact part in the driving directions, the control voltage that is applied to the bending displacement member 101A is controlled so that there occurs a difference in displacement velocity or displacement acceleration between backward driving and forward driving. This causes a slip-stick phenomenon, or a difference in slip period between backward driving and forward driving, according to the same principle as mentioned above in Principles of Operation 1 to 3, whereby the body tube 4" is driven.

(Case where the Resonance of the Elastic Member 102 is Utilized)

The aforementioned displacement of the elastic member 102 is such that the displacement vibration of the free end of the elastic member 102 is substantially 180 degrees out of phase with the bending vibration displacement of the bending displacement member 101A (joint of the elastic member 102 with the bending displacement member 101A). This displacement is due to the facts that the body tube 4" and the friction member 103 have been pressed and that the elastic member 102 has elasticity.

In cases where the control voltage is set so that the displacement vibration frequency of the bending displacement member 101A equals or approximates to the resonant frequency of the elastic member 102, the elastic member 102 is caused to resonate. This causes an increase in vibration amplitude of the free end of the elastic member 102. As a result, displacement vibration of the bending displacement member 101A in the x directions causes the free end of the elastic member 102 to vibrate in the state of (a) of FIG. 33, the state of (b) of FIG. 33, and the state of (c) of FIG. 33 repeatedly in this order. Then, the contact part of the friction member 103 with the body tube 4" is vibrated and displaced in the driving directions (z directions).

During the vibration displacement of the contact part in the driving directions, the control voltage that is applied to the bending displacement member 101A is controlled so that there occurs a difference in displacement velocity or displacement acceleration between backward driving and forward driving. This causes a slip-stick phenomenon, or a difference in slip period between backward driving and forward driving, according to the same principle as mentioned above in Principles of Operation 1 to 3, whereby the body tube 4" is driven.

For simplicity of explanation, the foregoing has described the case of displacement where the displacement vibration of the free end of the elastic member 102 is substantially 180 degrees out of phase with the bending vibration displacement of the bending displacement member 101A. However, the present driving device is not limited to the configuration in which the bending vibration displacement of the bending displacement member 101A and the displacement vibration of the free end of the elastic member 102 are 180 degrees out of phase with each other. Since the contact part of the friction member 103 with the body tube 4" is displaced in the driving directions as long as the bending vibration displacement of the bending displacement member 101A and the displacement vibration of the free end of the elastic member 102 differ in phase with each other, the body tube 4" can be driven.

In particular, in cases where the phase difference is close to 90 degrees, the contact part of the friction member 103 with the body tube 4" makes elliptical motions in the driving directions (z directions). Then, a difference in frictional force between backward driving and forward driving causes the body tube 4" to be driven. In this case, by controlling as mentioned above the control voltage that is applied to the bending displacement member 101A, the body tube 4" can be driven without making a difference in displacement velocity or displacement acceleration between backward driving and forward driving.

The elliptical motions vary in rotation direction according to whether the phase difference is close to +90 degrees or −90 degrees. For this reason, it is only necessary to change the bending vibration frequency of the bending displacement member 101A to choose a bending vibration frequency so that the phase difference is close to +90 degrees or −90 degrees. Therefore, even when a driving waveform, such as a sin waveform or a 50% duty square wave, which does not actively make a difference in acceleration between backward driving and forward driving is used as the waveform of the control voltage that is applied to the bending displacement member 101A, backward driving and forward driving are made possible by changing the bending vibration frequency of the bending displacement member 101A.

Embodiment 9

Figure 34:
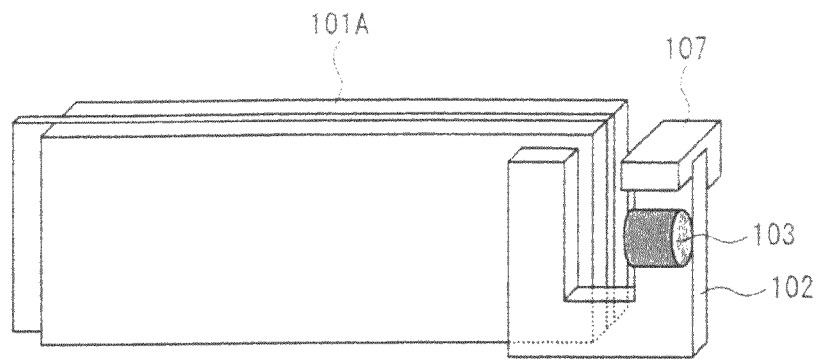
FIG. 34

A driving device of the present embodiment (such a driving device being hereinafter referred to as "present driving device) is described with reference to FIGS. 34 through 36. FIG. 34 is a perspective view schematically showing the configuration of the present driving device. It should be noted that FIG. 34 exclusively shows a bending displacement member 101A and a driving-direction changing member bonded thereto. In the present embodiment, for convenience of explanation, members having the same functions as those described in Embodiment 8 are given the same reference numerals, and as such, are not described below.

As shown in FIG. 34, the present driving device includes one and only bending displacement member 101A as in Embodiment 8. Moreover, the elastic member 102 has an end joined to the bending displacement member 101A and the other end joined to no other members to serve as a free end. In the present driving device, the free end of the elastic member 102 is provided with a mass-increasing member 107 for increasing the mass of the free end. The mass-increasing member 107 is made of material comparatively high in specific gravity such as tungsten or lead.

The following describes the functions of the mass-increasing member 107 in the present driving device.

(Functions of the Mass-Increasing Member 107)

The provision of the mass-increasing member 107 at the free end of the elastic member 102 causes the mass of the free end of the elastic member 102 to be greater than the mass of the joint with the bending displacement member 101A. This results in an increase in vibration amplitude of the free end of the elastic member 102 and an increase in displacement amplitude of the contact part of the friction member 103 with the body tube 4", thus improving the driving efficiency.

Further, the mass-increasing member 107 also has a function of lowering the resonant frequency of the elastic member 102. This function is useful in such a configuration that the resonant frequency of the bending displacement member 101A is lower than the resonant frequency of the elastic member 102. Specifically, the provision of the mass-increasing member 107 at the free end of the elastic member 102 makes it possible to lower the resonant frequency of the elastic member 102 to approximate to the resonant frequency of the bending displacement member 101A. Moreover, use of the resonance of elastic member 102 makes it possible to improve the driving efficiency of the body tube 4".

(Modification 5)

The following described a modification of the present driving device configured as shown in FIG. 34. FIG. 35 is a side view schematically showing the configuration of the present driving device as Modification 5. It should be noted that FIG. 35 exclusively shows a bending displacement member 101A and a driving-direction changing member bonded thereto.

The configuration of FIG. 34 is such that the free end of the elastic member 102 is provided with the mass-increasing member 107; however, the present driving device is not limited to this configuration. The mass-increasing member 107 only needs to be disposed so that the mass of the free end of the elastic member 102 is greater than the mass of the joint with the bending displacement member 101A. As shown in FIG. 35, a mass-increasing member 107A may be disposed near the joint of the elastic member 102 with the bending displacement member 101A.

The following describes the functions of the mass-increasing member 107A in the present driving device.

(Functions of the Mass-Increasing Member 107A)

The provision of the mass-increasing member 107A near the joint of the elastic member 102 with the bending displacement member 101A causes the mass of the joint of the bending displacement member 101A with the elastic member 102 to be greater than the mass of the opposite end (fixed to the camera module housing 106). This causes an increase in vibration amplitude of the bending displacement member 101A, i.e., causes an increase in amplitude at which the elastic member 102 is vibrated. This results in an increase in vibration amplitude of the elastic member 102 and an increase in displacement amplitude of the contact part of the friction member 103 with the body tube 4", thus improving the driving efficiency.

Further, the mass-increasing member 107A also has a function of lowering the resonant frequency of the bending displacement member 101A. This function is useful, for example, in such a configuration that the resonant frequency of the bending displacement member 101A is higher than the resonant frequency of the elastic member 102. Specifically, the provision of the mass-increasing member 107A near the joint of the elastic member 102 with the bending displacement member 101A makes it possible to lower the resonant frequency of the bending displacement member 101A to approximate to the resonant frequency of the elastic member 102. Moreover, use of the resonance of the bending displacement member 101A makes it possible to improve the driving efficiency of the body tube 4".

Figure 35:
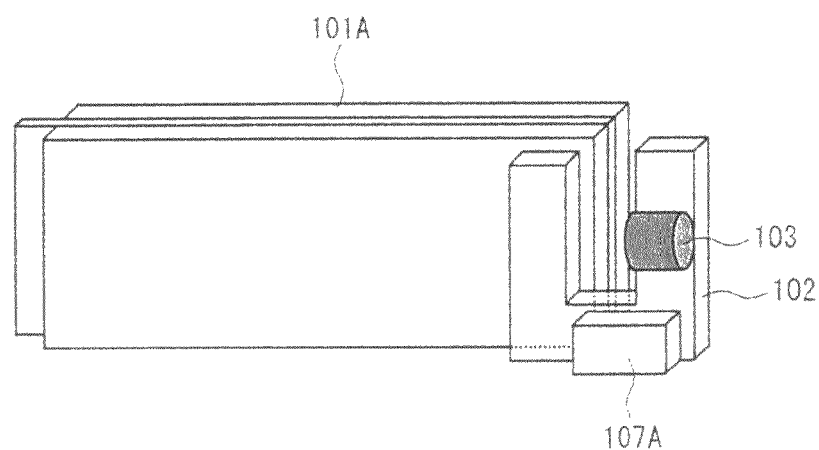
FIG. 35

The configuration of FIG. 35 is such that the mass-increasing member 107A is disposed near the joint of the elastic member with the bending displacement member 101A; however, the present driving device is not limited to this configuration.

Figure 36:
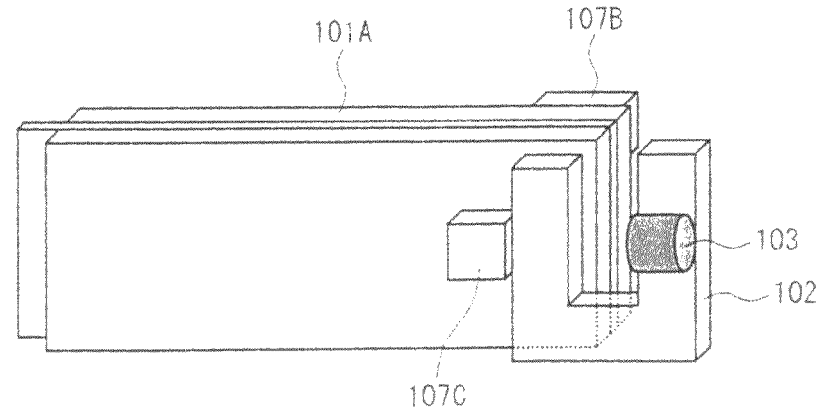
FIG. 36
Figure 37:
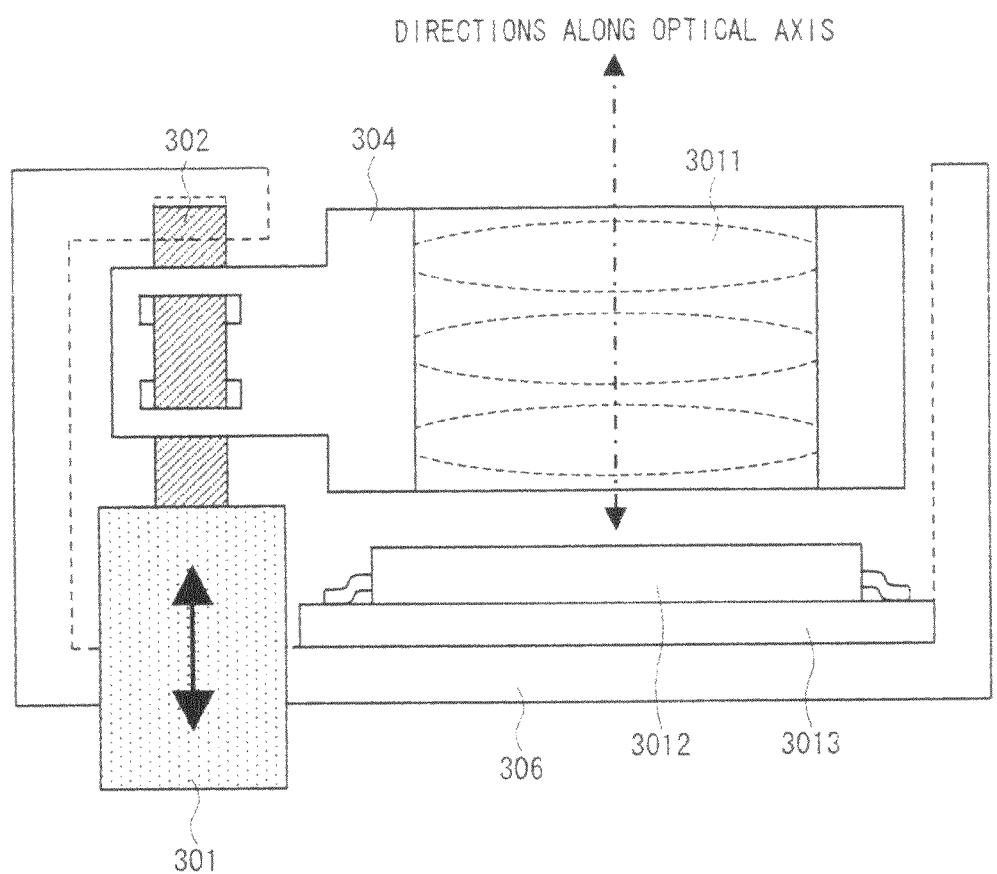
FIG. 37

For example, as shown in FIG. 36, the present driving device may be configured such that the bending displacement member 101A has mass-increasing members 107B and 107C disposed thereon. In FIG. 36, the bending displacement member 101A is sandwiched between the mass-increasing members 107B and 107C arranged along the bending displacement directions.

Even in the configuration of FIG. 36, the mass-increasing members 107B and 107C has the aforementioned functions, i.e., of improving the driving efficiency of the driven body 4" and lowering the resonant frequency of the bending displacement member 101A.

It should be noted that the how to make the bending displacement member 101A and the elastic member 102 closer in resonant frequency to each other is not limited to the descriptions contained in the foregoing sections (Functions of the Mass-increasing Member 107) and (Functions of the Mass-increasing Member 107A). For example, it is possible to devise the length, width, thickness, shape, and elasticity of the bending displacement member 101A and the length, width, thickness, shape, and elasticity of the elastic member 102. Further, it is also possible to set the resonant frequency of the bending displacement member 101A by increasing or decreasing the mass of the entire elastic member 102. Further, the mass-increasing members 107 and 107A may each be formed integrally with the driving-direction changing member (elastic member 102). Furthermore, the mass-increasing members 107 and 107A may each be formed as prolongation added to the driving-direction changing member (elastic member 102) opposite the joint with the bending displacement member 101A.

The present driving device can be rephrased as follows.

That is, the present driving device can be rephrased as including a single bending displacement member and a driving-direction changing member, the driving-direction changing member making no contact with another member except at a point of connection with the bending displacement member and a point of frictional engagement with a driven body.

This configuration brings about effects of enabling driving with a single bending displacement member, reducing costs by omitting a step of bonding the other end of an elastic member, and improving the degree of freedom of design by eliminating the need for a structure for fixing the other end of the elastic member. Furthermore, this configuration brings about an effect of increasing the amplitude of a frictional engagement part of a friction member and thereby improving driving efficiency.

Further, the present driving device can be rephrased as including a single bending displacement member and a driving-direction changing member, the driving-direction changing member having a mass-increasing member provided at an end opposite a joint with the bending displacement member across a point of frictional engagement with a driven body.

This configuration brings about effects of enabling an increase in vibration amplitude of an elastic member and an approximation of the resonant frequency of the elastic member to the resonant frequency of the bending displacement member and thereby improving driving efficiency.

Further, the present driving device can be rephrased as including a single bending displacement member and a driving-direction changing member, the bending displacement member and the driving-direction changing member have a mass-increasing member provided at a point of connection therebetween.

Further, the present driving device can be rephrased as including a single bending displacement member and a driving-direction changing member, the bending displacement member had a mass-increasing member provided thereon.

This configuration brings about effects of enabling an increase in vibration amplitude of an elastic member and an approximation of the resonant frequency of the elastic member to the resonant frequency of the bending displacement member and thereby improving driving efficiency.

Further, in the foregoing configuration, the present driving device can be rephrased as being configured such that the mass-increasing member is formed integrally with the driving-direction changing member.

Furthermore, in the foregoing configuration, the present driving device can be rephrased as being configured such that the mass-increasing member is formed as a prolongation added to the driving-direction changing member.

Furthermore, in the foregoing configuration, the present driving device can be rephrased as being configured such that the resonant frequency of the bending displacement member with the driving-direction changing member as mass and the resonant frequency of the driving-direction changing member alone coincide substantially with each other.

As described above, a driving device of the present invention is configured such that the driving mechanism includes: a bending displacement member, partially fixed, which is excited by electrical control to be bent and displaced; and a driving-direction changing member, joined to the bending displacement member, which makes contact with the driven body to cause the driven body to be driven in displacement directions different from bending displacement directions of the bending displacement member.

Further, an imaging device of the present invention includes: such a driving device for driving, as the driven body, a body tube having an objective lens attached thereto; and an imaging element for taking an image formed by the objective lens.

Further, an imaging apparatus of the present invention includes such an imaging device.

Therefore, the foregoing configuration makes it possible to design a driving device so that the dimension of the driving device along the driving directions is smaller than that of a conventional driving device, thus making it possible to achieve a reduction in height of the driving device.

Further, the driving device of the present invention may be configured such that: the bending displacement member includes a first bending displacement member that is bent in first bending displacement directions and a second bending displacement member that is bent in second bending displacement directions; and the driving-direction changing member causes the driven body to be driven in directions different from the first and second bending displacement directions.

This makes it possible to determine the dimension of the driving device along the driving directions in consideration of the size of the first and second bending displacement members along the driving directions alone.

The driving device of the present invention is preferably configured such that assuming that the first bending displacement member and the driving-direction changing member are joined together at a first joint, that the second bending displacement member and the driving-direction changing member are joined together at a second joint, and that a first straight line perpendicular to the driving directions of the driven body is drawn in that plane of the driving-direction changing member which includes the first and second joints, the first and second joints are disposed so that the first straight line intersects with an imaginary line connecting the first and second joints.

According to the foregoing configuration, the excitation of the first and second bending displacement members by electrical control to be bent and displaced causes the driving-direction changing member, joined to the first and second bending displacement members, to be bent, too, thus causing the first and second joints to be displaced. Moreover, according to the foregoing configuration, assuming that a first straight line perpendicular to the driving directions of the driven body is drawn in that plane of the driving-direction changing member which includes the first and second joints, the first and second joints are disposed so that the first straight line intersects with an imaginary line connecting the first and second joints. This makes it possible that the displacement of the imaginary line according to the first and second joint is efficiently changed into the displacement of the contact part of the driving-direction changing member with the driven body.

The driving device of the present invention is preferably configured such that assuming that the first bending displacement member and the driving-direction changing member are joined together at a first joint, that the second bending displacement member and the driving-direction changing member are joined together at a second joint, and that a second straight line is a straight line perpendicular to a plane including the first and second joints, the driving-direction changing member makes contact with the driven body at a contact part disposed to pass through the second straight line.

According to the foregoing configuration, the contact part is disposed to pass through a line perpendicular to a plane including the first and second joints. This makes it possible that the displacement of a plane including the first and second joints is efficiently changed into the displacement of the contact part with the driven body, thus making it possible to achieve the displacement of the contact part with the driven body with a comparatively low level of bending displacement of the first and second bending displacement members.

The driving device of the present invention is preferably configured such that the first and second bending displacement members are disposed so that, assuming that straight lines connecting a given point on the first bending displacement member with a given point on the second bending displacement member are drawn, at least one of the straight lines passes through the driven body.

According to the foregoing configuration, the first and second bending displacement members are disposed so that, assuming that straight lines connecting a given point on the first bending displacement member with a given point on the second bending displacement member are drawn, at least one of the straight lines passes through the driven body. That is, the driven body is disposed in a spaced surrounded by the first and second bending displacement members. This makes it possible to make more efficient use of space in a housing.

In particular, in cases where a housing capable of housing the first and second bending displacement members and the driving-direction changing member is provided and the housing has a prismatic shape such as a cuboid, it is preferable that the first and second bending displacement members be disposed along two adjacent side-wall surfaces of a plurality of side walls forming the prismatic shape, and that a part of the driven body is disposed in a fan-like space that is formed by the first and second bending displacement members (i.e., in a space that is formed when the first and second bending displacement members are set apart fanwise).

The driving device of the present invention is preferably configured such that the first and second bending displacement members are disposed so that their bending displacement directions are orthogonal to each other.

The driving device of the present invention is preferably configured to further include a housing capable of housing the first and second bending displacement members and the driving-direction changing member, wherein: the housing has a prismatic shape; the first and second bending displacement members are disposed along two adjacent side-wall surfaces of a plurality of side walls forming the prismatic shape; and the driving-direction changing member is disposed in a corner formed by the two side-wall surfaces.

According to the foregoing configuration, the driving-direction changing member is disposed in the corner, which has a plenty of space. This make it possible to make efficient use of the space in the housing for disposing the driving mechanism, thus making it possible to achieve a reduction in size of the driving device.

The driving device of the present invention may be configured such that: the housing has a prismatic shape; and the first and second bending displacement members are disposed along only one of a plurality of side walls forming the prismatic shape.

According to the foregoing configuration, the first and second bending displacement members are disposed along only one of a plurality of side walls forming the prismatic shape. This makes it possible to make more efficient use of the space in the housing for disposing the driving mechanism.

The driving device of the present invention is preferably configured to further include control means, including a first driving circuit for applying a driving voltage to the first bending displacement member and a second driving circuit for applying a driving voltage to the second bending displacement member, which controls bending displacement of the first and second bending displacement members, wherein a waveform of the driving voltage that is applied by the first driving circuit and a waveform the driving voltage that is applied by the second driving circuit differ from each other.

In particular, the driving device of the present invention is preferably configured to further include control means, including a first driving circuit for applying a driving voltage to the first bending displacement member and a second driving circuit for applying a driving voltage to the second bending displacement member, which controls bending displacement of the first and second bending displacement members, wherein a waveform of the driving voltage that is applied by the first driving circuit and a waveform of the driving voltage that is applied by the second driving circuit differ in phase from each other.

According to the foregoing configuration, the waveform of the driving voltage that is applied by the first driving circuit and the waveform of the driving voltage that is applied by the second driving circuit differ in phase from each other. This makes it possible to cause the first and second bending displacement members to be bend and displaced in opposite directions. This makes it possible to possible that the contact part of the friction member with the driven body is efficiently displaced in a direction different from the bending displacement directions.

The driving device of the present invention may be configured such that the waveform of the driving voltage that is applied by the first driving circuit and the waveform of the driving voltage that is applied by the second driving circuit are 90 degrees out of phase with each other.

According to the foregoing configuration, the waveform of the driving voltage that is applied by the first driving circuit and the waveform of the driving voltage that is applied by the second driving circuit are 90 degrees out of phase with each other. This makes it possible to possible that the contact part of the friction member with the driven body is displaced by elliptical driving in a direction different from the bending displacement directions.

The driving device of the present invention may be configured such that the waveform of the driving voltage that is applied by the first driving circuit and the waveform of the driving voltage that is applied by the second driving circuit are 180 degrees out of phase with each other.

According to the foregoing configuration, the waveform of the driving voltage that is applied by the first driving circuit and the waveform of the driving voltage that is applied by the second driving circuit are 180 degrees out of phase with each other. This makes it possible to possible that the contact part of the friction member with the driven body is displaced by circular driving in a direction different from the bending displacement directions.

In particular, the driving device of the present invention may be configured to further include: a third bending displacement member, provided on a second imaginary line passing through the first joint in parallel with a direction perpendicular to the driving directions of the driven body, which includes a third joint with the driving-direction changing member; and a fourth bending displacement member, provided on a third imaginary line passing through the second joint in parallel with a direction perpendicular to the driving directions of the driven body, which includes a fourth joint with the driving-direction changing member.

Further, in the foregoing configuration, the driving device of the present invention is preferably configured to further include control means, including a first driving circuit for applying a driving voltage to the first bending displacement member and a second driving circuit for applying a driving voltage to the second bending displacement member, which controls bending displacement of the first and second bending displacement members, wherein: the third bending displacement member is connected to the first driving circuit and driven in phase with the driving voltage that is applied to the first bending displacement member; and the fourth bending displacement member is connected to the second driving circuit and driven in phase with the driving voltage that is applied to the second bending displacement member.

According to the foregoing configuration, the third bending displacement member is connected to the first driving circuit and driven in phase with the driving voltage that is applied to the first bending displacement member; and the fourth bending displacement member is connected to the second driving circuit and driven in phase with the driving voltage that is applied to the second bending displacement member. This brings about an advantageous effect of inhibiting displacement in an unnecessary direction in changing the bending displacement of the bending displacement members into the displacement of the driven body in the driving directions.

The driving device of the present invention preferably includes: a preload elastic member for biasing the driven body toward the driving-direction changing member; and control means for controlling bending displacement of the bending displacement member.

It is preferable that: the control means apply an alternating electrical signal to the bending displacement member; and the alternating signal have a fundamental frequency different from a resonant frequency of resonance in a preload direction due to elasticity of the preload elastic member and mass of the driven body.

According to the foregoing configuration, when the alternating signal of the fundamental frequency is applied to the bending displacement member, the driving-direction changing member vibrates at the fundamental frequency. Moreover, the vibrational component of the driving-direction changing member vibrates along the preload direction vibrates at a fundamental frequency different from the resonant frequency of the preload elastic member, the resonance along the preload direction is not excited. This prevents the driven body from vibrating along the preload direction, thus making it possible to stabilize the state of contact between the driving-direction changing member and the driven body. As a result, the foregoing configuration can achieve a preload mechanism stable in frictional force acting between the driving-direction changing member and the driven body and stable in driving velocity of the driven body.

In particular, as in the foregoing configuration, when the driving-direction changing member causes the driven body to be driven in displacement directions different from bending displacement directions of the bending displacement member, the driving-direction changing member vibrates not only in the driving directions but also along the preload direction. Therefore, the vibrational component along the preload direction exerts a remarkable influence on the driving of the driven body. This is likely to destabilize frictional force acting between the driving-direction changing member and the driven body, thus destabilizing the driving velocity and thrust of the driven body.

According to the foregoing configuration, the fundamental frequency of the alternating signal is different from the resonant frequency of the resonance along the preload direction, the vibrational component of the driving-direction changing member along the preload direction vibrates at a fundamental frequency different from the resonant frequency of the preload elastic member, the resonance along the preload direction is not excited. This prevents the driven body from vibrating along the preload direction, thus making it possible to stabilize the state of contact between the driving-direction changing member and the driven body.

It should be noted that the possible cause of the resonance along the preload direction depends on the design of the driving device and the properties of the members. An example is resonance attributed to the elasticity of the preload elastic member and the mass of the driven body.

The driving device of the present invention is preferably configured such that the fundamental frequency of the alternating signal is higher than the resonant frequency of the resonance along the preload direction.

According to the foregoing configuration, the fundamental frequency of the alternating signal is higher than the resonant frequency of the resonance along the preload direction. This makes it easy to control the preload force of the preload elastic member.

The driving device of the present invention is preferably configured such that the resonant frequency of the resonance along the preload direction is lower than a resonant frequency of resonance in the driving directions due to mass of the driven body, elasticity of the bending displacement member, and elasticity of the driving-direction changing member.

The setting of the fundamental frequency of the alternating signal near the resonant frequency of the resonance in the driving directions allows greater vibration amplitude in the driving directions than in the case of driving at a frequency other than the resonant frequency. This is effective in low-voltage driving or high-speed driving of the driving device. According to the foregoing configuration, the resonant frequency of the resonance along the preload direction is lower than a resonant frequency of resonance in the driving directions due to mass of the driven body, elasticity of the bending displacement member, and elasticity of the driving-direction changing member. Therefore, the setting of the fundamental frequency of the alternating signal near the resonant frequency of the resonance in the driving directions causes the fundamental frequency of the alternating signal to be higher than the resonant frequency of the resonance along the preload direction.

Therefore, the foregoing configuration is effective in low-voltage driving or high-speed driving of the driving device, and makes it easy to control the preload force of the preload elastic member.

The driving device of the present invention is preferably configured such that the preload elastic member biases the driven body in a direction that does not pass through a center of the driven body as seen from above the driving directions.

The foregoing configuration makes it possible to ensure a great natural length of a spring and thereby achieve a reduction in spring constant. This makes it possible that the resonance frequency of the resonance along the preload direction due to the elasticity of the preload elastic member and the mass of the driven body is surely made lower than the fundamental frequency of the alternating signal (i.e., that the fundamental frequency is surely made higher than the resonant frequency of the resonance along the preload direction).

The driving device of the present invention is preferably configured to further include a housing having a side wall surrounding a side surface of the driven body, wherein the preload elastic member is disposed along the side wall. The term "side surface of the driven body" here means a side surface of the driven body with its top and bottom surfaces facing in the driving directions.

According to the foregoing configuration, the preload elastic member is disposed along the side wall. This makes it possible to ensure a great natural length of a spring and minimize space for installation of the preload elastic member. This makes it possible to make efficient use of the space in the housing for installing the preload elastic member.

The driving device of the present invention is preferably configured such that: the bending displacement member is disposed along the side wall; and the preload elastic member is disposed perpendicularly to the bending displacement member as seen from above the driving directions.

This makes it possible to make further efficient use of the space in the housing for installing the preload elastic member.

The driving device of the present invention is preferably configured such that the preload elastic member is a helical spring having an end fixed to the driven body.

According to the foregoing configuration, when the driven body is driven in the directions along the optical axis to be displaced (moved), the end of the preload elastic member is also displaced. The preload elastic member follows the driven body by bending in a direction along the optical axis while the driven body is being driven. Therefore, the preload elastic member is low in elastic spring constant along the optical axis. Accordingly, when following the driven body by bending in a direction along the optical axis, the preload elastic member can achieve a sufficient reduction in load on the driven body.

The driving device of the present invention is preferably configured such that the preload elastic member is provided with a slide member for sliding the driven body with respect to the preload elastic member.

According to the foregoing configuration, the slide member slides the driven body with respect to the preload elastic member. Therefore, the members for preload (preload elastic member, slide member) are not added to the mass in the driving directions. For this reason, the vibration in the driving directions due to the mass of the driven body, the elasticity of the bending displacement member, and the elasticity of the driving-direction changing member becomes free of the influence of the "mass of the members for preload". Therefore, the foregoing configuration makes it possible to achieve a dramatic increase in resonant frequency of the resonance in the driving directions. This brings about an effect of increasing the difference between the resonant frequency of the resonance in the driving directions and the resonant frequency of the resonance along the preload direction.

The driving device of the present invention is preferably configured such that a resonant frequency of resonance along the preload direction due to elasticity of the preload elastic member, mass of the driven body, and mass of the slide member is lower than the resonant frequency of the resonance in the driving directions due to the mass of the driven body, the elasticity of the bending displacement member, and the elasticity of the driving-direction changing member.

The resonant frequency of the resonance along the preload direction becomes lower with an increase in mass of the members causing the resonance. According to the foregoing configuration, the slide member slides the driven body with respect to the preload elastic member; therefore, the members for preload (preload elastic member, slide member) are not added to the mass in the driving directions, but is added to the mass in the preload direction. Therefore, the foregoing configuration makes it possible to further lower the resonant frequency of the resonance along the preload direction.

The driving device of the present invention may be configured such that: the bending displacement member is one and only bending displacement member; and the driving-direction changing member has a joint with the bending displacement member and a free end opposite the joint.

According to the foregoing configuration, the end of the driving-direction changing member opposite the joint with the bending displacement member is not joined to another member, and therefore is a free end. Therefore, when the bending displacement member is bent and displaced, the other end of the driving-direction changing member is not limited in displacement width by being supported by or joined to another member. As a result, the vibration component of the contact part with the driven body is not reduced. This brings about an effect of improving the driving efficiency of the driven body. Furthermore, it becomes unnecessary to execute a bonding step of fixing another bending displacement member to the end opposite the joint of the driving-direction changing member with the bending displacement member. This makes it possible to reduce the number of steps to be executed to assemble the driving device.

Further, the driving device of the present invention is preferably configured such that the driving-direction changing member has a mass-increasing member provided at the end opposite to the joint with the bending displacement member.

According to the foregoing configuration, the driving-direction changing member has a mass-increasing member provided at the end opposite to the joint with the bending displacement member. Therefore, the mass of the free end of the driving-direction changing member becomes greater than the mass of the joint with the bending displacement member. This results in an increase in vibration amplitude of the free end of the driving-direction changing member and a further increase in displacement amplitude of the contact part with the driven body, thus improving the driving efficiency.

The mass-increasing member also has a function of lowering the resonant frequency of the driving-direction changing member. This function is useful in such a configuration that the resonant frequency of the bending displacement member is lower than the resonant frequency of the elastic member. Specifically, the provision of the mass-increasing member at the free end of the driving-direction changing member makes it possible to lower the resonant frequency of the driving-direction changing member to approximate to the resonant frequency of the bending displacement member. Moreover, use of the resonance of the resonant frequency of the bending displacement member makes it possible to improve the driving efficiency of the driven body.

Further, the driving device of the present invention is preferably configured such that the driving-direction changing member has a mass-increasing member provided at the joint with the bending displacement member.

According to the foregoing configuration, the driving-direction changing member has a mass-increasing member provided at the joint with the bending displacement member. This causes the mass of the joint of the bending displacement member with the driving-direction changing member to be greater than the mass of the opposite end. This causes an increase in vibration amplitude of the bending displacement member, i.e., causes an increase in amplitude at which the driving-direction changing member is vibrated. This results in an increase in vibration amplitude of the driving-direction changing member and a further increase in displacement amplitude of the contact part with the driven body, thus improving the driving efficiency.

Further, the mass-increasing member also has a function of lowering the resonant frequency of the bending displacement member. This function is useful, for example, in such a configuration that the resonant frequency of the bending displacement member is higher than the resonant frequency of the elastic member. Specifically, the provision of the mass-increasing member at the joint of the driving-direction changing member with the bending displacement member makes it possible to lower the resonant frequency of the bending displacement member to approximate to the resonant frequency of the driving-direction changing member. Moreover, use of the resonance of the bending displacement member makes it possible to improve the driving efficiency of the driven body.

Further, the driving device of the present invention is preferably configured such that the bending displacement member is provided with a mass-increasing member.

The foregoing configuration also brings about such effects of improving the driving efficiency of the driven body and reducing the resonant frequency of the bending displacement member.

Further, the driving device of the present invention is preferably configured such that the mass-increasing member is formed integrally with the driving-direction changing member.

Further, the driving device of the present invention is preferably configured such that the mass-increasing member is formed as a prolongation added to the driving-direction changing member opposite the joint with the bending displacement member.

The foregoing configuration also makes it possible to approximate the resonant frequency of the bending displacement member to the resonant frequency of the driving-direction changing member.

Further, the driving device of the present invention is preferably configured such that assuming that the bending displacement member and the driving-direction changing member constitute a spring system, the bending displacement member and the driving-direction changing member coincide in resonant frequency with each other.

According to the foregoing configuration, the bending displacement member and the driving-direction changing member coincide in resonant frequency with each other. Therefore, the control of a control voltage for vibrational displacement of the bending displacement member at the resonant frequency cause resonance that results in an increase in vibration amplitude of the driving-direction changing member and a further increase in displacement amplitude of the contact part with the driven body, thus improving the driving efficiency.

In particular, the foregoing configuration can be suitably used in cases where it is necessary to drive the driven body at a lower level of control voltage that is applied to the bending displacement member and it is impossible to ensure sufficient vibration amplitude of the driving-direction changing member.

It should be noted that even in cases where the bending displacement member and the driving-direction changing member differ in resonant frequency from each other, the bending displacement member and the driving-direction changing member can be brought into coincidence in resonance frequency with each other by providing either the bending displacement member or the driving-direction changing member with the mass-increasing member.

The term "coincide" here means that the resonant frequency of the bending displacement member coincides with the resonant frequency of the driving-direction changing member within allowable limits on error in mounting the bending displacement member in the driving device or dimensional accuracy of the bending displacement member in manufacturing.

Further, the driving device of the present invention may be configured such that assuming that the bending displacement member and the driving-direction changing member constitute a spring system, the bending displacement member and the driving-direction changing member are far in resonant frequency from each other.

According to the foregoing configuration, the bending displacement member and the driving-direction changing member are far in resonant frequency from each other. Therefore, even where there occur variations in resonant frequency of the bending displacement member, such variations do not exert a great influence on the resonance of the changing member in the driving directions. This makes it possible to suppress variations in driving performance.

The foregoing configuration is suitable in cases where the driving-direction changing member is constituted by a plate-like member. This makes it easy to control the dimensions of driving-direction changing members, thus suppressing variations in resonant frequency among individual driving-direction changing members (causing only small variations in resonant frequency among individual driving-direction changing members). Moreover, the foregoing configuration can be suitably used in ensuring sufficient amplitude of the bending displacement member and suppressing variations in driving performance.

The difference in resonant frequency between the bending displacement member and the driving-direction changing member can be controlled by providing either the bending displacement member or the driving-direction changing member with the mass-increasing member.

Further, the driving device of the present invention is preferably configured to further include a housing capable of housing the bending displacement member and the driving-direction changing member, wherein the bending displacement member is formed as a part of a side wall of the housing.

This makes it possible to make more efficient use of space in the housing.

The driving device of the present invention is preferably configured such that the bending displacement member is disposed so that its bending displacement directions are perpendicular to the driving directions of the driven body.

According to the foregoing configuration, the driven body is driven in directions perpendicular to the bending displacement directions of the bending displacement member (i.e., in directions along the optical axis for taking an image of an object). Therefore, for example, in cases where the driving device of the present invention is applied as a device for driving an optical component in a compact camera module, it becomes possible to adjust the driving of the optical component in a focus direction (focus adjustment mechanism).

The driving device of the present invention may be configured such that the bending displacement member includes a piezoelectric material layer and a shim. That is, in the driving device of the present invention, it is possible to use, as the bending displacement member, a piezoelectric element including a shim.

The driving device of the present invention is preferably configured such that the bending displacement member includes a stack of two piezoelectric material layers.

According to the foregoing configuration, the bending displacement member includes a stack of two piezoelectric material layers, with a shim excluded therefrom. Therefore, the foregoing configuration makes it possible to increase the amount of displacement of the bending displacement member in comparison with the configuration in which a piezoelectric element including a shim is used as the bending displacement member. Moreover, the amounts of displacement per pulse of the end of the driving-direction changing member and the driven body can be increased with the increase in amount of bending displacement of the bending displacement member.

Furthermore, according to the foregoing configuration, the proportion of the piezoelectric material layers in the bending displacement member becomes higher than in the configuration in which a piezoelectric element including a shim is used as the bending displacement member. Therefore, the foregoing configuration causes an increase in thickness of the piezoelectric material layers as the bending displacement member, thus making it possible to prevent depolarization of the piezoelectric material layers.

The driving device of the present invention is preferably configured such that: the driven body is a body tube having an objective lens attached thereto; and the bending displacement member has a dimension not more than 2.5 times a focal length of the objective lens along the driving directions of the driven body.

The driving device of the present invention is preferably configured such that: the driven body is a body tube having an objective lens attached thereto; and the bending displacement member has a dimension not more than three times a diameter of the objective lens along a direction perpendicular to the driving directions of the driven body.

This makes it possible to achieve a driving device suitable to a compact camera module for use in a mobile phone.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

The present driving device can be reduced in size and height, and as such, can be used for driving a lens in an optical device, e.g., for driving an imaging lens on a camera.

The invention claimed is:
1. A driving device including a driving mechanism for driving a driven body, the driving mechanism comprising:
  a bending displacement member, partially fixed, which is excited by electrical control to be bent and displaced in a bending displacement direction; and
  a driving-direction changing member, joined to the bending displacement member, which makes contact with the driven body to cause the driven body to be driven in a driving displacement directions different from the bending displacement directions of the bending displacement member,
wherein:
  the driving-direction changing member has an elastic member and a friction member; and
  the friction element is capable of at least some frictional engagement with the driven body to cause the driven body to be driven in the driving displacement direction different from the bending displacement direction of the bending displacement member.
2. The driving device as set forth in claim 1, wherein:
  the bending displacement member includes a first bending displacement member that is bent in first bending displacement directions and a second bending displacement member that is bent in second bending displacement directions;
  the driving-direction changing member causes the driven body to be driven in directions different from the first and second bending displacement directions;

the first bending displacement member and the driving-direction changing member are joined together at a first joint;

the second bending displacement member and the driving-direction changing member are joined together at a second joint;

a first straight line perpendicular to the driving directions of the driven body may be drawn in that plane of the driving-direction changing member which includes the first and second joints; and the first and second joints are disposed so that the first straight line intersects with an imaginary line connecting the first and second joints.

3. The driving device as set forth in claim 1, further comprising:

a preload elastic member for biasing the driven body toward the driving-direction changing member; and control means for controlling bending displacement of the bending displacement member.

4. The driving device as set forth in claim 3, wherein:

the control means applies an alternating electrical signal to the bending displacement member; and the alternating signal has a fundamental frequency higher than a resonant frequency at which the preload elastic member resonates in a preload direction.

5. The driving device as set forth in claim 4, wherein the resonant frequency of the resonance along the preload direction is lower than a resonant frequency of resonance in the driving directions due to mass of the driven body, elasticity of the bending displacement member, and elasticity of the driving-direction changing member.

6. The driving device as set forth in claim 3, wherein the preload elastic member biases the driven body in a direction that does not pass through a center of the driven body as seen from above the driving directions.

7. The driving device as set forth in claim 6, further comprising a housing having a side wall surrounding a side surface of the driven body, wherein the preload elastic member is disposed along the side wall.

8. The driving device as set forth in claim 7, wherein:

the bending displacement member is disposed along the side wall; and the preload elastic member is disposed perpendicularly to the bending displacement member as seen from above the driving directions.

9. The driving device as set forth in claim 3, wherein the preload elastic member is a helical spring having an end fixed to the driven body.

10. The driving device as set forth in claim 1, wherein:

the bending displacement member is one and only bending displacement member; and the driving-direction changing member has a joint with the bending displacement member and a free end opposite the joint.

11. The driving device as set forth in claim 10, wherein the driving-direction changing member has a mass-increasing member provided at the end opposite to the joint with the bending displacement member.

12. The driving device as set forth in claim 11, wherein the mass-increasing member is formed integrally with the driving-direction changing member.

13. The driving device as set forth in claim 12, wherein the mass-increasing member is formed as a prolongation added to the driving-direction changing member opposite the joint with the bending displacement member.

14. The driving device as set forth in claim 10, wherein the driving-direction changing member has a mass-increasing member provided at the joint with the bending displacement member.

15. The driving device as set forth in claim 10, wherein the bending displacement member is provided with a mass-increasing member.

16. The driving device as set forth in claim 10, wherein the bending displacement member and the driving-direction changing member constitute a spring system, and the bending displacement member and the driving-direction changing member are far in resonant frequency from each other.

17. The driving device as set forth in claim 1, wherein the bending displacement member is disposed so that its bending displacement directions are perpendicular to the driving directions of the driven body.

18. The driving device as set forth in claim 1, wherein the bending displacement member includes a stack of two piezoelectric material layers.

19. An imaging device comprising:

a driving device including a driving mechanism for driving a driven body, the driving mechanism including:

a bending displacement member, partially fixed, which is excited by electrical control to be bent and displaced; and a driving-direction changing member, joined to the bending displacement member, which makes contact with the driven body to cause the driven body to be driven in displacement directions different from bending displacement directions of the bending displacement member, the driving device driving, as the driven body, a body tube having an objective lens attached thereto;

and an imaging element for taking an image formed by the objective lens, wherein:

the driving-direction changing member has an elastic member and a friction member; and the friction element is capable of at least some frictional engagement with the driven body to cause the driven body to be driven in the driving displacement direction different from the bending displacement direction of the bending displacement member.

20. An imaging apparatus comprising an imaging device including:

a driving device including a driving mechanism for driving a driven body, the driving mechanism including:

a bending displacement member, partially fixed, which is excited by electrical control to be bent and displaced; and a driving-direction changing member, joined to the bending displacement member, which makes contact with the driven body to cause the driven body to be driven in displacement directions different from bending displacement directions of the bending displacement member, the driving device driving, as the driven body, a body tube having an objective lens attached thereto;

and an imaging element for taking an image formed by the objective lens, wherein:

the driving-direction changing member has an elastic member and a friction member; and the friction element is capable of at least some frictional engagement with the driven body to cause the driven body to be driven in the driving displacement direction different from the bending displacement direction of the bending displacement member.

21. A driving device including a driving mechanism for driving a driven body, the driving mechanism comprising:
- a bending displacement member, partially fixed, which is excited by electrical control to be bent and displaced;
- a driving-direction changing member, joined to the bending displacement member, which makes contact with the driven body to cause the driven body to be driven in displacement directions different from bending displacement directions of the bending displacement member;
- a preload elastic member for biasing the driven body toward the driving-direction changing member; and
- control means for controlling bending displacement of the bending displacement member, wherein:
the control means applies an alternating electrical signal to the bending displacement member;
the alternating signal has a fundamental frequency higher than a resonant frequency at which the preload elastic member resonates in a preload direction; and
the resonant frequency of the resonance along the preload direction is lower than a resonant frequency of resonance in the driving directions due to mass of the driven body, elasticity of the bending displacement member, and elasticity of the driving-direction changing member.

22. A driving device including a driving mechanism for driving a driven body, the driving mechanism comprising:
- a bending displacement member, partially fixed, which is excited by electrical control to be bent and displaced;
- a driving-direction changing member, joined to the bending displacement member, which makes contact with the driven body to cause the driven body to be driven in displacement directions different from bending displacement directions of the bending displacement member;
- a preload elastic member for biasing the driven body toward the driving-direction changing member;
- control means for controlling bending displacement of the bending displacement member; and
- a housing having a side wall surrounding a side surface of the driven body, wherein:
the preload elastic member biases the driven body in a direction that does not pass through a center of the driven body as seen from above the driving directions;
the preload elastic member is disposed along the side wall;
the bending displacement member is disposed along the side wall; and
the preload elastic member is disposed perpendicularly to the bending displacement member as seen from above the driving directions.

23. A driving device including a driving mechanism for driving a driven body, the driving mechanism comprising:
- a bending displacement member, partially fixed, which is excited by electrical control to be bent and displaced;
- a driving-direction changing member, joined to the bending displacement member, which makes contact with the driven body to cause the driven body to be driven in displacement directions different from bending displacement directions of the bending displacement member;

wherein:
the bending displacement member is one and only bending displacement member;
the driving-direction changing member has a joint with the bending displacement member and a free end opposite the joint; and
the driving-direction changing member has a mass-increasing member provided at the end opposite to the joint with the bending displacement member.

24. The driving device as set forth in the claim 23, wherein the mass-increasing member is formed integrally with the driving-direction changing member.

25. The driving device as set forth in claim 24, wherein the mass-increasing member is formed as a prolongation added to the driving-direction changing member opposite the joint with the bending displacement member.

26. A driving device including a driving mechanism for driving a driven body, the driving mechanism comprising:
- a bending displacement member, partially fixed, which is excited by electrical control to be bent and displaced;
- a driving-direction changing member, joined to the bending displacement member, which makes contact with the driven body to cause the driven body to be driven in displacement directions different from bending displacement directions of the bending displacement member;

wherein:
the bending displacement member is one and only bending displacement member;
the driving-direction changing member has a joint with the bending displacement member and a free end opposite the joint; and
the driving-direction changing member has a mass-increasing member provided at the joint with the bending displacement member.

27. A driving device including a driving mechanism for driving a driven body, the driving mechanism comprising:
- a bending displacement member, partially fixed, which is excited by electrical control to be bent and displaced;
- a driving-direction changing member, joined to the bending displacement member, which makes contact with the driven body to cause the driven body to be driven in displacement directions different from bending displacement directions of the bending displacement member;

wherein:
the bending displacement member is one and only bending displacement member;
the driving-direction changing member has a joint with the bending displacement member and a free end opposite the joint; and
the bending displacement member is provided with a mass-increasing member.

* * * * *